US008350331B2

(12) United States Patent
Tsujiuchi et al.

(10) Patent No.: US 8,350,331 B2
(45) Date of Patent: Jan. 8, 2013

(54) SEMICONDUCTOR DEVICE AND MANUFACTURING METHOD FOR THE SAME

(75) Inventors: Mikio Tsujiuchi, Tokyo (JP); Toshiaki Iwamatsu, Tokyo (JP); Shigeto Maegawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 1198 days.

(21) Appl. No.: 11/627,167

(22) Filed: Jan. 25, 2007

(65) Prior Publication Data

US 2007/0176235 A1  Aug. 2, 2007

(30) Foreign Application Priority Data

Jan. 27, 2006  (JP) ................... 2006-018915

(51) Int. Cl.
*H01L 21/70* (2006.01)
(52) U.S. Cl. ...................... 257/369; 257/213
(58) Field of Classification Search .......... 257/347–354, 257/E29.287, 404–413, 458–459, 479–481, 257/E21.561–E21.57, E21.7–E21.704, 213, 257/369; 438/149–166, 295, 311, 967
See application file for complete search history.

(56) References Cited

U.S. PATENT DOCUMENTS

| 7,064,041 | B2 * | 6/2006 | Tanaka .......................... 438/311 |
| 7,491,615 | B2 * | 2/2009 | Wu et al. ....................... 438/300 |
| 2006/0148215 | A1 * | 7/2006 | Zhu et al. ...................... 438/482 |
| 2007/0072380 | A1 * | 3/2007 | Wirbeleit et al. ............. 438/303 |
| 2007/0075377 | A1 * | 4/2007 | Huang et al. .................. 257/374 |

FOREIGN PATENT DOCUMENTS

| JP | 2001-351995 | 12/2001 |
| JP | 2003-243662 | 8/2003 |
| JP | 2004-241755 | 8/2004 |
| JP | 2005-19453 | 1/2005 |

OTHER PUBLICATIONS

Shinya Ito, et al., "Mechanical Stress Effect of Etch-Stop Nitride and its Impact on Deep Submicron Transistor Design", IEDM Tech. Dig., 2000, pp. 247-250.
Japanese Office Action issued Feb. 28, 2012, in Japan Patent Application No. 2006-018915 (with English Translation).

* cited by examiner

*Primary Examiner* — Jae Lee
(74) *Attorney, Agent, or Firm* — Oblon, Spivak, McClelland, Maier & Neustadt, L.L.P.

(57) ABSTRACT

In a semiconductor device, a body thick film transistor and a body thin film transistor having a different body film thickness are formed on the same SOI substrate (silicon support substrate, buried oxide film and silicon layer). The body film is formed to be relatively thick in the body thick film transistor, which has a recess structure where the level of the surface of the source/drain regions is lower than the level of the surface of the body region, and thus, the SOI film in the source/drain regions is formed to be as thin as the SOI film in the body thin film transistor. On the other hand, the entirety of the SOI film is formed to have a relatively thin film thickness in the body thin film transistor. In addition, the source/drain regions are formed to penetrate through the silicon layer.

4 Claims, 56 Drawing Sheets

F I G . 1 7
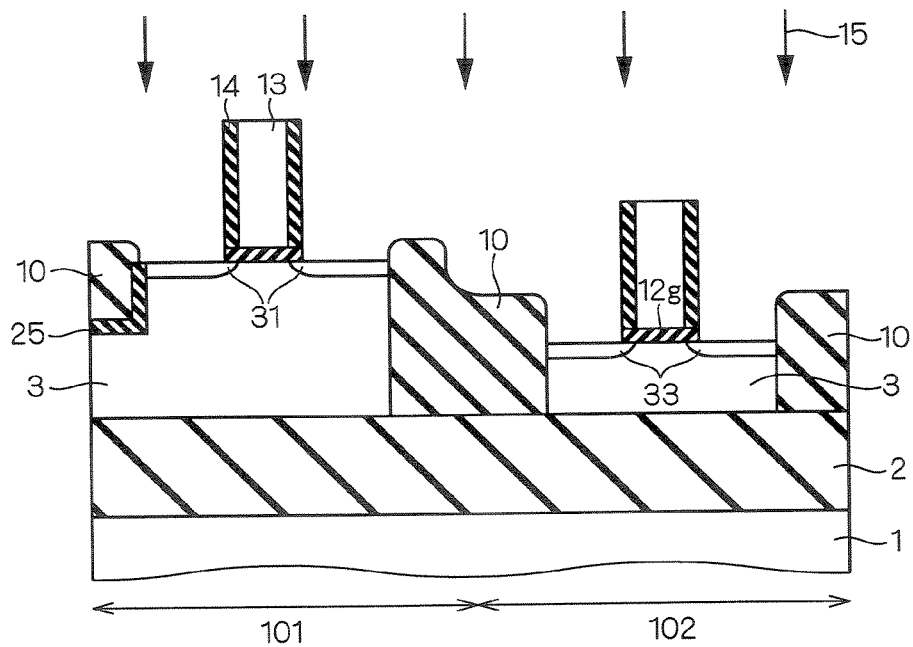
F I G . 1 8
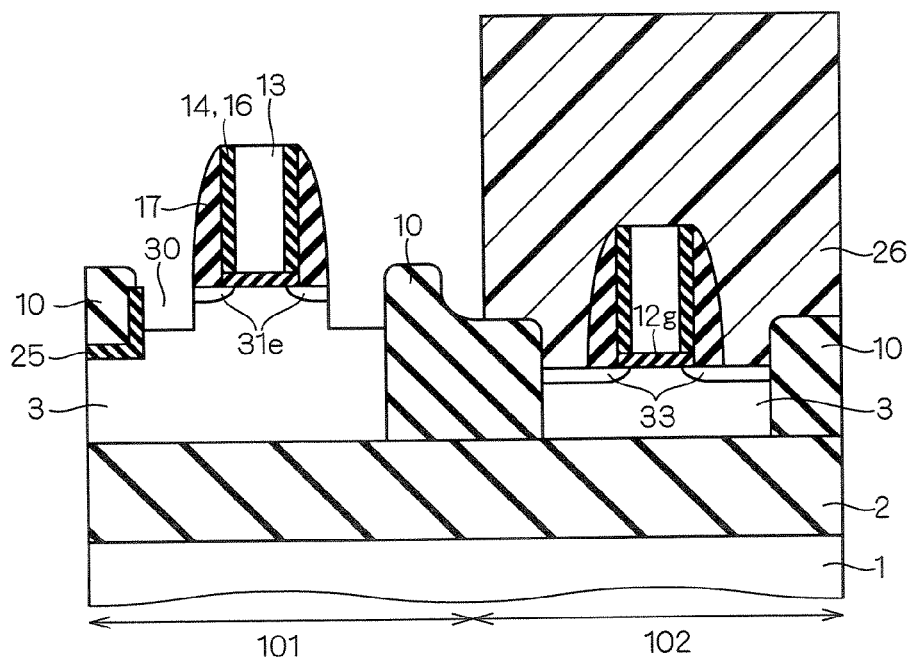

F I G. 4 9
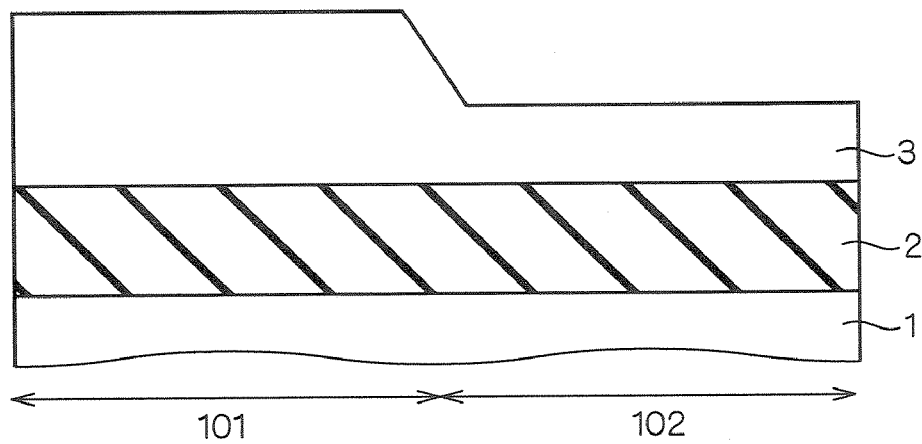
F I G. 5 0
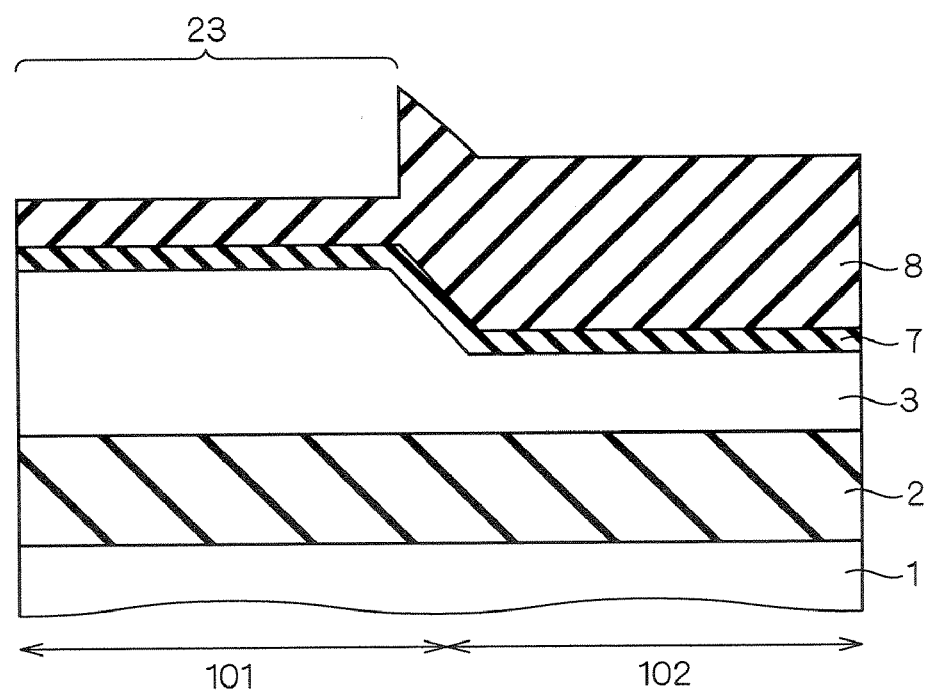

F I G . 5 3
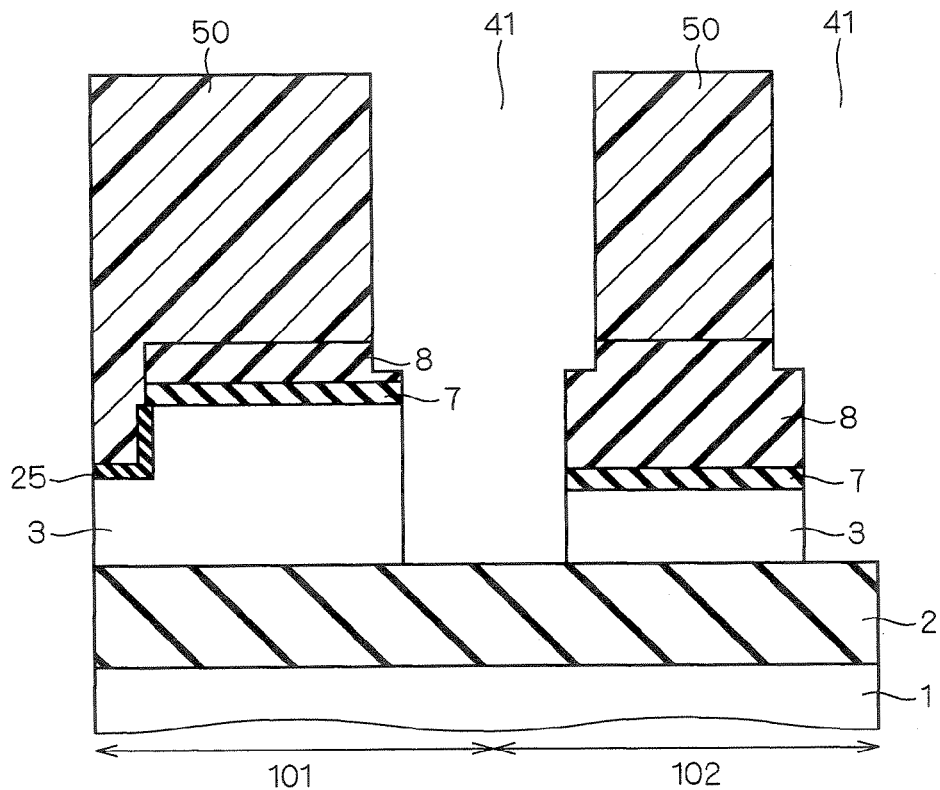
F I G . 5 4
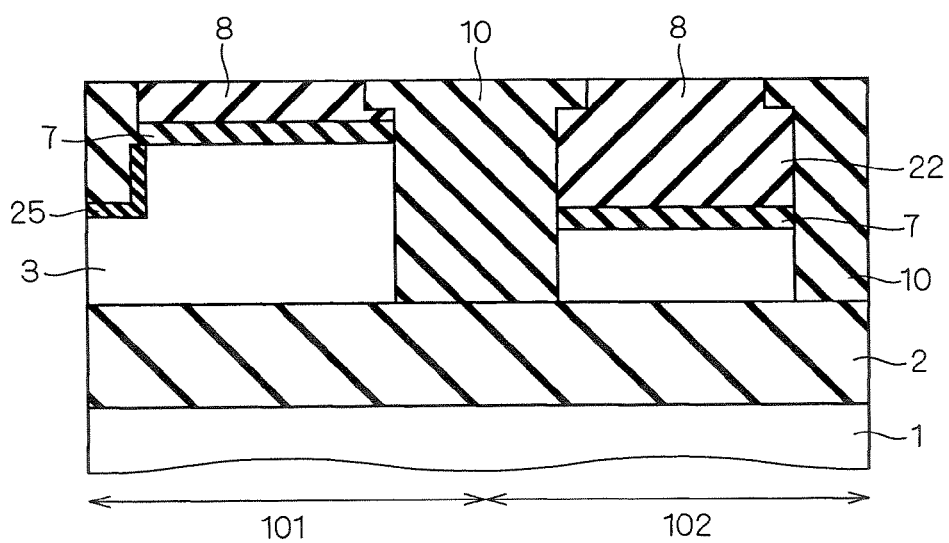

F I G . 6 3
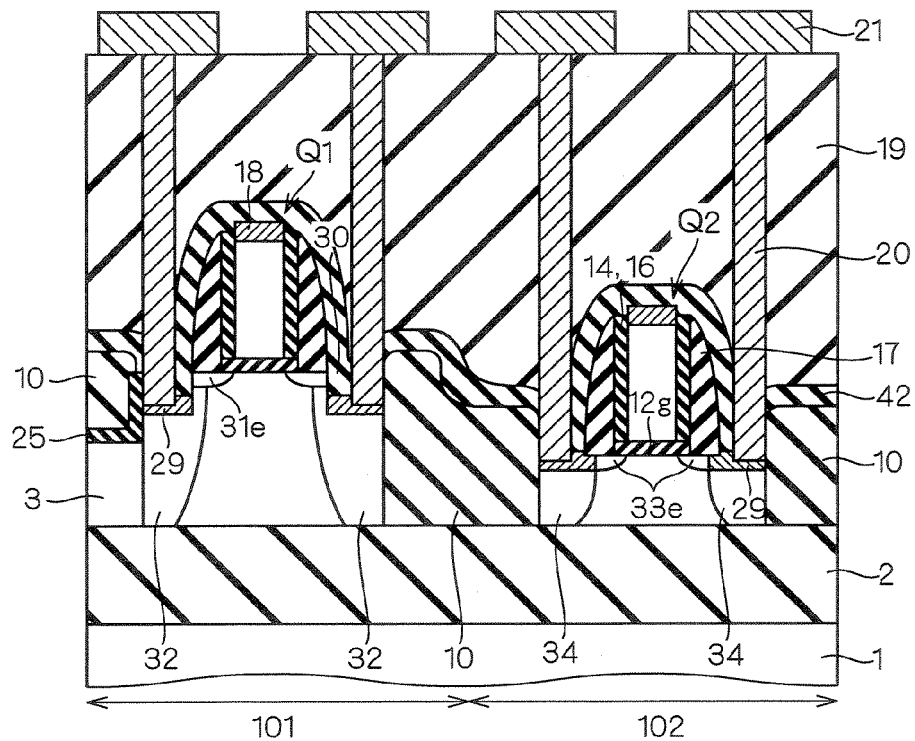
F I G . 6 4
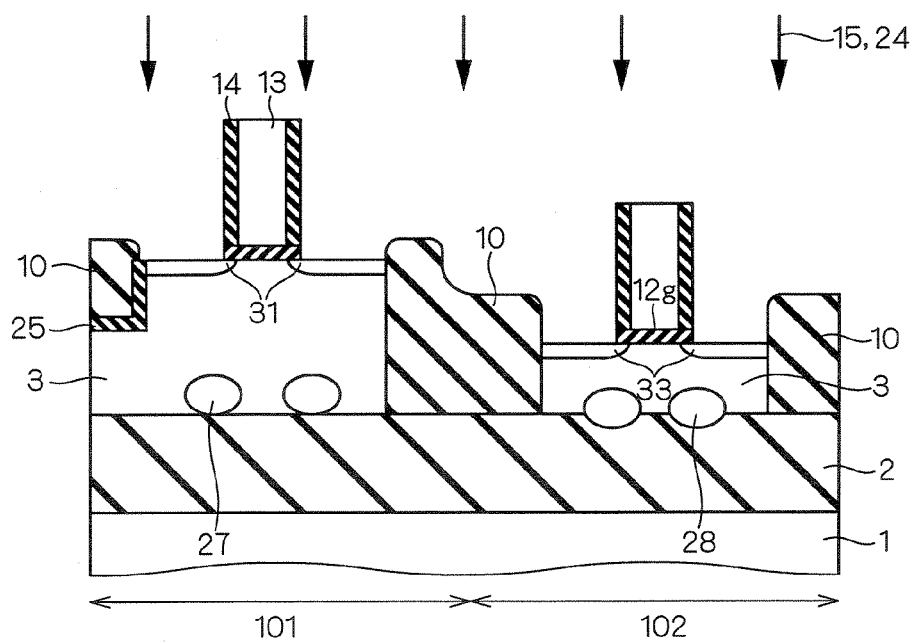

F I G. 7 1
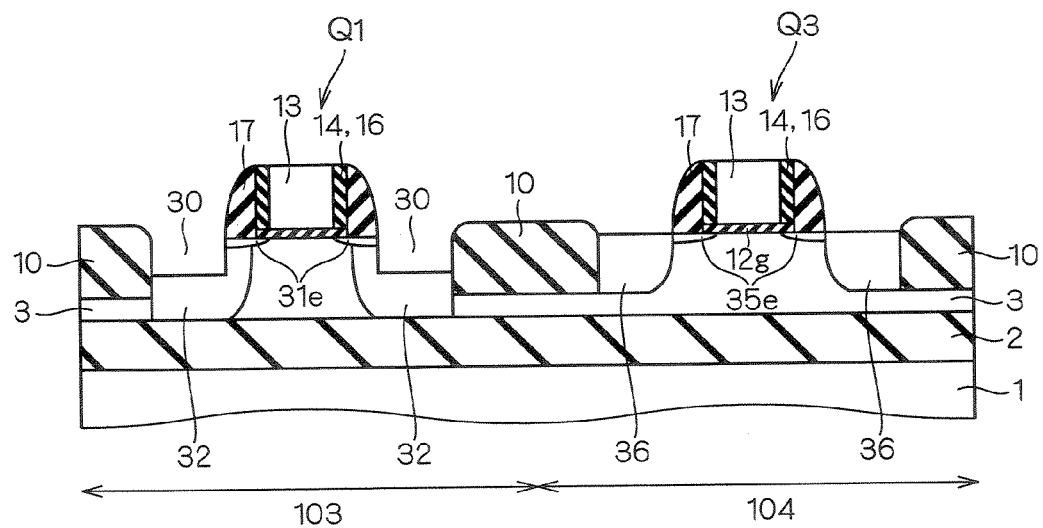
F I G. 7 2
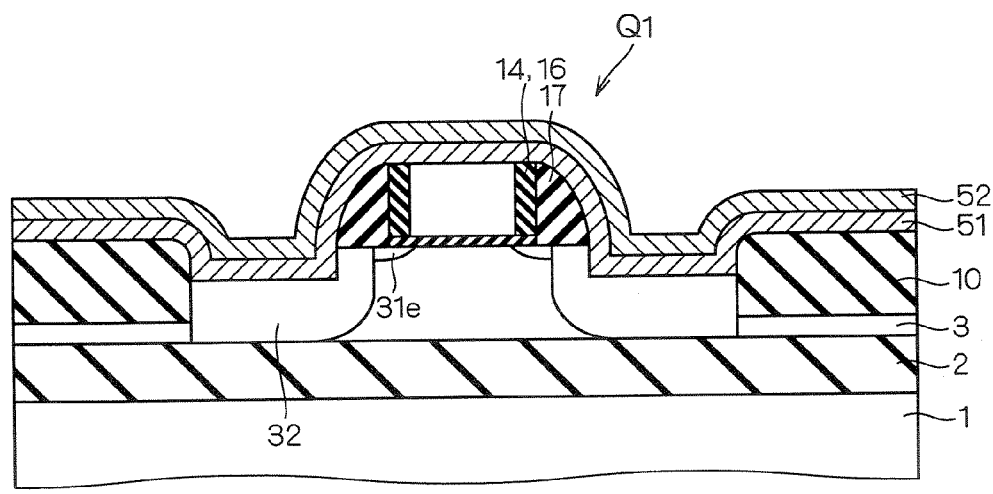

F I G. 7 5
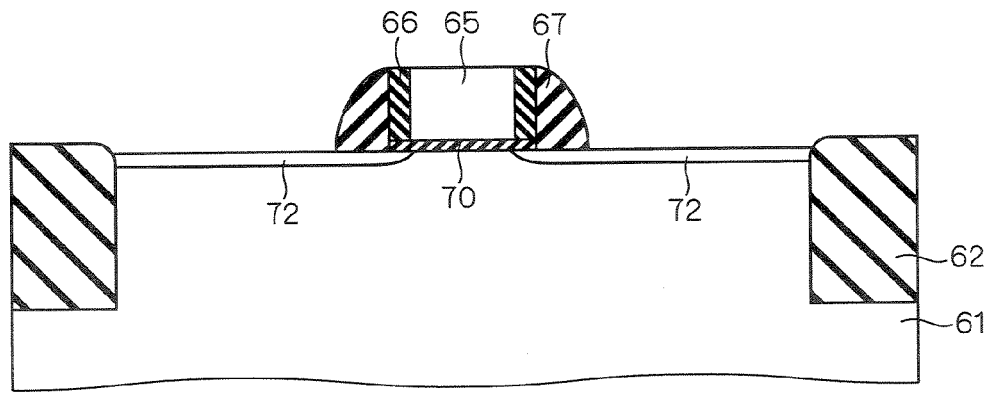
F I G. 7 6
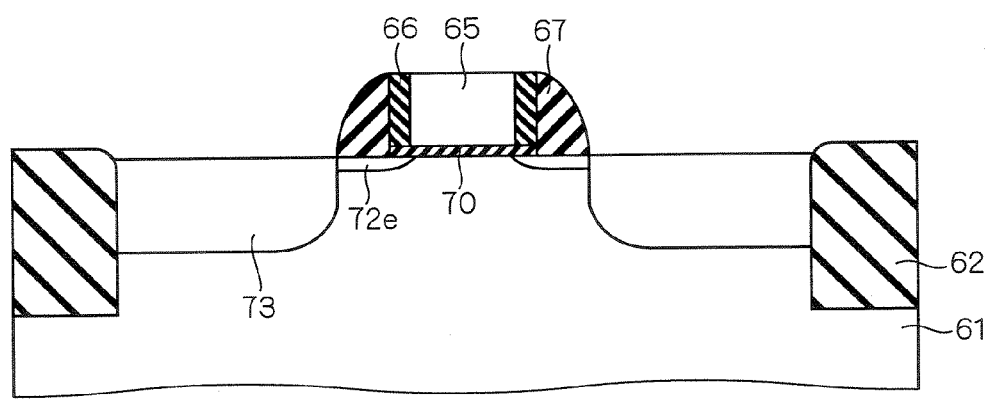

F I G. 1 1 0
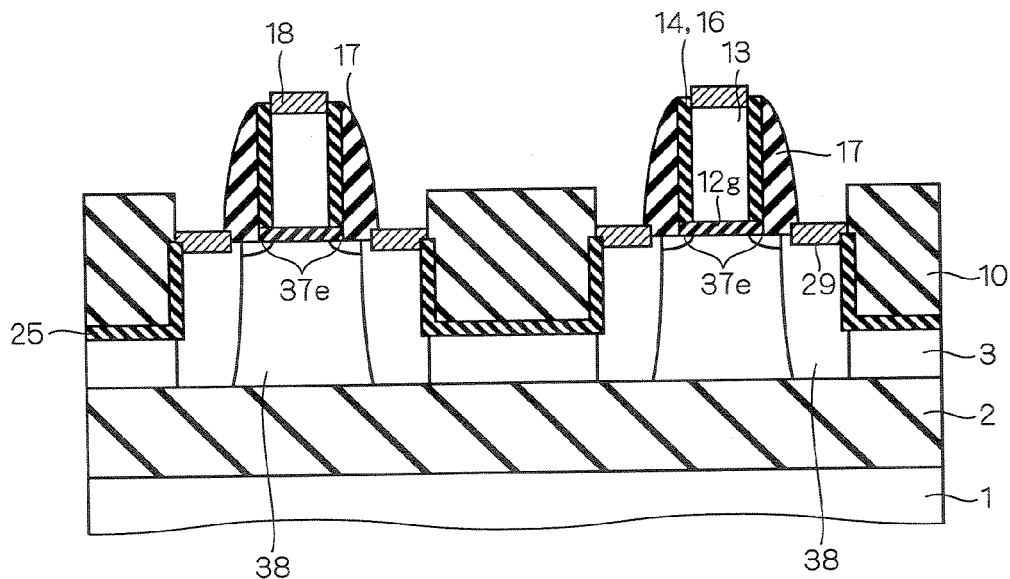
F I G. 1 1 1
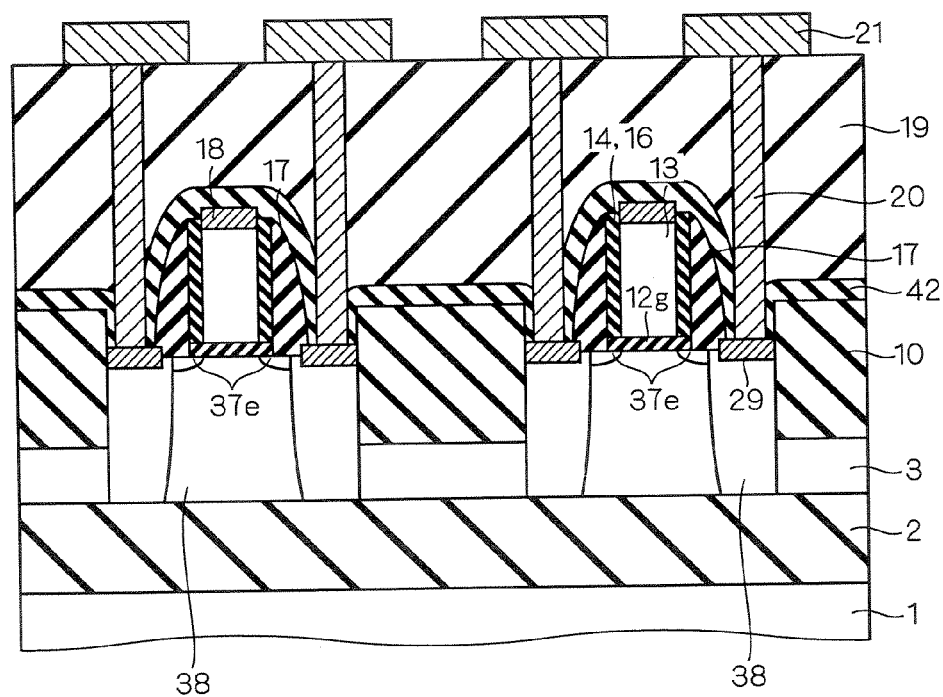

SEMICONDUCTOR DEVICE AND MANUFACTURING METHOD FOR THE SAME

BACKGROUND OF THE INVENTION

1. Field of the Invention

The present invention relates to a semiconductor device having a structure which is adaptable to various types of devices, mainly a semiconductor device having an SOI (silicon on insulator) structure, as well as a manufacturing method for the same.

2. Description of the Background Art

FIGS. 102 to 111 are cross sectional views showing a manufacturing method for a conventional MOS transistor formed on an SOI substrate. Hereinafter, the manufacturing method is described with reference to these drawings.

First, as shown in FIG. 102, a buried oxide film 2 having a film thickness of 10 nm to 1000 nm and a silicon layer 3 having a film thickness of 30 nm to 200 nm are formed in sequence on a silicon support substrate 1, which is a semiconductor substrate, and thereby, an SOI substrate (structure) composed of the silicon support substrate, the buried oxide film and the silicon layer 3 is obtained. Furthermore, a silicon oxide film 7 having a film thickness of 5 nm to 400 nm is formed on the silicon layer 3, and a silicon nitride film 4 having a film thickness of 10 nm to 200 nm is formed on the silicon oxide film 7.

Next, as shown in FIG. 103, a resist film is applied on the entire surface, and a resist pattern 9 (pattern for element isolation) for forming trenches is formed through photolithography.

After that, as shown in FIG. 104, the silicon nitride film 4, the silicon oxide film 7 and the silicon layer 3 are etched using the resist pattern 9 as a mask to form trenches. This etching process is performed in such a manner that the silicon layer 3 partially remains (partial trench isolation (PTI)). Furthermore, the inner walls of the trenches in the silicon layer 3 are oxidized to form inner wall oxide films 25 having a film thickness of 5 nm to 50 nm on the exposed surfaces of the silicon layer 3. Here, the process for forming inner wall oxide films 25 may be omitted.

Then, as shown in FIG. 105, silicon oxide films 10 bury in the trenches an annealing process at 500° C. to 1300° C. is performed. Then, a CMP (chemical mechanical polishing) process is performed using the silicon nitride film 4 as a stopper, and thereby, the silicon oxide films 10 are flattened. Here, the annealing process may be omitted.

Subsequently, as shown in FIG. 106, after the silicon oxide films 10 is etched to set the film thickness of the silicon oxide films 10 to a predetermined thickness, as shown in FIG. 107, the silicon nitride film 4 and a silicon oxide film 6 are removed.

Next, as shown in FIG. 108, silicon oxide films 12 are formed on the exposed surfaces of the silicon layer 3 between the silicon oxide films 10 and 10.

After that, as shown in FIG. 109, a polysilicon film is formed and patterned through photolithography, and thereby, gate electrodes 13 are formed, silicon oxide film spacers 14 are formed on the sides of the gate electrodes 13, and after that, impurity ions 15 are injected into the silicon layer 3 using the gate electrodes 13 and the silicon oxide film spacers 14 as a mask to form diffusion regions 37 which later become extension & pocket regions.

Then, as shown in FIG. 110, silicon oxide film side walls 16 and silicon nitride film side walls 17 are formed in sequence on the sides of the silicon oxide film spacers 14, and impurity ions are injected using the gate electrodes 13, the silicon oxide film spacers 14, the silicon oxide film side walls 16 and the silicon nitride film side walls 17 as a mask to form source/drain regions 38. At this time, the source/drain regions 38 penetrate through the silicon layer 3 to reach the silicon layer 3, so that the diffusion regions 37 mainly beneath the silicon nitride film side walls 17 becomes extension/pocket regions 37e. Furthermore, metal silicide regions 18 and 29 of cobalt (Co) silicide and the like are formed on the gate electrodes 13 and the source/drain regions 38, respectively.

Finally, as shown in FIG. 111, a silicon nitride film 42 is formed on the entire surface, and after the formation of an interlayer insulating film 19 on the silicon nitride film 42, a CMP process is performed to flatten the interlayer insulating film 19. In addition, a resist pattern (not shown) for etching is formed through photolithography, and contact holes are formed using this resist pattern as a mask, the contact holes are filled in with a metal so that metal plugs 20 are formed. Furthermore, the metal plugs 20 are electrically connected to the interlayer insulating film 19 to form metal wires 21. Al (aluminum), copper (Cu) and the like are considered as materials of the metal wires 21.

In this manner, MOS transistors are formed on the SOI substrate. The body regions of these MOS transistors are electrically connected to body contact regions (not shown) to which a predetermined body potential is provided via the silicon layer 3 beneath the silicon oxide films 10.

When the film thickness of the SOI film (film thickness of the silicon layer 3) becomes smaller by scaling, there is a problem that increases in the body resistance and cannot satisfy characteristics required for the devices used in I/O circuits or analog circuits. In addition, in the case where the thickness of the SOI film is great, the larger parasitic capacitance decrease in speed performance, and thus there is a problem that cannot satisfy speed characteristics required for the devices used in logic circuits and the like.

As a semiconductor device for solving these problems, there are transistors formed to have an SOI structure as that disclosed in, for example, Japanese Patent Application Laid-Open No. 2005-19453. According to the structure disclosed in Japanese Patent Application Laid-Open No. 2005-19453, an SOI structure can be cited, where a first semiconductor layer is provided on top of a buried insulating film in a memory cell region, and a second semiconductor layer is provided on a buried insulating film in a peripheral circuit region. The first and second semiconductor layers are made to have a different film thickness, so that transistors in the memory cell region become of a complete depletion type and transistors in the peripheral circuit region become of a partial depletion type.

However, there is a problem that cannot satisfy requirements for various device characteristics used in a variety of circuits even if semiconductor layers with an SOI structure having simply two types of SOI film thicknesses is provided.

SUMMARY OF THE INVENTION

An object of the invention is to obtain a semiconductor device having a structure that can satisfy requirements for various device characteristics.

According to a first aspect of the present invention, a semiconductor device includes insulating gate type first and second transistors formed on an SOI substrate composed of a semiconductor support substrate, a buried insulating film and a semiconductor layer. The semiconductor layer has first and second SOI regions having first and second film thicknesses, where the first film thickness is greater than the second film thickness.

The first and second transistors are formed in first and second SOI regions, each of which is provided with a gate insulating film, a gate electrode and source/drain regions. The gate insulating film is selectively formed on the semiconductor layer, and the gate electrode is formed on the gate insulating film. The source/drain regions are formed in the semiconductor layer to sandwich a body region, which is a region of the semiconductor layer beneath the gate electrode, and to penetrate through the semiconductor layer.

The source/drain regions in the first transistor have a recess structure where the level of the surface is lower than the level of the surface of the body.

In the semiconductor device according to the first aspect of the present invention, the body region of the first transistor is formed with a first film thickness greater than the second film thickness, and therefore, the resistance of the body region can be reduced, and the operation characteristics can be improved together with increase in the stability of the body potential. Furthermore, the source/drain regions in the first transistor have a recess structure are formed with a film thickness smaller than the first film thickness, and therefore, the operation characteristics can be improved together with reduction in the resistance of the parasitic capacitance.

On the other hand, the entire film thickness (SOI film thickness) of the semiconductor layer in the second transistor is formed with the second film thickness smaller than the first film thickness, and therefore, the operation characteristics can be improved together with more reduction in the resistance of the parasitic capacitance, than in the first transistor.

As a result, the first and second transistors can be selectively used in the semiconductor device according to the first aspect of the present invention, and thus, there are effects that can satisfy requirements for various device (transistor) characteristics.

According to a second aspect of the present invention, a semiconductor device includes insulating gate type first and second transistors formed on an SOI substrate composed of a semiconductor support substrate, a buried insulating film and a semiconductor layer.

The first and second transistors are respectively provided with a gate insulating film, a gate electrode and source/drain regions. The gate insulating film is selectively formed on the semiconductor layer. The gate electrode is formed on the gate insulating film. The source/drain regions are formed in the semiconductor layer to sandwich a body region, which is a region of the semiconductor layer beneath the gate electrode.

The source/drain regions in the first transistor have a recess structure where the level of the surface is lower than the level of the surface of the body region, and the source/drain regions are formed to penetrate through the semiconductor layer. On the other hand, the source/drain regions in the second transistor do not have a recess structure as described above, and are formed to leave a portion of the semiconductor layer beneath without penetrating through the semiconductor layer.

In the semiconductor device according to the second aspect of the present invention, the source/drain regions in the first transistor having a recess structure are formed with a film thickness smaller than the SOI film thickness in the body region, and therefore, the operation characteristics can be improved together with reduction in the resistance of the parasitic capacitance.

On the other hand, the source/drain regions in the second transistor do not have a recess structure and are formed to leave a portion of the semiconductor layer beneath without penetrating through the semiconductor layer, and therefore, the withstand voltage for operation can be improved.

As a result, in the semiconductor device according to the second aspect of the present invention, the first and second transistors are selectively used, and thereby, there are effects that can be satisfy requirements for various device characteristics.

According to a third aspect of the present invention, a semiconductor device includes an insulating gate type transistor formed on a semiconductor substrate.

The transistor is provided with a gate insulating film, a gate electrode and source/drain regions. The gate insulating film is selectively formed on the semiconductor layer. The gate electrode is formed on the gate insulating film. The source/drain regions are formed to sandwich a body region, which is a region of the semiconductor layer beneath the gate electrode.

The source/drain regions have a recess structure where the level of the surface is lower than the level of the surface of the body region, in terms of the positional relationship. In addition, a portion for forming a nitride film which covers the transistor having the recess structure and includes at least a nitride film is further provided.

In the semiconductor device according to the third aspect of the present invention, the source/drain regions in the transistor have a recess structure and accordingly, are formed with a film thickness smaller than the SOI film thickness in the body region, and therefore, the operation characteristics can be improved together with reduction in the resistance of the parasitic capacitance.

In addition, a portion for forming a nitride film which includes at least a nitride film is formed to cover the transistor having a recess structure, and thereby, the nitride film formed on the recess structure can be placed at a level which is approximately the same or lower than the level of the channel region which is on the surface of the body region directly beneath the gate electrode of the transistor. As a result, stress can be applied directly on the surface of the channel from the sides, due to the nitride film, and therefore, effects increase in carrier mobility of the transistor can be produced.

According to the present invention, a manufacturing method for a semiconductor device is a method for manufacturing a semiconductor device including insulating gate type first and second transistors, and includes the following Steps (a) to (e).

In the Step (a), an SOI substrate composed of a semiconductor support substrate, a buried insulating film and a semiconductor layer is prepared. In the Step (b), the film thickness in a portion of the semiconductor layer varies, so that a first SOI region having a first film thickness and a second SOI region having a second film thickness smaller than the first film thickness are provided. In the Step (c), a pattern for element isolation of the first and second transistors is formed above the semiconductor layer. In the Step (d), an element isolation region for the first and second transistors is formed on the basis of the pattern for element isolation. In the Step (e), first and second transistors are formed in the first and second SOI regions.

Furthermore, the Step (e) includes the following Steps (e-1) to (e-3). In the Step (e-1), a gate insulating film and a gate electrode are formed selectively and in sequence on the first and second SOI regions, respectively. In the Step (e-2), a recess is formed in the first SOI region outside the body region beneath the gate electrode. In the Step (e-3), source/drain regions are formed in the semiconductor layer to sandwich the body region and to penetrate through the semiconductor layer in the first and second SOI regions. The source/drain regions in the first SOI region formed in the Step (e-3) are formed at least in a portion beneath the recess In addition, the gate insulating film, the gate electrode and the source/drain regions formed in the first and second SOI regions define the first and second transistors, respectively.

In accordance with the manufacturing method for a semiconductor device according to the present invention, the body region in the first transistor is formed with a first film thickness greater than the second film thickness, and therefore, the resistance in the body region can be reduced, and accordingly, the operation characteristics can be improved together with increase in the stability of the body potential. Furthermore, the source/drain regions in the first transistor are formed beneath a recess, and accordingly, are formed with a film thickness smaller than the first film thickness, and therefore, the operation characteristics can be improved together with reduction in the resistance of the parasitic capacitance. On the other hand, the entirety of the SOI film thickness in the second transistor is formed with a second film thickness smaller than the first film thickness, and thus, the operation characteristics can be improved together with further reduction in the resistance of the parasitic capacitance.

As a result, in a semiconductor device manufactured in accordance with the manufacturing method for a semiconductor device according to the present invention, the first and second transistors are selectively used, and thereby, there are effects that can satisfy requirements for various device characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 20 are cross sectional views showing a first aspect of a manufacturing method for a semiconductor device according to a first embodiment of the present invention;

FIGS. 45 to 63 are cross sectional views showing a third aspect of a manufacturing method for a semiconductor device according to the first embodiment;

FIGS. 64 to 67 are cross sectional views showing the first aspect of a manufacturing method for a semiconductor device according to a second embodiment of the present invention;

FIGS. 69 to 71 are cross sectional views showing a part of a manufacturing method for a semiconductor device according to the third embodiment;

FIG. 72 is a cross sectional view showing the structure of the first aspect of a semiconductor device according to a fourth embodiment of the present invention;

FIGS. 75 to 80 are cross sectional views showing a manufacturing method for a semiconductor device according to the third aspect of the fourth embodiment;

FIGS. 102 to 111 are cross sectional views showing a manufacturing method for a conventional MOS transistor formed on an SOI substrate;

DESCRIPTION OF THE PREFERRED EMBODIMENTS

<<First Embodiment>>
<First Aspect>
(Manufacturing Method)

FIGS. 1 to 20 are cross sectional views showing a first aspect of a manufacturing method for a semiconductor device according to the first embodiment of the present invention. In the following, the manufacturing method according to Example 1 of the first embodiment is described with reference to these views.

Figure 1:
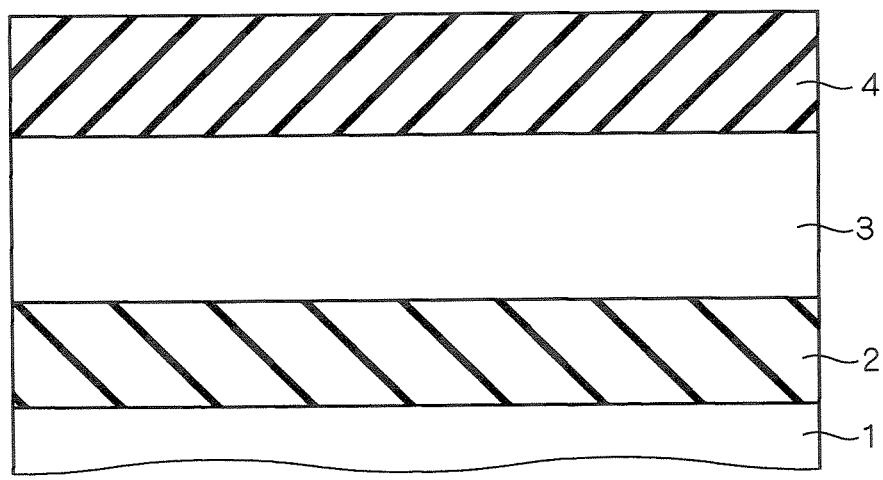

First, as shown in FIG. 1, a buried oxide film 2 having a film thickness of 10 nm to 1000 nm and a silicon layer 3 having a film thickness (first film thickness) of 30 nm to 200 nm are formed in sequence on a silicon support substrate 1, which is a semiconductor substrate, and thereby, an SOI substrate (structure) composed of the silicon support substrate 1, the buried oxide film 2 and the silicon layer 3 is obtained. Furthermore, a silicon nitride film 4 having a film thickness of 10 nm to 200 nm is formed on the silicon layer 3.

Figure 2:
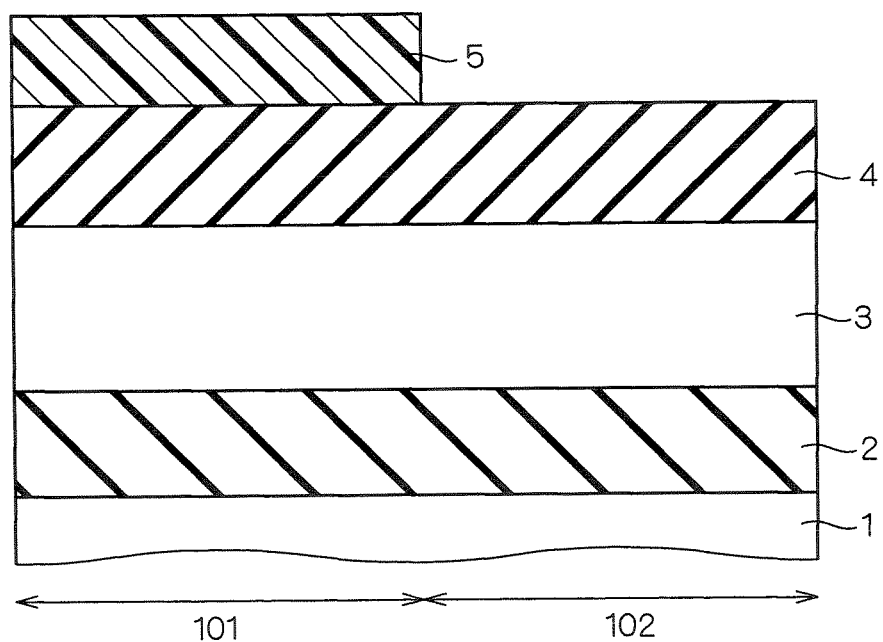

Next, as shown in FIG. 2, a resist film is applied on the entire surface and a resist pattern 5 for forming trenches is formed through photolithography. In the following process, regions covered with this resist pattern 5 are defined as thick film SOI regions 101 (first SOI regions) and regions on which resist pattern 5 is not formed are defined as thin film SOI regions 102 (second SOI regions).

Figure 3:
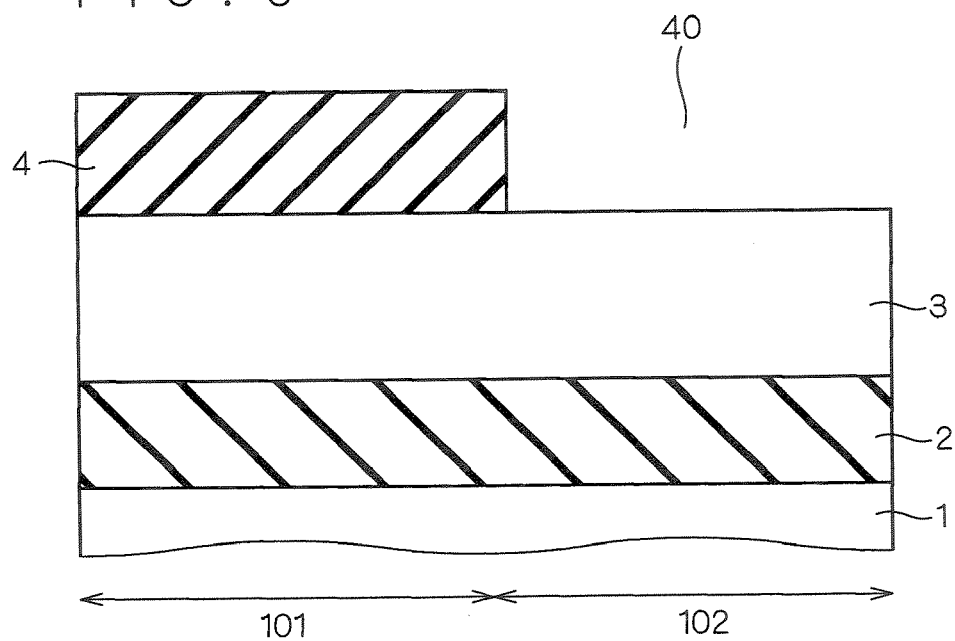

After that, as shown in FIG. 3, the silicon nitride film 4 is patterned using the resist pattern 5 as a mask, and thereby, an opening 40 from which the surface of silicon layer 3 is exposed is obtained, and after that, the resist pattern 5 is removed.

Figure 4:
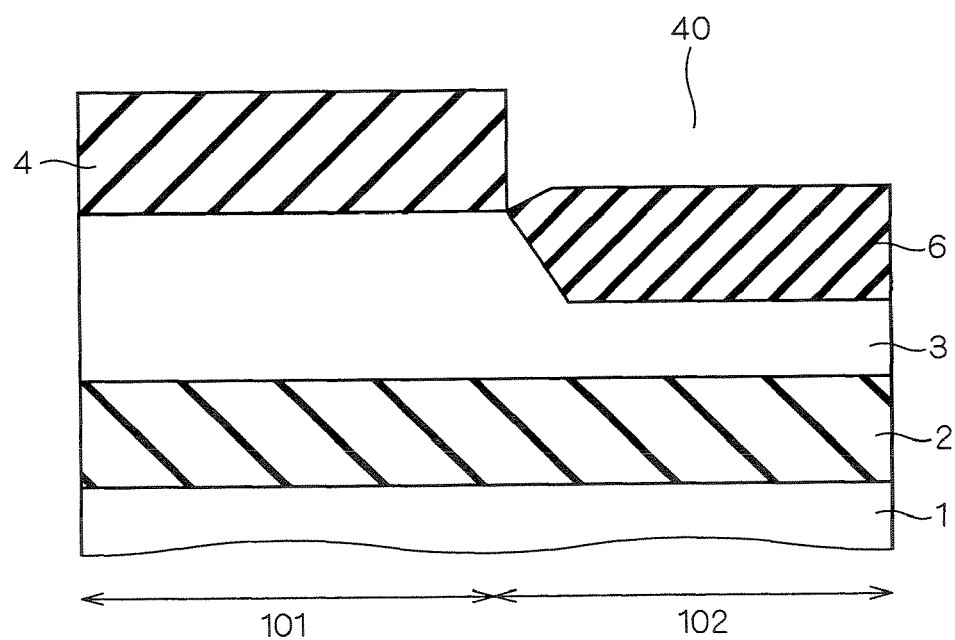

Subsequently, as shown in FIG. 4, an oxidizing process is performed on the silicon layer 3 through the opening 40 and a silicon oxide film 6 is formed to be the film thickness of the silicon layer 3 in the opening 40 as thin as the desired film thickness (second film thickness).

Figure 5:
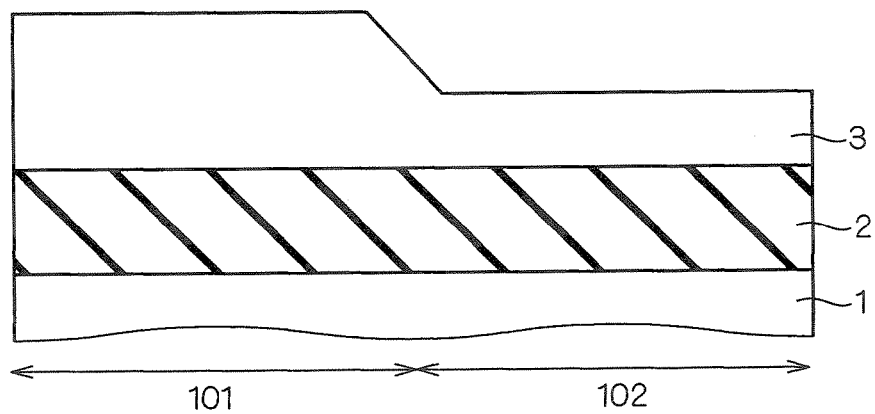
Figure 6:
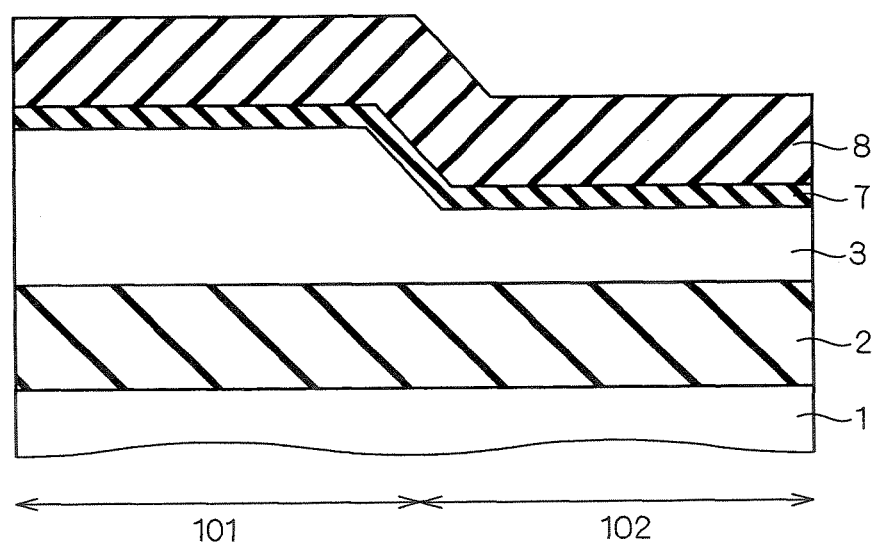

Then, as shown in FIG. 5, after the silicon nitride film 4 and the silicon oxide film 6 are removed, as shown in FIG. 6, a silicon oxide film 7 having a film thickness of 5 nm to 400 nm is formed on the entire surface, and a silicon nitride film 8 having a film thickness of 10 nm to 1000 nm is formed on the silicon oxide film 7.

Figure 7:
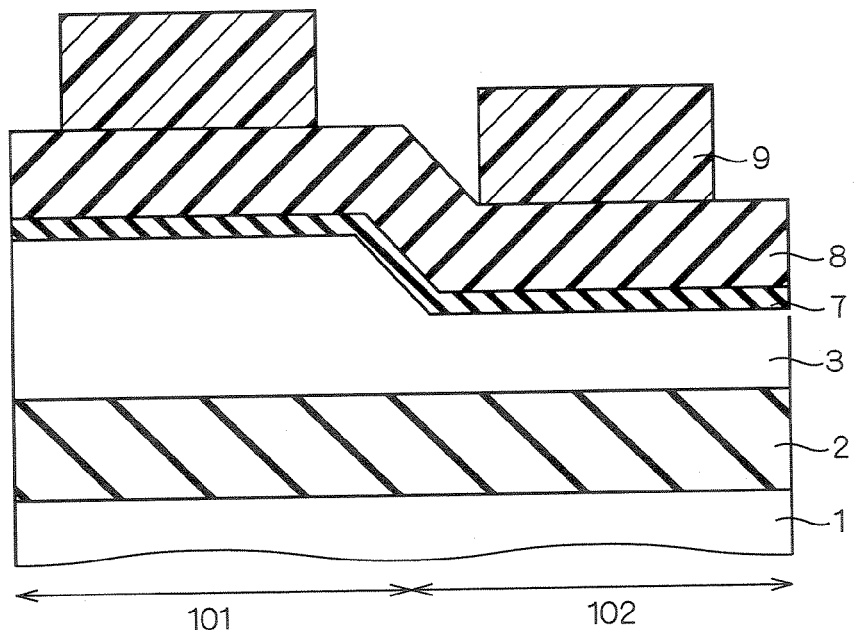

Next, as shown in FIG. 7, a resist film is applied on the entire surface and a resist pattern 9 for forming trenches (pattern for element isolation) is formed through photolithography.

Figure 8:
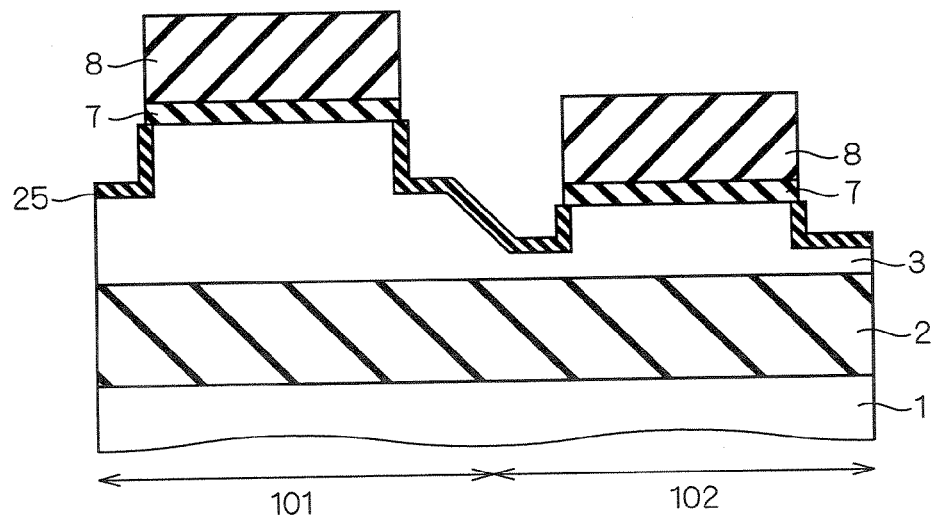

After that, as shown in FIG. 8, after the silicon nitride film 8, the silicon oxide film 7 and the silicon layer 3 is etched using the resist pattern 9 as a mask to form trenches, the resist pattern 9 is removed. This etching process is performed to leave a part of the silicon layer 3 (partial trench isolation). Furthermore, the inner walls of the trenches of the silicon layer 3 are oxidized to form inner wall oxide films 25 having a film thickness of 5 nm to 50 nm on the exposed surfaces of the silicon layer 3. Here, though the inner wall oxide films 25 are formed for the purpose of reducing damage in the interface between the inner wall oxide films and the silicon layer 3, the process for forming the inner wall oxide films 25 may be omitted.

Figure 9:
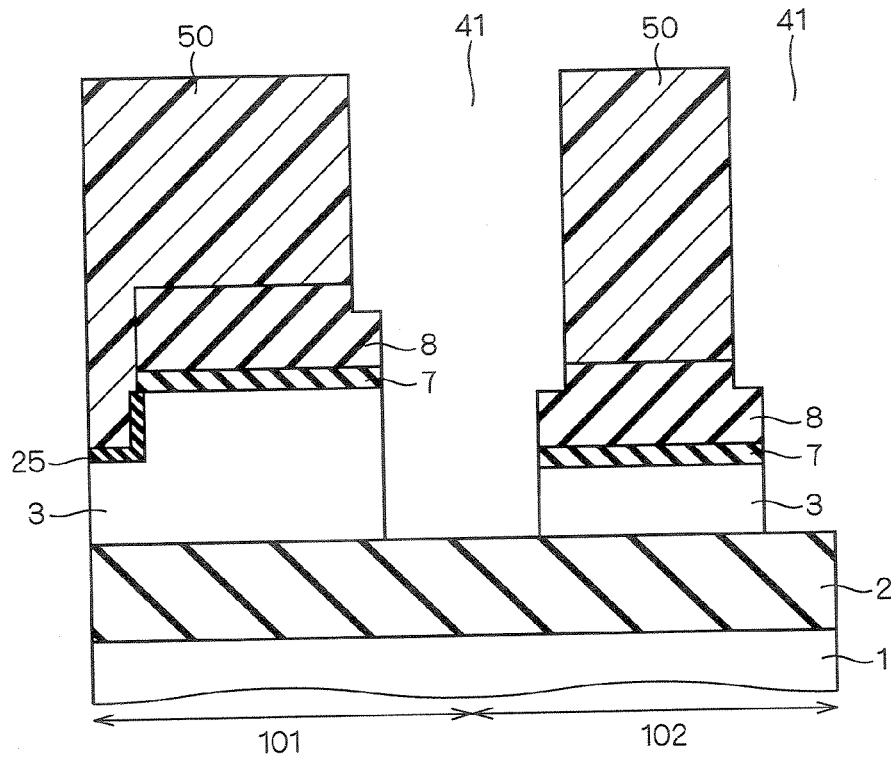

Subsequently, as shown in FIG. 9, a resist film is applied on the entire surface and a resist pattern 50 for forming trenches is formed through photolithography, and the inner wall oxide films 25 and the silicon layer 3 is etched using this resist pattern 50 and the silicon nitride film 8 as a mask to form trenches. At this time, the silicon layer 3 is completely removed (full trench isolation (FTI)) to obtain openings 41 from which the surface of the buried oxide film 2 is exposed.

Figure 10:
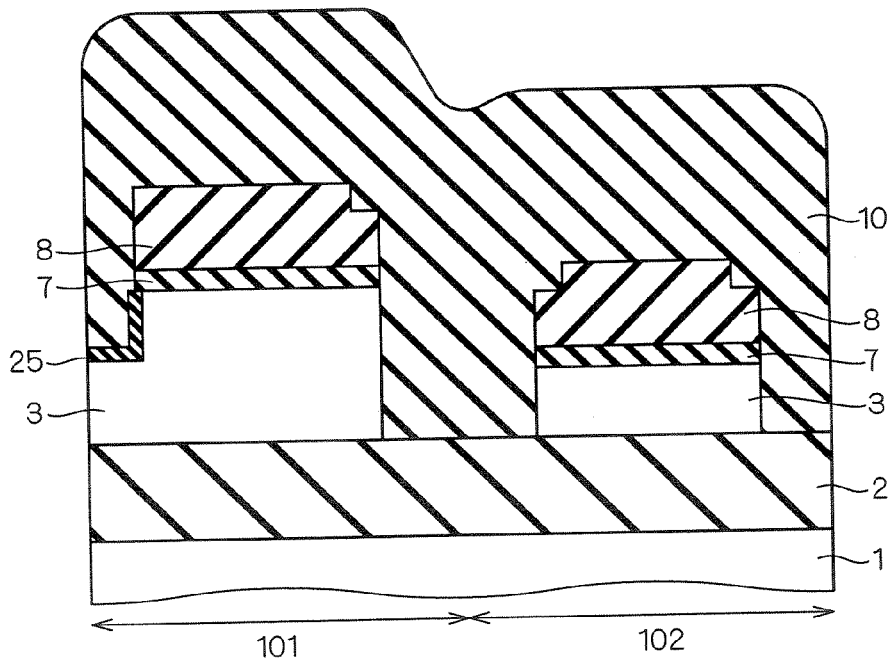

Then, as shown in FIG. 10, after the resist pattern 50 is removed and a silicon oxide film 10 having a film thickness of 15 nm to 1000 nm is formed, an annealing process at 500° C. to 1300° C. is performed. Here, this annealing process may be omitted.

Figure 11:
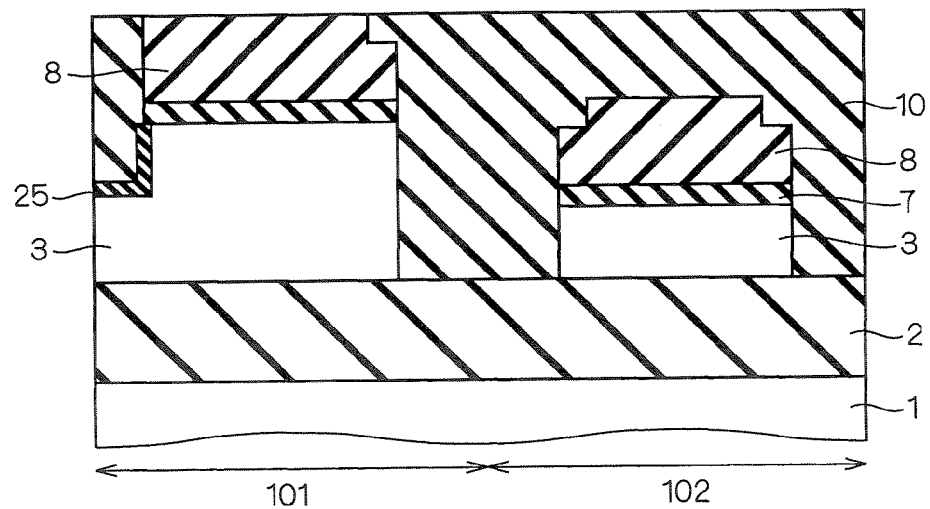

Next, as shown in FIG. 11, a CMP process is performed using the silicon nitride film 8 as a stopper to flatten the silicon oxide film 10. Accordingly, the silicon oxide film 10 is flattened to the same level as the top of the silicon nitride film 8 in the thick film SOI region 101 (first SOI region) or to such a level that the silicon nitride film 8 is slightly polished from the top.

Figure 12:
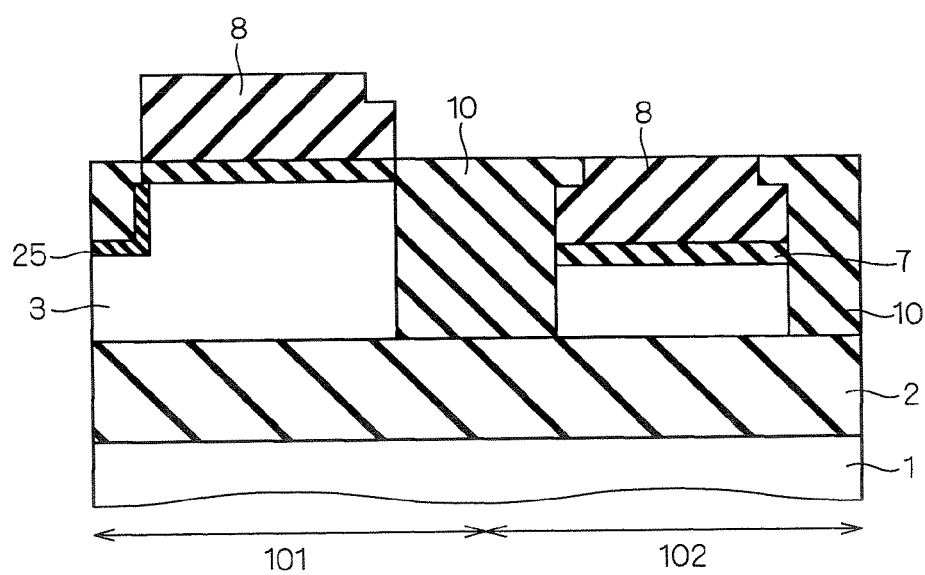

Subsequently, as shown in FIG. 12, the silicon oxide film 10 is etched to set a film thickness of the silicon oxide film 10 in the thick film SOI region 101 to a predetermined film thickness.

Figure 13:
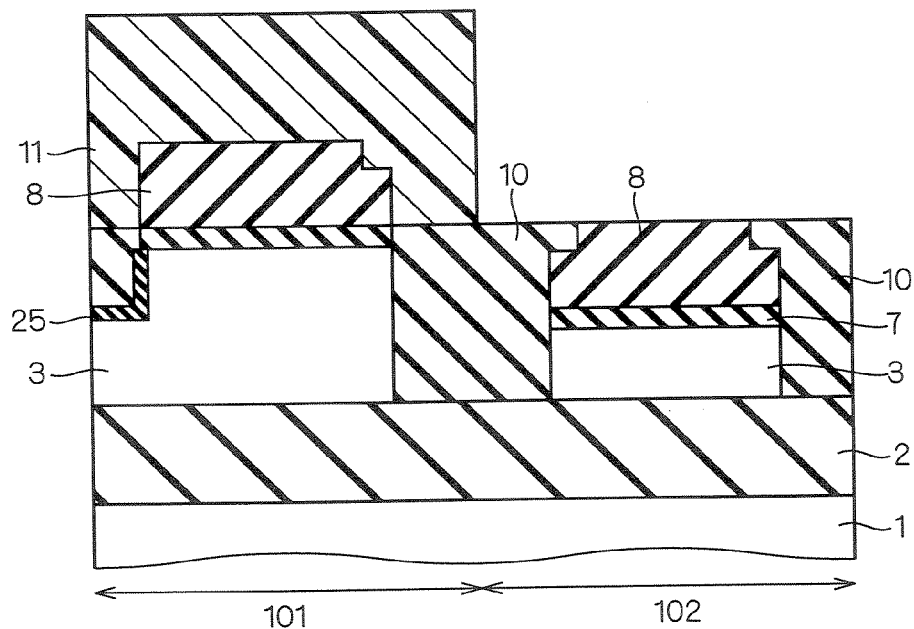

After that, as shown in FIG. 13, a resist film is applied on the entire surface, and a resist pattern 11 for forming trenches which covers the thick film SOI region 101 is obtained through photolithography.

Figure 14:
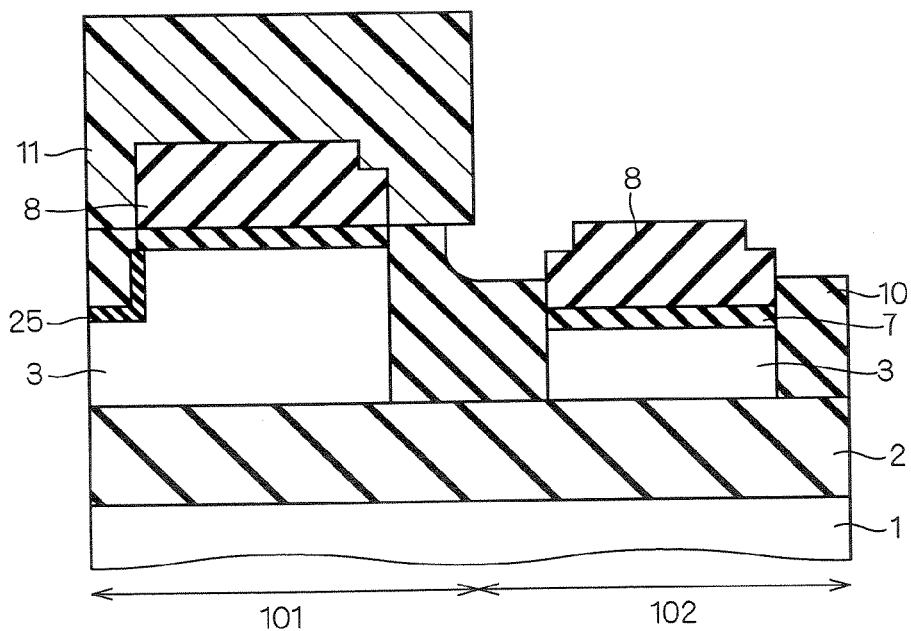

Then, as shown in FIG. 14, the isolation oxide film of the silicon oxide film 10 in the thin film SOI region 102 (second SOI region) is etched using the resist pattern 11 as a mask to be a desired film thickness.

Figure 15:
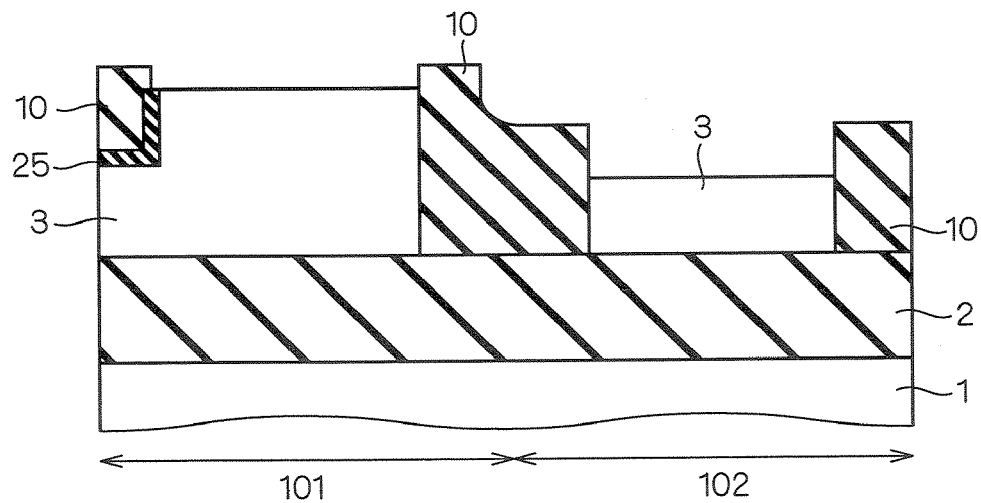

After that, as shown in FIG. 15, the resist pattern 11 is removed, and furthermore, the silicon nitride film 8 and the silicon oxide film 7 are removed.

Figure 16:
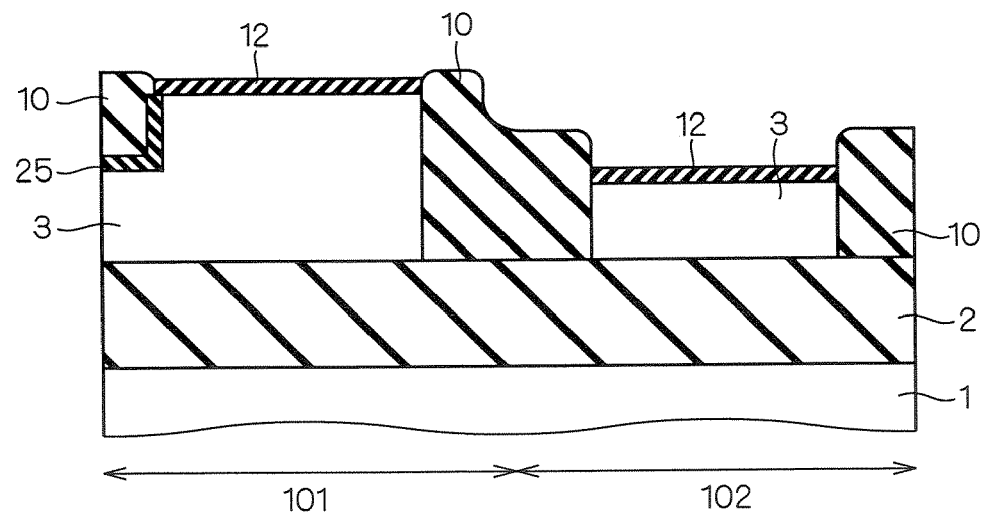

Next, as shown in FIG. 16, silicon oxide films 12 are formed on the exposed surface of the silicon layer 3 between the silicon oxide films 10 and 10.

After that, as shown in FIG. 17, after, by forming a polysilicon film and patterning it through photolithography, gate electrodes 13 are formed to form silicon oxide film spacers 14 on the sides of the gate electrodes 13, impurity ions 15 are implanted into the silicon layer 3 using the gate electrodes 13 and the silicon oxide film spacers 14 as a mask. As a result, diffusion regions 31 and 33 which later become extension & pocket regions are formed in the thick film SOI region 101 and the thin film SOI region 102, respectively.

Here, though practically the diffusion regions which become extension regions are formed to be of the same conductivity type as the source/drain regions and the diffusion regions which become pocket regions are formed to be of the opposite conductivity type to the source/drain regions within the surface of the silicon layer 3 further beneath the gate electrode 13 than the extension regions, for convenience of explanation herein, the impurity ions 15 are depicted as ions for forming both extension regions and pocket regions, and diffusion regions for forming extension regions and pocket regions are collectively shown as the diffusion regions 31 and 33 in the thick film SOI region 101 and the thin film SOI region 102.

Then, as shown in FIG. 18, after silicon oxide film side walls 16 and silicon nitride film side walls 17 are formed in sequence on the sides of the silicon oxide film spacers 14, a resist film is applied on the entire surface and a resist pattern 26 for etching which covers the thin film SOI region 102 is obtained through photolithography. The silicon layer 3 in the thick film SOI region 101 is etched using pattern 26, as well as the gate electrode 13, the silicon oxide film spacers 14, the silicon oxide film side walls 16 and the silicon nitride film side walls 17 in the thick film SOI region 101 as a mask, to form recesses 30 in upper layer parts of the silicon layer 3 in the thick film SOI region 101. Here, in FIG. 18, the structure where a silicon oxide film spacer 14 and a silicon oxide film side wall 16 are put together is shown as one region, for the sake of convenience.

Figure 19:
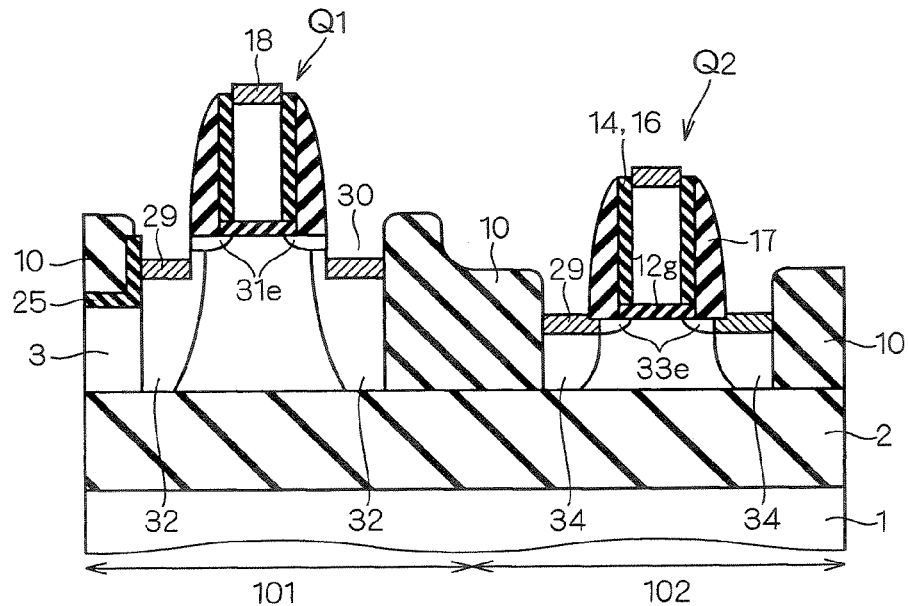

Subsequently, as shown in FIG. 19, after the removal of the resist pattern 26, impurity ions are injected in both the thick film SOI region 101 and the thin film SOI region 102 using the gate electrodes 13, the silicon oxide film spacers 14, the silicon oxide film side walls 16 and the silicon nitride film side walls 17 as a mask, to form source/drain regions 32 and 34 in the thick film SOI region 101 and the thin film SOI region 102. After that, metal silicide regions 18 and 29, such as Co silicide, are formed on the gate electrodes 13 and the source/drain regions 38, respectively.

At this time, the source/drain regions 32 and 34 both penetrate through the silicon layer 3 to reach the surface of the buried oxide film 2 in the thick film SOI region 101 and the thin film SOI region 102. Furthermore, the diffusion regions 31 and 33 beneath the silicon nitride film side walls 17 mainly become extension/pocket regions 31e and 33e. Here, in reality, the end portions of the extension/pocket regions 31e and 33e (portions close to the center of the gate electrodes 13) become pocket regions, and the remaining portions become extension regions.

As a result, a body thick film transistor Q1 (first transistor) having a structure where the SOI film in the body region (film in silicon layer 3) is thick and the SOI films in the source/drain regions 32 are thin due to the recesses 30 is formed in the thick film SOI region 101, and a body thin film transistor Q2 (second transistor) having a structure where the entire SOI film is thin is obtained in the thin film SOI region 102.

Figure 20:
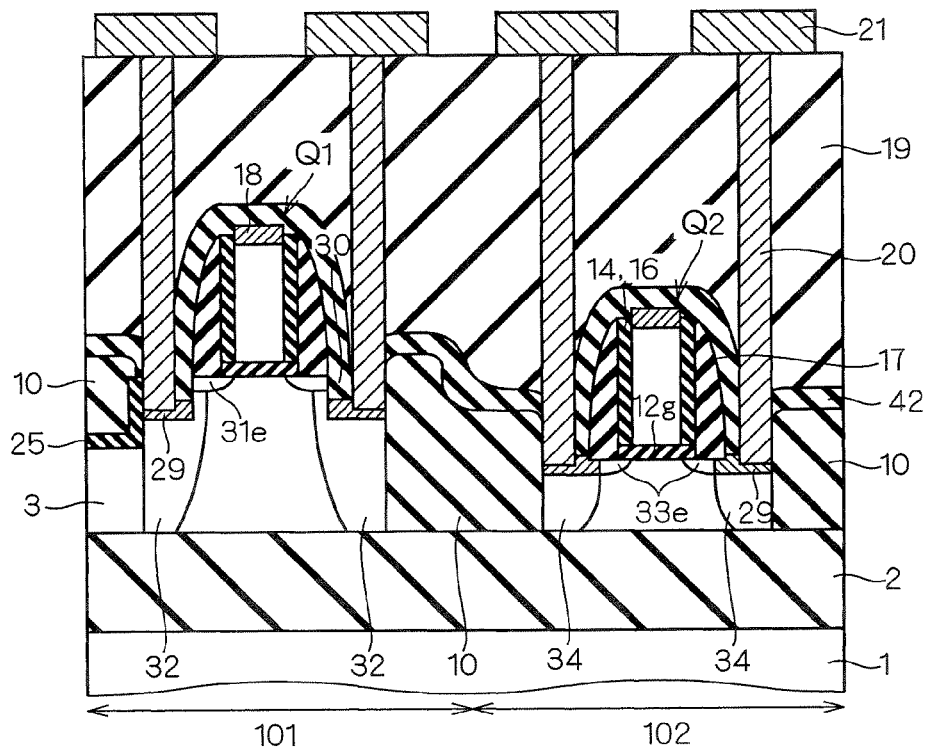

Finally, as shown in FIG. 20, after a silicon nitride film 42 is formed on the entire surface and an interlayer insulating film 19 is formed on the silicon nitride film 42, a CMP process is performed to flatten the interlayer insulating film 19. In addition, a resist pattern for etching (not shown) is formed through photolithography, contact holes are formed using this resist pattern as a mask, and are filled in with a metal to form metal plugs 20. Furthermore, the metal plugs 20 are electrically connected to the interlayer insulating film 19 to form metal wires 21. Al, Cu and the like are considered as materials of the metal wires 21. When the contact holes are formed, the silicon nitride film 42 functions as an etching stopper for the interlayer insulating film 19. In addition, the silicon nitride film 42 which has stress can reduce damage to the silicon layer 3 and prevent a leak current to silicon layer 3.

MOS transistors according to the first embodiment are formed on an SOI substrate in accordance with the manufacturing method of the first aspect described above. The body regions of these MOS transistor are electrically connected to a body contact region (not shown) in which a predetermined body potential is provided via the silicon layer 3 beneath the silicon oxide film 10, and thereby, the body potential is fixed. Here, the concrete structure for fixing the body potential through the body contact region is the same as the structure according to the fifth embodiment shown in FIGS. 95 and 96 described below.

The SOI film thickness ta1 in the body region in the body thick film transistor Q1 formed in the thick film SOI region 101 is set within a range of 100 nm to 200 nm, the SOI film thickness ta2 in the source/drain regions is set within a range of 40 nm to 100 nm, and the SOI film thickness tb of the body thin film transistor Q2 formed in the thin film SOI region 102 is set within a range of 40 nm to 100 nm, with a relationship: ta1>ta2, tb. Here, the size relationship between the SOI film thickness ta2 and the SOI film thickness tb is not very important, as long as the two are approximately the same. In addition, the film thickness of the silicon layer 3 which remains beneath the silicon oxide film 10 is set to 10 nm to 50 nm.

(Effects of the First Embodiment)

In the semiconductor device according to the first embodiment, a body thick film transistor Q1 and a body thin film transistor Q2 having a different body film thickness are formed on the same SOI substrate (silicon support substrate 1, buried oxide film 2 and silicon layer 3).

The body thick film transistor Q1 is formed to have a relatively thick body film thickness (first film thickness), and thus, the body resistance can be reduced and the stability of the body potential can increase. On the other hand, the body thin film transistor Q2 is formed on the entire SOI film to have a relatively thin film thickness (second film thickness), and thus, the speed of processing can increase together with reduction in the parasitic capacitance.

Furthermore, the body thick film transistor Q1 has a recess structure where the level of the surface of the source/drain regions 32 is lower than the level of the surface of the body region, and thus, the SOI film in the source/drain regions 32 is formed to be as thin as the SOI film thickness of the body thin film transistor Q2, and thus, the parasitic capacitance can be reduced, making a higher speed process possible in comparison with the case where a recess structure is not provided.

Furthermore, in the body thick film transistor Q1, the source/drain regions 32 having a recess structure are formed, and the depth of the source/drain regions 32 becomes approximately the same depth as that of the source/drain regions 34 of the body thin film transistor Q2, and therefore, the energy for implanting impurity ions for the formation of source/drain regions can be reduced, as compared to the case where source/drain regions having no recess structure are formed. As a result, diffusion in the lateral direction can be prevented at the time of formation of the source/drain regions 32, and therefore, short channel effects can be effectively prevented. Here, the effects described above are listed in the following Table 1.

TABLE 1

|  | Circuit | | | | |
| --- | --- | --- | --- | --- | --- |
|  | Logic | SRAM | RF | I/O | Analog |
| SOI film thickness in body region | Thin film (Q1) | | Thick film (Q2) | | |
| Required transistor characteristics | High speed | | Low jittering | Low self-heating High withstand voltage | |

As shown in Table 1, the use of the body thin film transistor Q2 for logic circuits and SRAM circuits can meet the requirements for a high speed process. On the other hand, the body potential can be stably fixed using the body thick film transistor Q1 for RF (high frequency) circuits, and thus, the requirements for fluctuation with low jittering (and a small threshold voltage) can be met. In addition, the use of the body thick film transistor Q1 I/O circuits and analog circuits can meet the requirements for low self-heating and high withstand voltage.

Furthermore, in the semiconductor device according to the first embodiment, element isolation between the body thick film transistor Q1 formed in the thick film SOI region 101 and the body thin film transistor Q2 formed in the thin film SOI region 102 can be achieved with high isolation precision through the complete isolation region made of the silicon oxide film 10 which is buried to penetrate through the silicon layer 3.

(Effects of First Aspect)

In addition, in accordance with the manufacturing method according to the first aspect, as shown the steps in FIGS. 7 and 8, the silicon nitride film 8 having a step is directly patterned, and thus, the body thick film transistor Q1 and the body thin film transistor Q2 can be manufactured with a minimum number of manufacturing steps required.

<Second Aspect>

(Manufacturing Method)

FIGS. 21 to 44 are cross sectional views showing a second aspect of the manufacturing method for a semiconductor device according to the first embodiment of the present invention. In the following, the second aspect of the manufacturing method according to the first embodiment is described with reference to these views.

Figure 21:
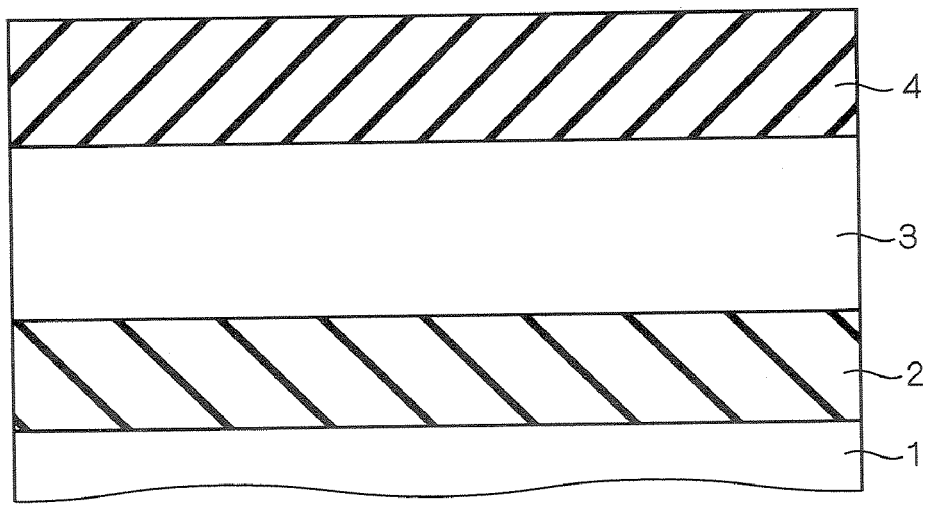
FIGS. 21 to 44 are cross sectional views showing the second aspect of a manufacturing method for a semiconductor device according to the first embodiment.

First, as shown in FIG. 21, a buried oxide film 2 having a film thickness of 10 nm to 1000 nm and a silicon layer 3 having a film thickness of 30 nm to 200 nm are formed in sequence on a silicon support substrate 1 to obtain an SOI structure composed of the silicon support substrate 1, the buried oxide film 2 and the silicon layer 3. Furthermore, a silicon nitride film 4 having a film thickness of 10 nm to 200 nm is formed on the silicon layer 3.

Figure 22:
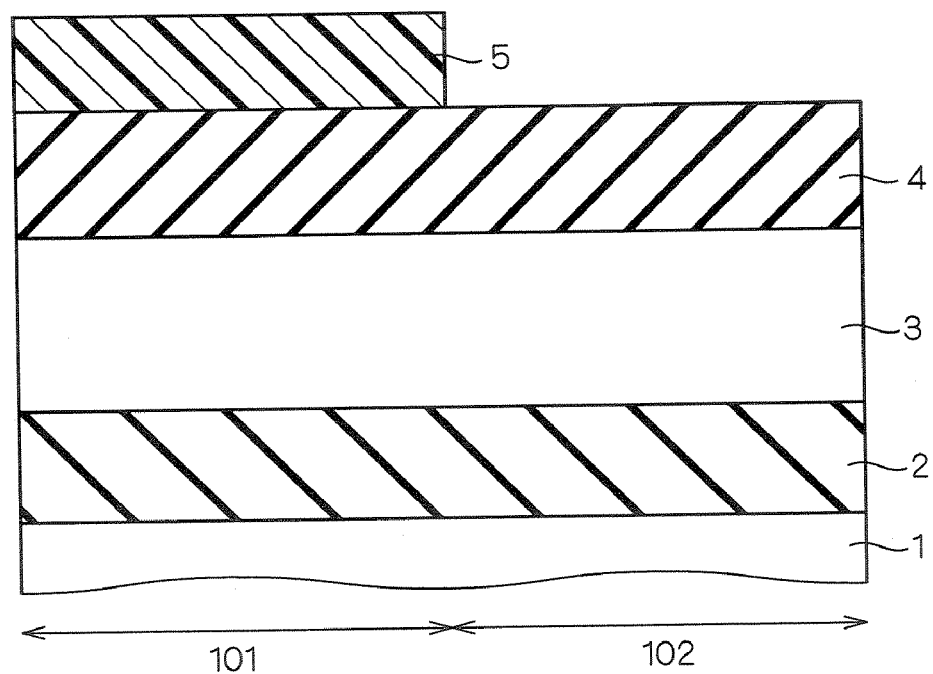

Next, as shown in FIG. 22, a resist film is applied on the entire surface to form a resist pattern 5 for forming trenches through photolithography.

Figure 23:
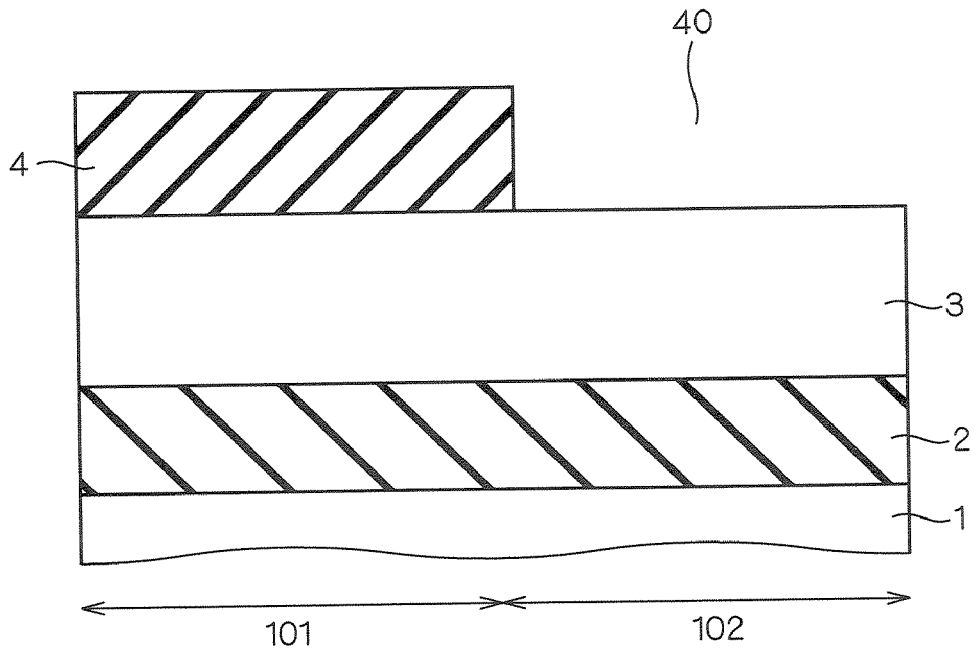

After that, as shown in FIG. 23, the silicon nitride film 4 is patterned using a resist pattern 5 as a mask, and thereby, an opening 40 from which the surface of the silicon layer 3 is exposed is formed, and after that, the resist pattern 5 is removed.

Figure 24:
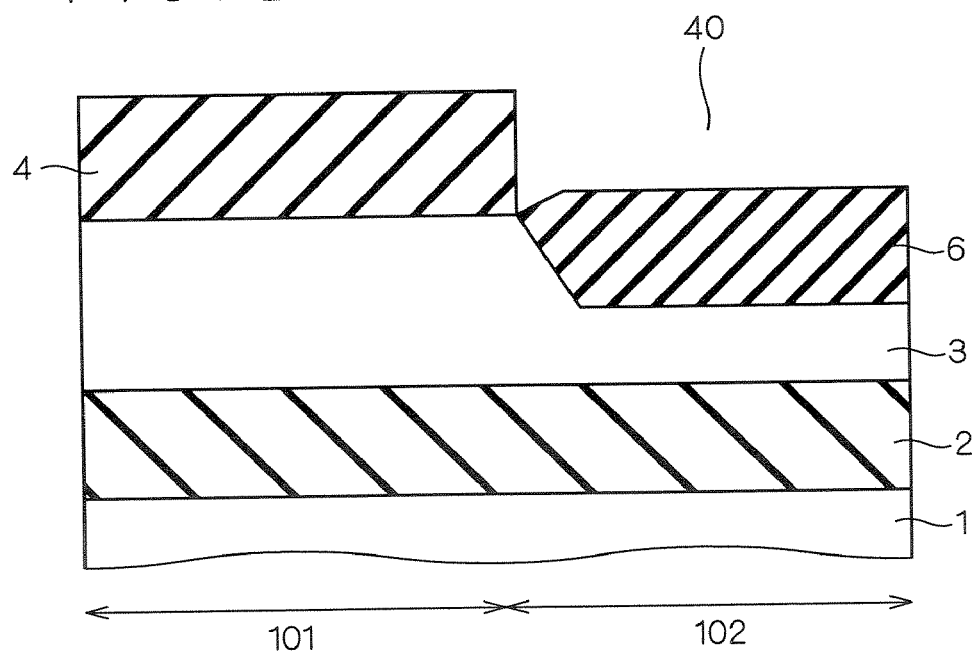
Figure 25:
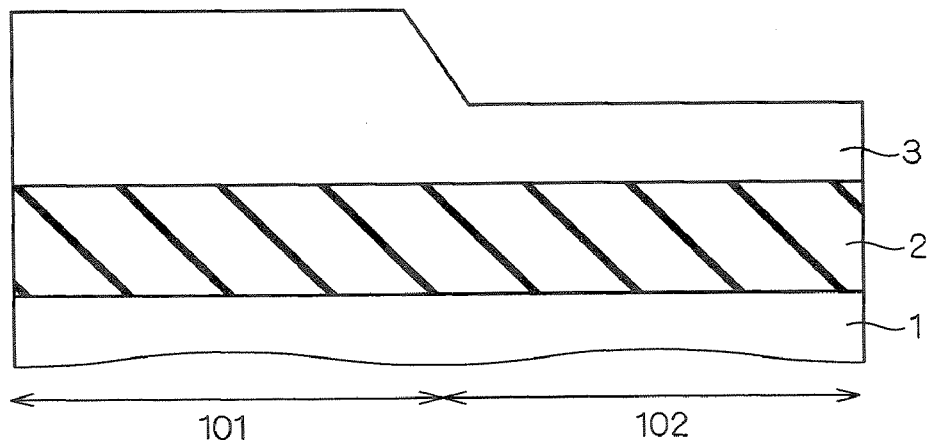

Subsequently, as shown in FIG. 24, an oxidizing process is performed on the silicon layer 3 through the opening 40 to form a silicon oxide film 6 to have the silicon layer 3 in the opening 40 as thin as a desired film thickness. Then, as shown in FIG. 25, the silicon nitride film 4 and the silicon oxide film 6 are removed.

Figure 26:
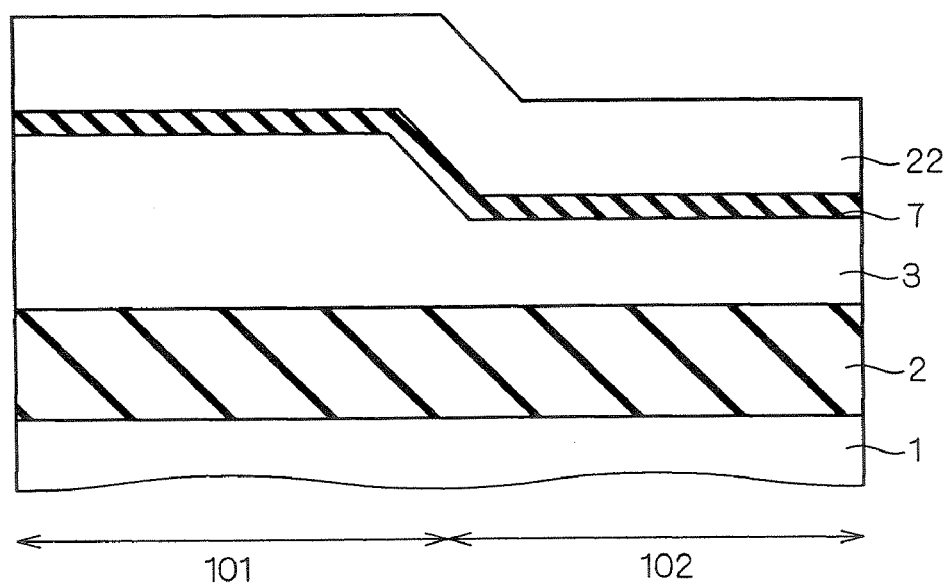

After that, as shown in FIG. 26, a silicon oxide film 7, which is a pad film having a film thickness of 5 nm to 400 nm, is formed on the entire surface, and a polysilicon film 22 is deposited on the entire surface of this silicon oxide film 7. The polysilicon film 22 is formed to have a film thickness greater than the difference (ta–tb) between the SOI film thickness ta of the silicon layer 3 and the SOI film thickness tb.

Figure 27:
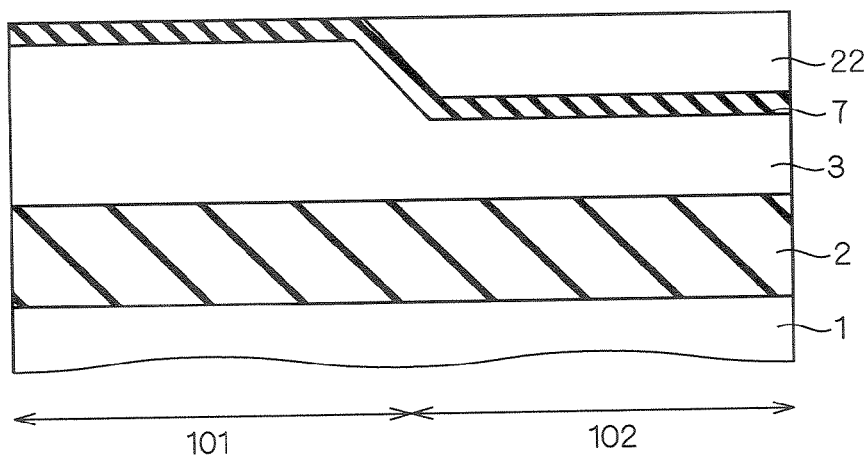

Next, as shown in FIG. 27, a CMP process is performed using the silicon oxide film 7 as a stopper to flatten the polysilicon film 22. Accordingly, the polysilicon film 22 remains only in a thin film SOI region 102, and the polysilicon film 22 is flattened to be at the same level as the level at which the silicon oxide film 7 is formed in a thick film SOI region 101. That is to say, the silicon oxide film 7 and the polysilicon film 22 function as a flattened layer for flattening the surface by making the level at which the top of the thick film SOI region 101 and the thin film SOI region 102 is located coincide.

Figure 28:
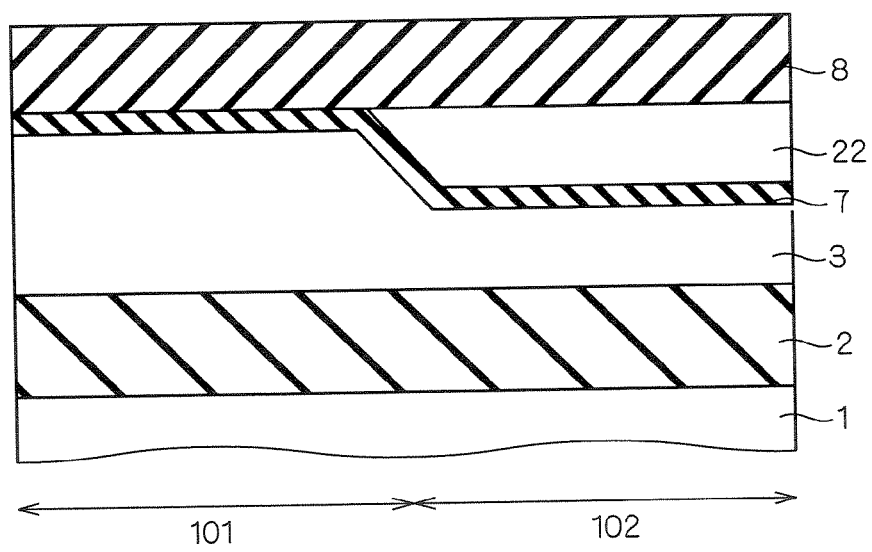

After that, as shown in FIG. 28, a silicon nitride film 8 having a film thickness of 10 nm to 1000 nm is formed on the silicon oxide film 7.

Figure 29:
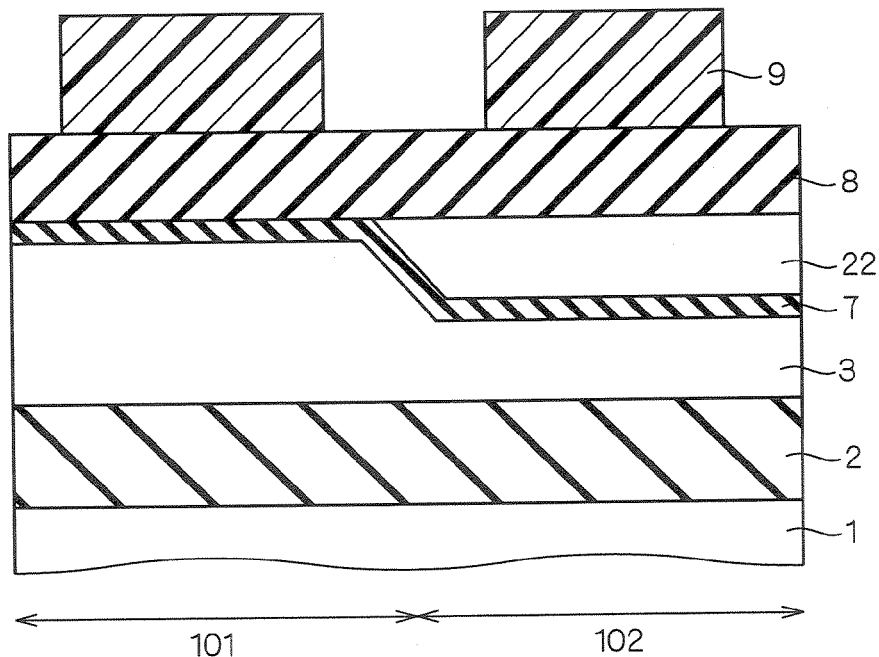

Next, as shown in FIG. 29, a resist film is applied on the entire surface, and a resist pattern 9 for forming trenches is formed through photolithography.

Figure 30:
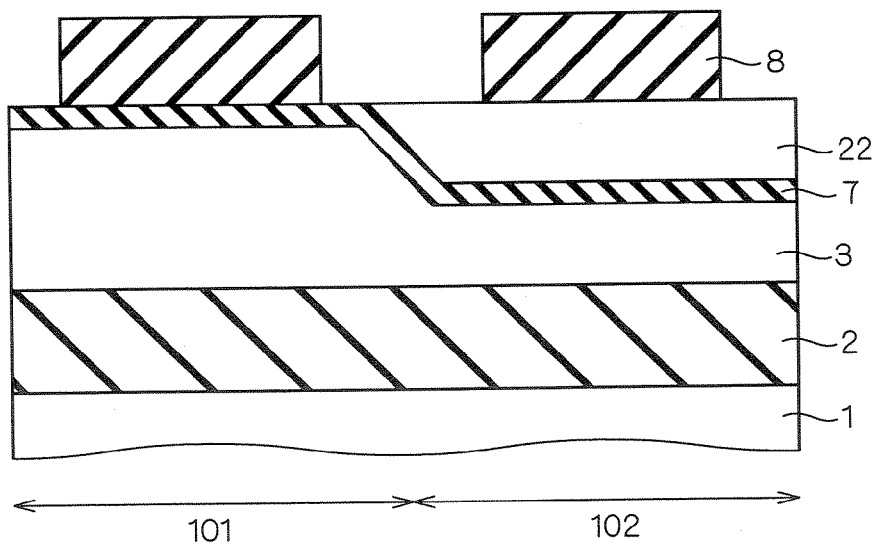

After that, as shown in FIG. 30, the silicon nitride film 8 is etched using the resist pattern 9 as a mask, so that the silicon nitride film 8 is patterned to remove the resist pattern 9.

Figure 31:
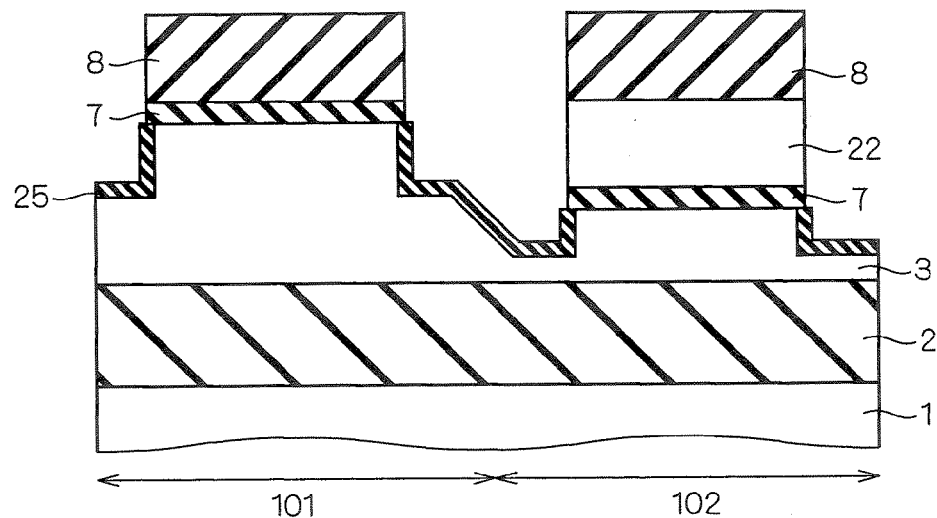

Then, as shown in FIG. 31, the polysilicon film 22, the silicon oxide film 7 and the silicon layer 3 are etched using the silicon nitride film 8 as a mask to form trenches. This etching process is out in such a manner that the silicon layer 3 partially remains. Furthermore, the inner walls of the trenches in the silicon layer 3 are oxidized to form inner wall oxide films 25 having a film thickness of 5 nm to 50 nm on the exposed surface of the silicon layer 3. Here, the process for forming the inner wall oxide films 25 may be omitted.

Figure 32:
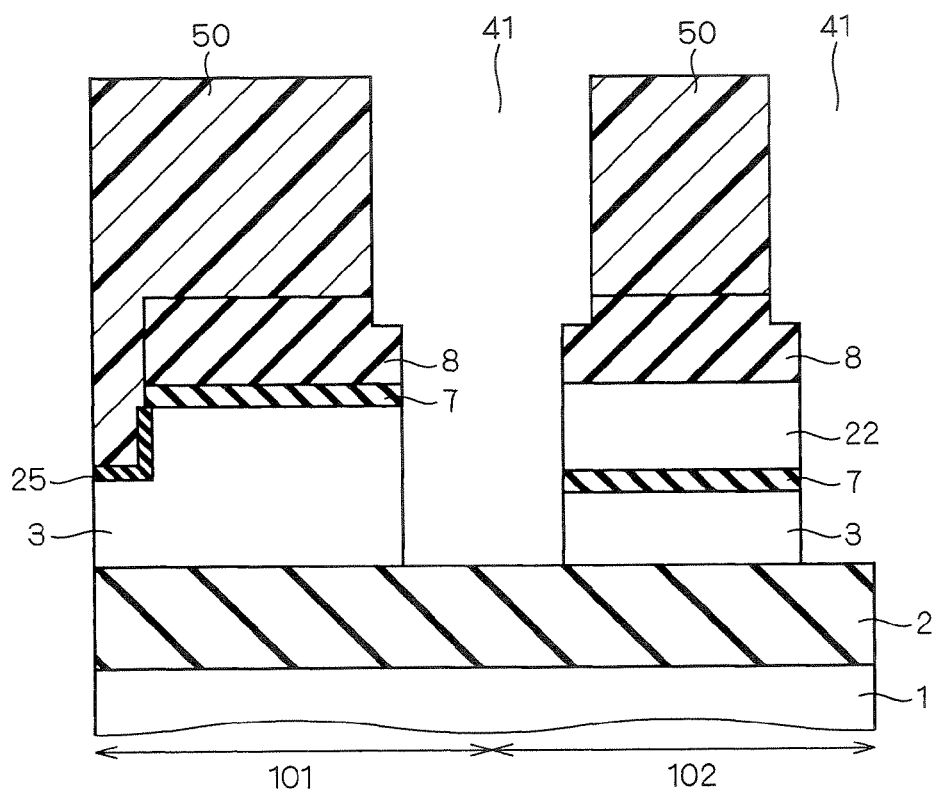

Subsequently, as shown in FIG. 32, a resist film is applied on the entire surface, a resist pattern 50 for forming trenches is formed through photolithography, and the inner wall oxide films 25 and the silicon layer 3 are etched using this resist pattern 50 and the silicon nitride film 8 as a mask to form trenches. At this time, the entirety of the silicon layer 3 is removed to obtain openings 41 from which the surface of the buried oxide film 2 is exposed.

Figure 33:
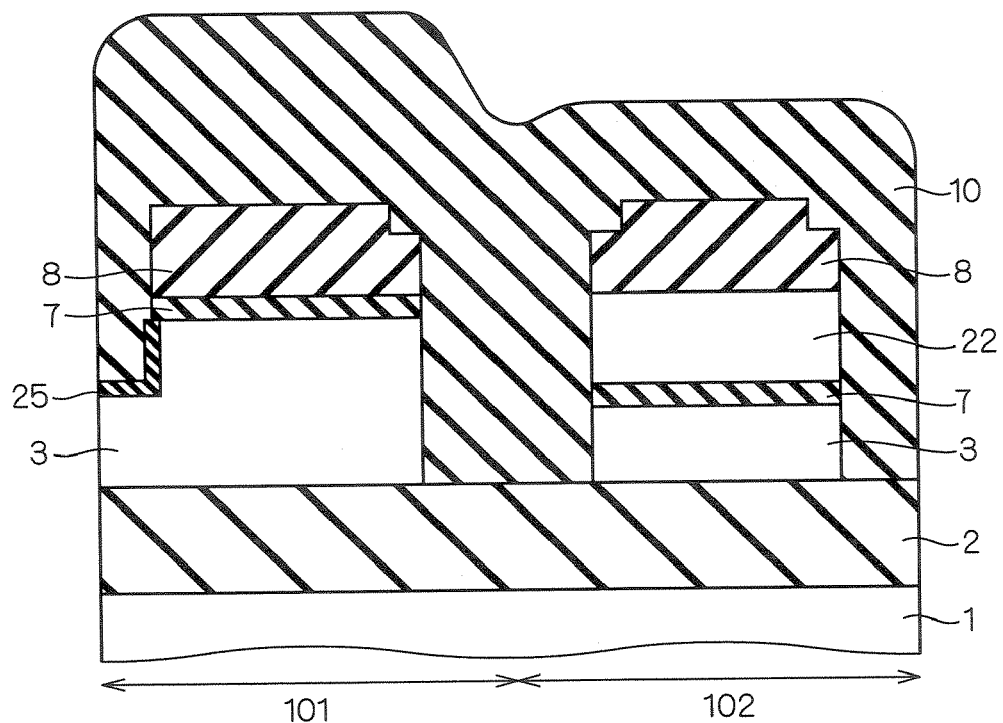

Then, as shown in FIG. 33, after a silicon oxide film 10 having a film thickness of 15 nm to 1000 nm is formed, an annealing process at 500° C. to 1300° C. is performed. Here, this annealing process may be omitted.

Figure 34:
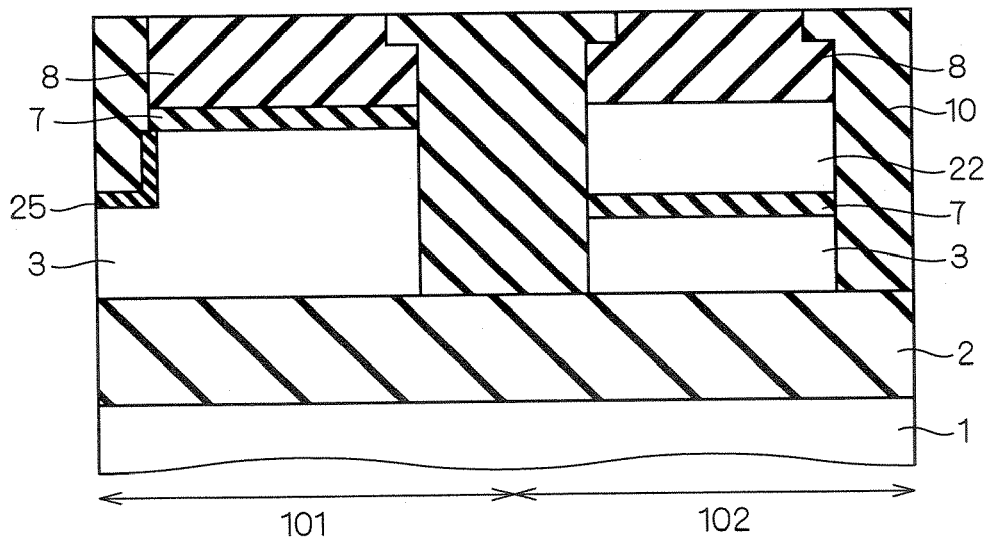

Next, as shown in FIG. 34, a CMP process is performed using the silicon nitride film 8 as a stopper to flatten the silicon oxide film 10. Accordingly, the silicon oxide film 10 is flattened to the same level as the top of the silicon nitride film 8 in the thick film SOI region 101 or to such a level that the silicon nitride film 8 is slightly polished from the top.

Figure 35:
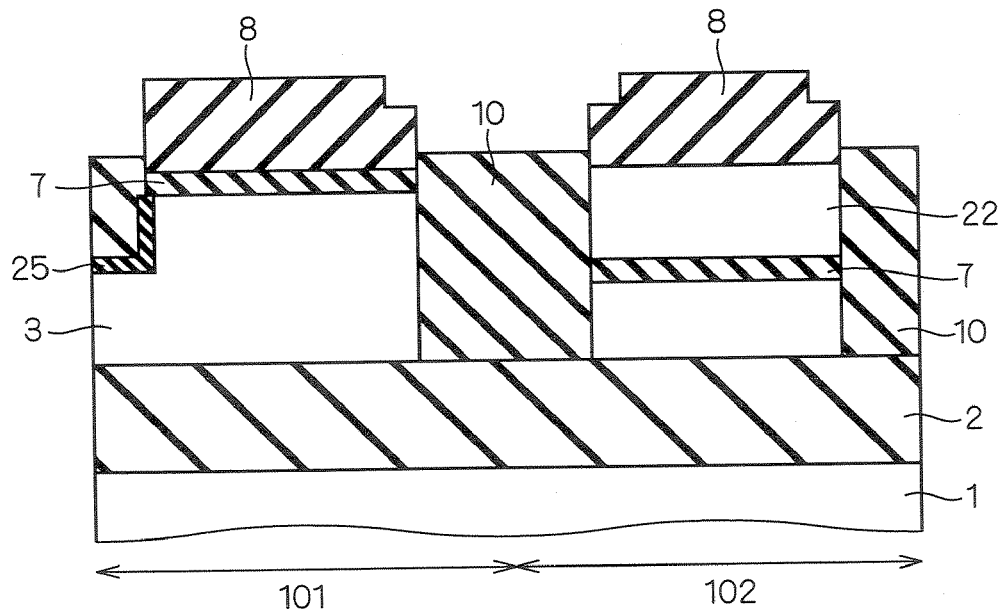

Subsequently, as shown in FIG. 35, the silicon oxide film 10 is etched to set the silicon oxide film 10 in the thick film SOI region 101 to a predetermined film thickness.

Figure 36:
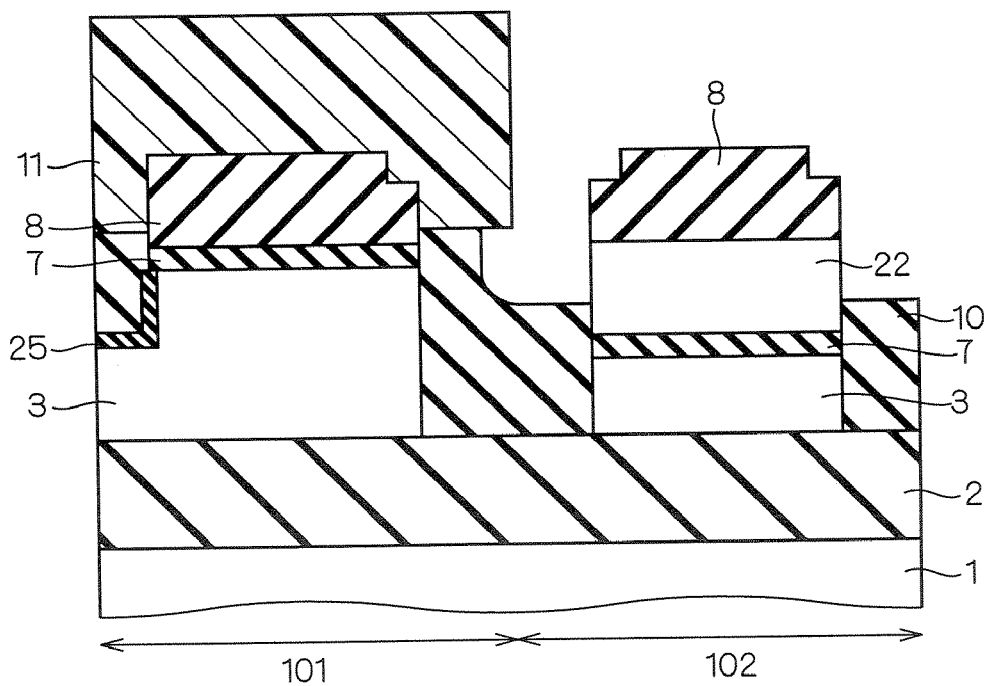

After that, as shown in FIG. 36, a resist film is applied on the entire surface and a resist pattern 11 for forming trenches is obtained through photolithography. Then, the isolation oxide film of the silicon oxide film 10 in the thin film SOI region 102 is etched using the resist pattern 11 as a mask to have a desired film thickness.

Figure 37:
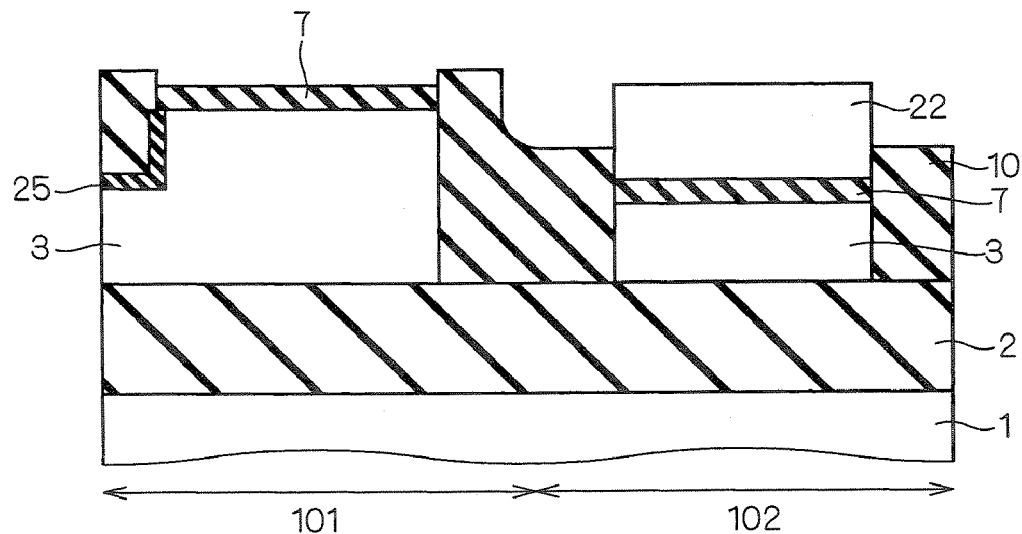

Then, as shown in FIG. 37, after the resist pattern 11 is removed, the silicon nitride film 8 is removed.

Figure 38:
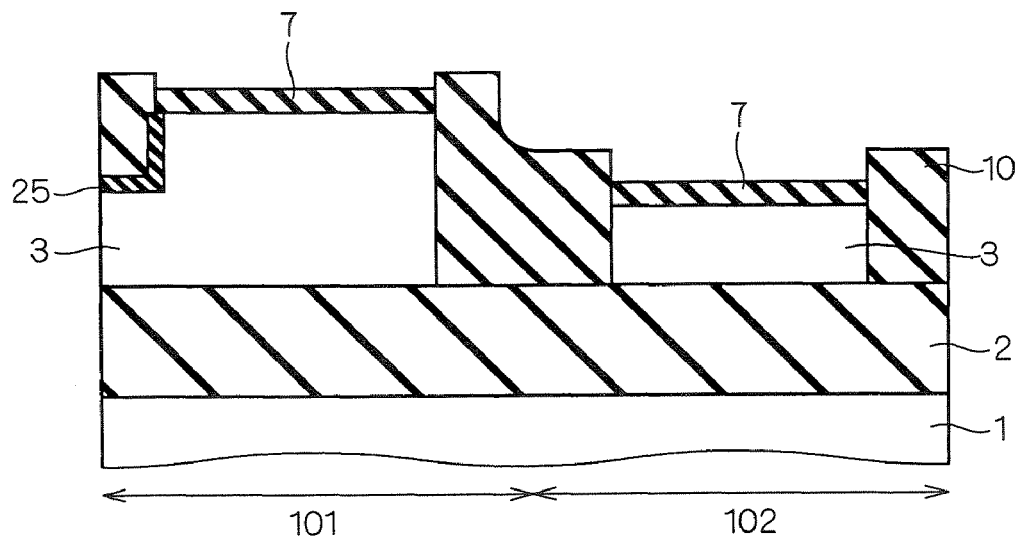
Figure 39:
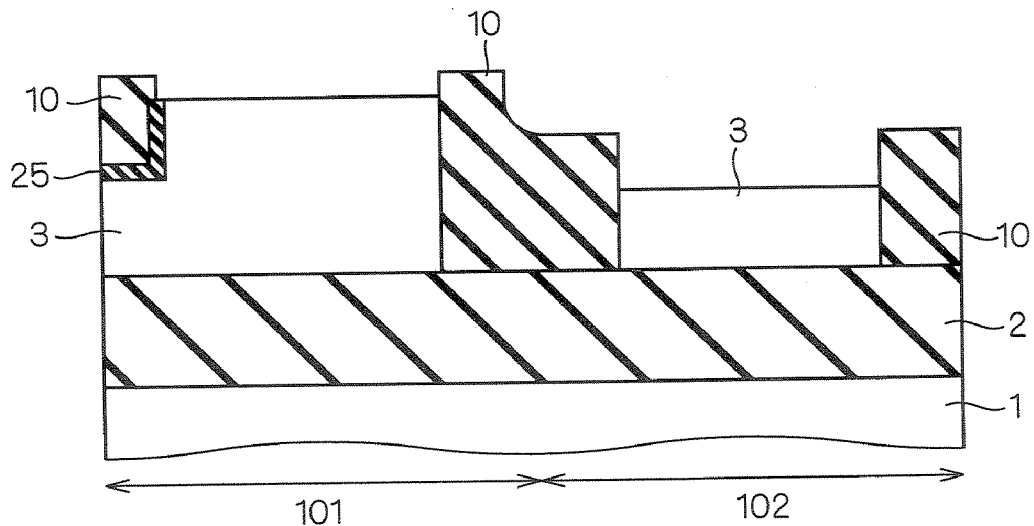

Subsequently, as shown in FIG. 38, the polysilicon film 22 is removed, and furthermore, as shown in FIG. 39, the silicon oxide film 7 is removed.

Figure 40:
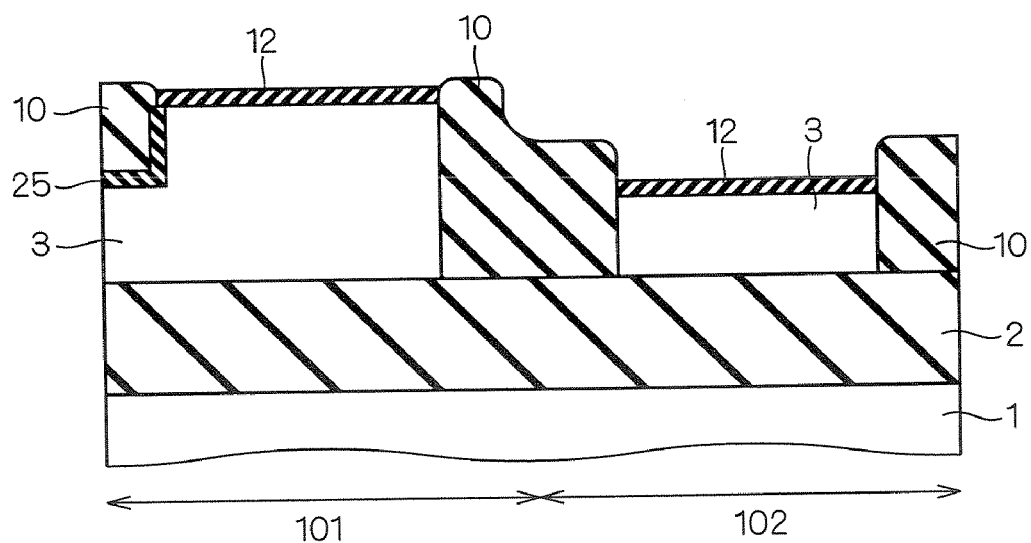

Next, as shown in FIG. 40, silicon oxide films 12 are formed on the exposed surface of the silicon layer 3 between the silicon oxide films 10 and 10.

Figure 41:
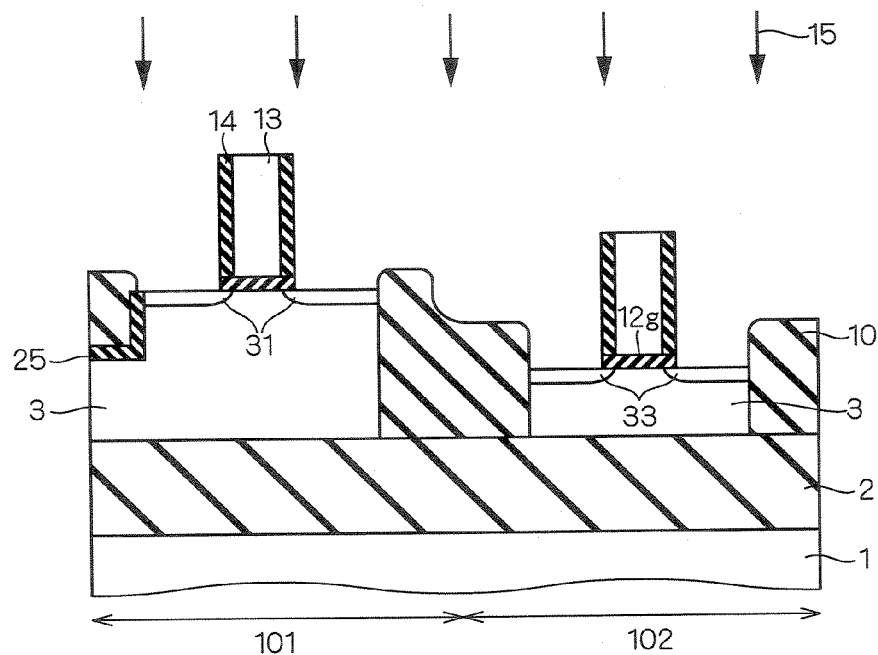

After that, as shown in FIG. 41, a polysilicon film is formed and patterned through photolithography to form gate electrodes 13, and then, silicon oxide film spacers 14 are formed on the sides of the gate electrodes 13, and after that, impurity ions 15 are injected into the silicon layer 3 using the gate electrodes 13 and the silicon oxide film spacers 14 as a mask to form diffusion regions 31 and 33 which later become extension & pocket regions in the thick film SOI region 101 and the thin film SOI region 102, respectively.

Figure 42:
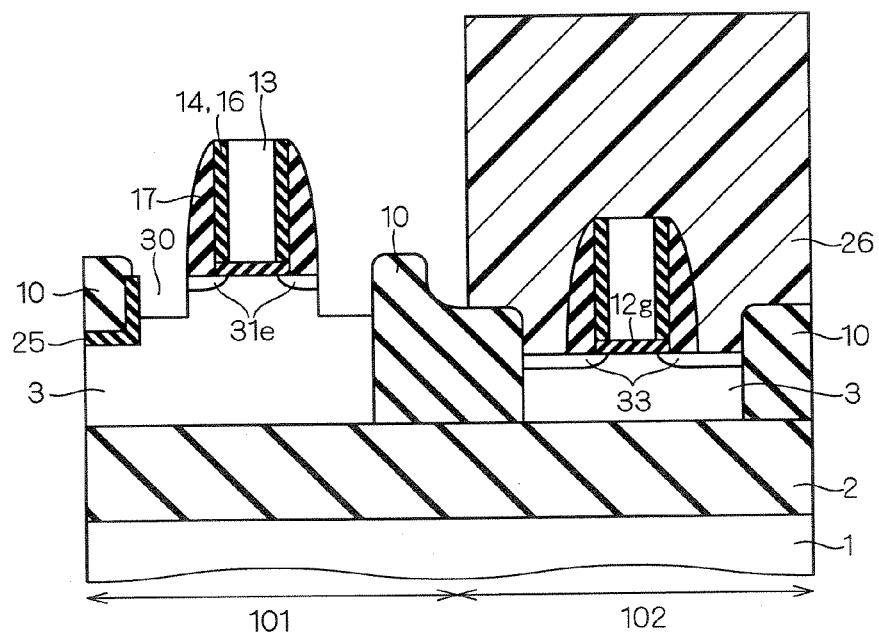

Then, as shown in FIG. 42, after silicon oxide film side walls 16 and silicon nitride film side walls 17 are formed in sequence on the sides of the silicon oxide film spacers 14, a resist film is applied on the entire surface to obtain a resist pattern 26 for etching which covers the thin film SOI region 102 through photolithography. The silicon layer 3 in the thick film SOI region 101 is etched using this resist pattern 26, as well as the gate electrodes 13, the silicon oxide film spacers 14, the silicon oxide film side walls 16 and the silicon nitride film side walls 17 in the thick film SOI region 101 as a mask to form recesses 30 in upper layer parts of the silicon layer 3 in the thick film SOI region 101.

Figure 43:
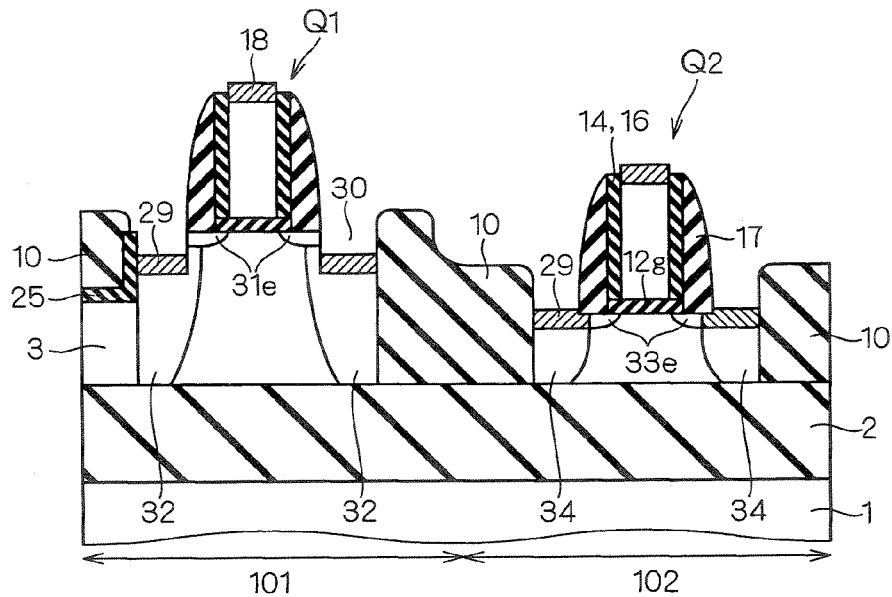

Subsequently, as shown in FIG. 43, after the removal of the resist pattern 26, impurity ions are implanted into both the thick film SOI region 101 and the thin film SOI region 102 using the gate electrodes 13, the silicon oxide film spacers 14, the silicon oxide film side walls 16 and the silicon nitride film side walls 17 as a mask to form source/drain regions 32 and 34 in the thick film SOI region 101 and the thin film SOI region 102. After that, metal silicide regions 18 and 29, such as Co silicide, are formed on the gate electrodes 13 and the source/drain regions 38, respectively.

At this time, the source/drain regions 32 and 34 both penetrate through the silicon layer 3 to reach the surface of the buried oxide film 2 in the thick film SOI region 101 and the thin film SOI region 102. Furthermore, the diffusion regions 31 and 33 mainly beneath the silicon nitride film side walls 17 become extension/pocket regions 31e and 33e.

As a result, in the same manner as in the first aspect, a body thick film transistor Q1 having a structure where the SOI film in the source/drain regions 32 is thin is formed in the thick film SOI region 101, and a body thin film transistor Q2 having a structure where the entire SOI film is thin is obtained in the thin film SOI region 102.

Figure 44:
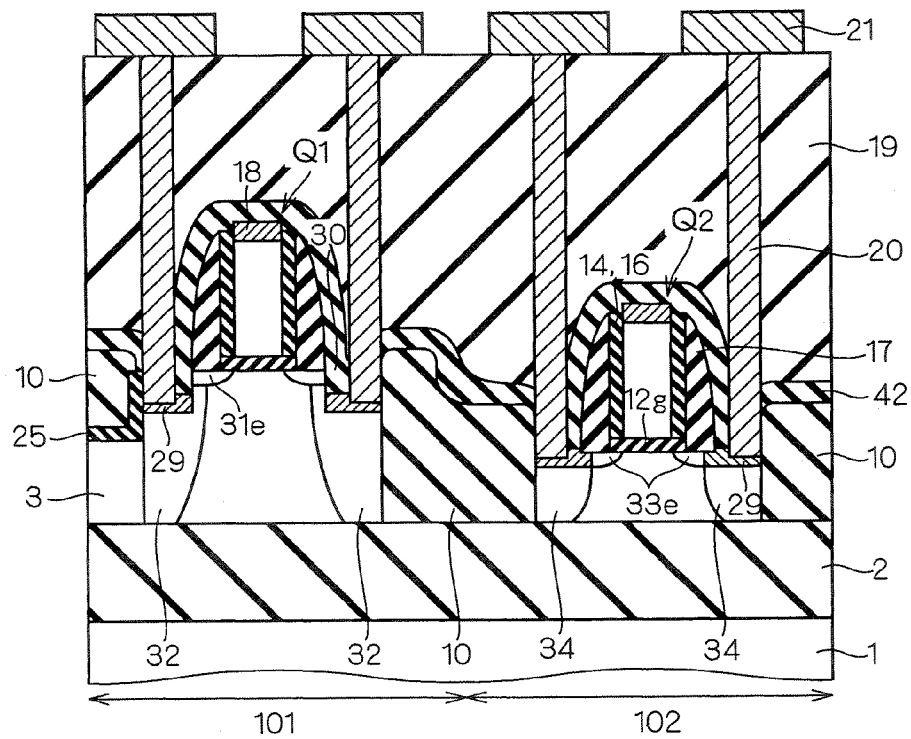

Finally, as shown in FIG. 44, after a silicon nitride film 42 is formed on the entire surface and an interlayer insulating film 19 is formed on the silicon nitride film 42, a CMP process is performed to flatten the interlayer insulating film 19. In addition, a resist pattern for etching (not shown) is formed through photolithography, so that contact holes are formed using this resist pattern as a mask, and the contact holes are filled in with a metal to form metal plugs 20, and furthermore, metal wires 21 which are electrically connected to the metal plugs 20 are formed on the interlayer insulating film 19. Al, Cu and the like are considered as materials of the metal wires 21.

MOS transistors according to the first embodiment are formed on an SOI substrate in accordance with the manufacturing method according to the second aspect described above.

(Effects of Second Aspect)

In accordance with the manufacturing method according to the second aspect, as shown in FIGS. 27 to 30, after the entire surface on which the polysilicon film 22 is formed is flattened, since a patterning process is performed on the silicon nitride film 8, the precision of patterning the silicon nitride film 8 increases, and thus, there are effects that increase the precision of the dimensions of the formed MOS transistors.

In addition, as shown in FIG. 27, the polysilicon film 22 is flattened in accordance with a polishing process using the silicon oxide film 7 which is a pad film as a stopper, and thus, flattening can be performed with high precision.

<Third Aspect>
(Manufacturing Method)

FIGS. 45 to 63 are cross sectional views showing a third aspect of the manufacturing method for a semiconductor device according to the first embodiment of the present invention. In the following, the manufacturing method according to the third aspect of the first embodiment is described with reference to these figures.

Figure 45:
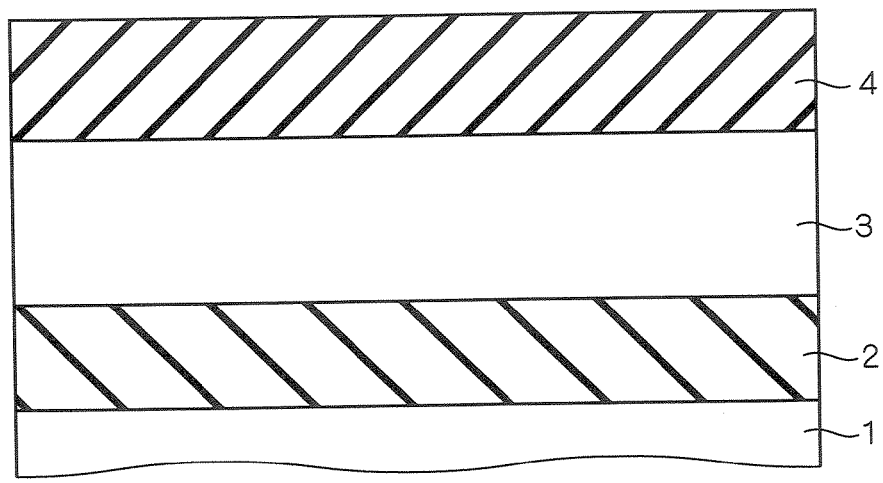

First, as shown in FIG. 45, a buried oxide film 2 having a film thickness of 10 nm to 1000 nm and a silicon layer 3 having a film thickness of 30 nm to 200 nm are formed in sequence on a silicon support substrate 1, and thereby, an SOI structure composed of the silicon support substrate 1, the buried oxide film 2 and the silicon layer 3 is obtained. Furthermore, a silicon nitride film 4 having a film thickness of 10 nm to 1000 nm is formed on the silicon layer 3.

Figure 46:
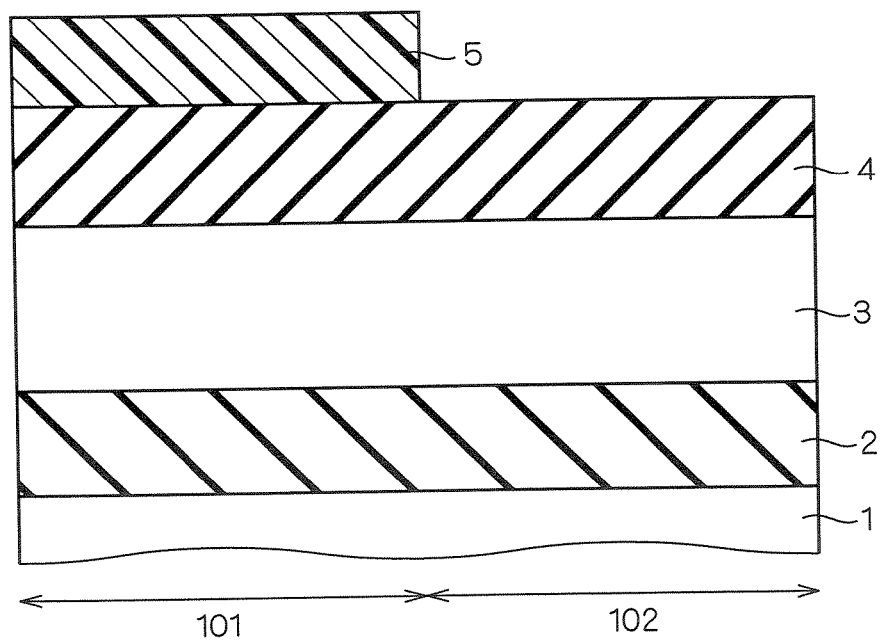

Next, as shown in FIG. 46, a resist film is applied on the entire surface and a resist pattern 5 for forming trenches is formed through photolithography.

Figure 47:
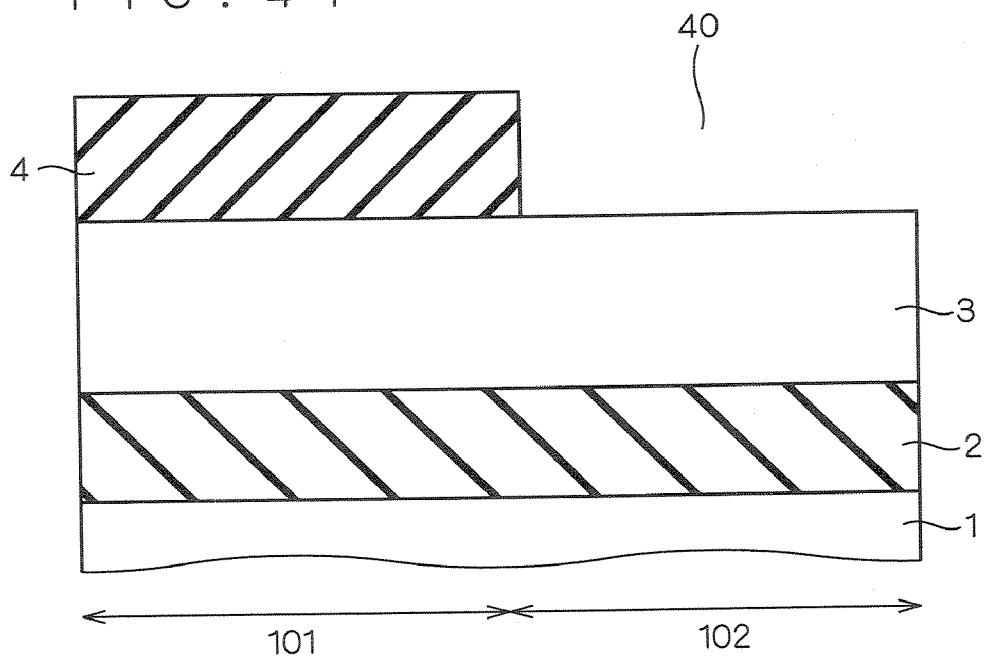

After that, as shown in FIG. 47, the silicon nitride film 4 is patterned using the resist pattern 5 as a mask and, and thereby, an opening 40 from which the surface of the silicon layer 3 is exposed is formed, and after that, the resist pattern 5 is removed.

Figure 48:
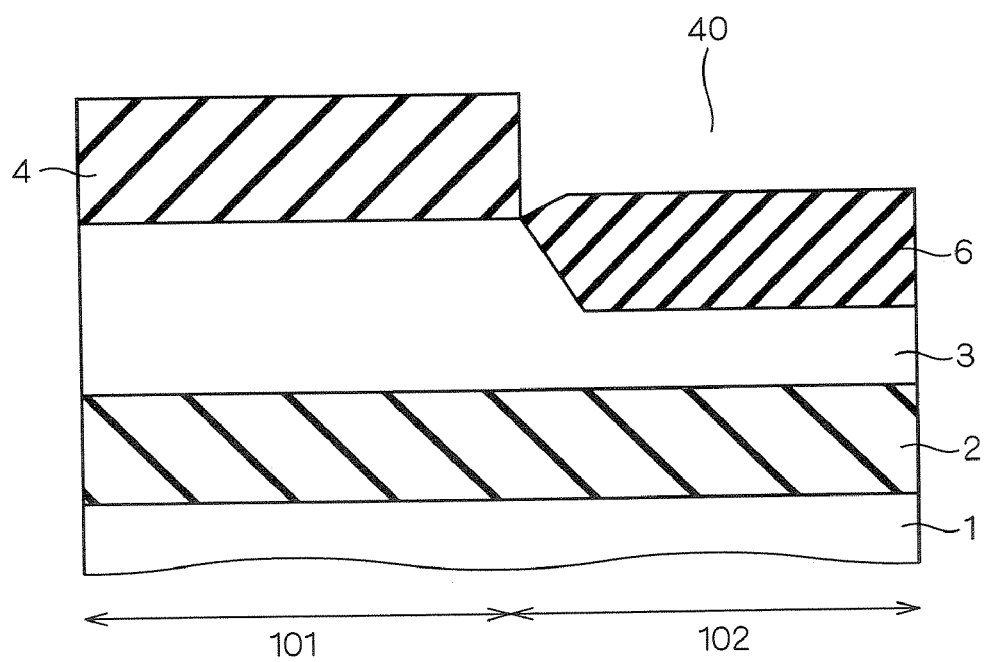

Subsequently, as shown in FIG. 48, an oxidizing process is performed on the silicon layer 3 through the opening 40 and the silicon oxide film 6 is formed so to be the silicon layer 3 in the opening 40 as thin as a desired film thickness. Then, as shown in FIG. 49, the silicon nitride film 4 and the silicon oxide film 6 are removed.

Then, as shown in FIG. 50, a silicon oxide film 7 having a film thickness of 5 nm to 400 nm is formed on the entire surface, and a silicon nitride film having a film thickness of 10 nm to 1000 nm is formed on the silicon oxide film 7. Furthermore, a resist film is applied on the entire surface, and a resist pattern for forming trenches (not shown) which covers a thin film SOI region 102 is formed through photolithography, and then, the silicon nitride film 8 in the thick film SOI region 101 is etched using this resist pattern as a mask to form a pre-etching opening 23 in an upper layer part of the silicon nitride film 8 in the thick film SOI region 101.

Figure 51:
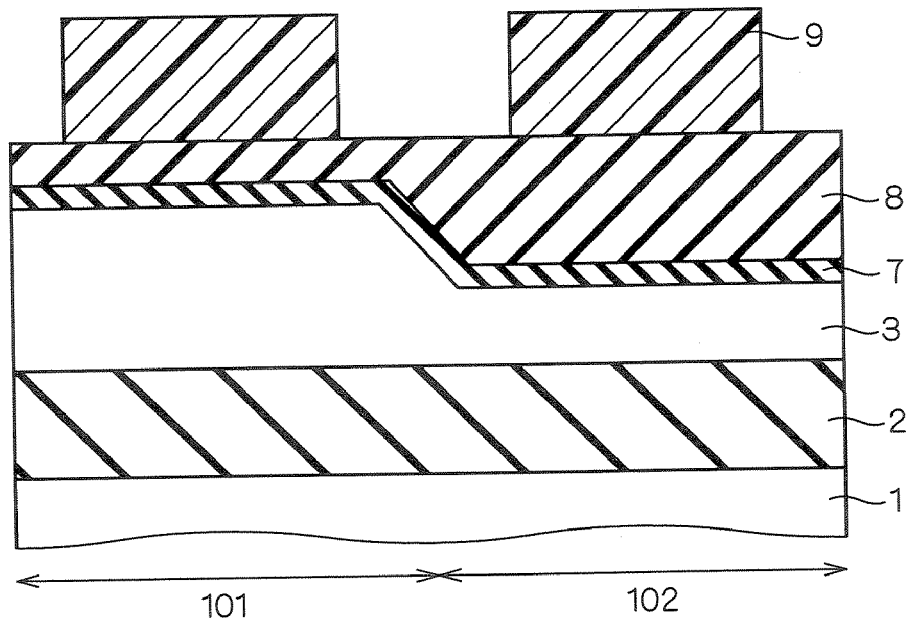

Next, as shown in FIG. 51, a CMP process is performed, and thereby, the silicon nitride film 8 is flattened. Though the silicon nitride film 8 has a step between the thick film SOI region 101 and the thin film SOI region 102, a pre-etching opening 23 is formed in advance in the thick film SOI region 101, and therefore, the silicon nitride film 8 can be polished to be well flattened. In this manner, the silicon nitride film 8 functions as a flattened layer for flattening the surface, by making the level of the top of the thick film SOI region 101 and the thin film SOI region 102 coincide. Furthermore, a resist film is applied on the entire surface, and a resist pattern 9 for forming trenches is formed through photolithography.

Figure 52:
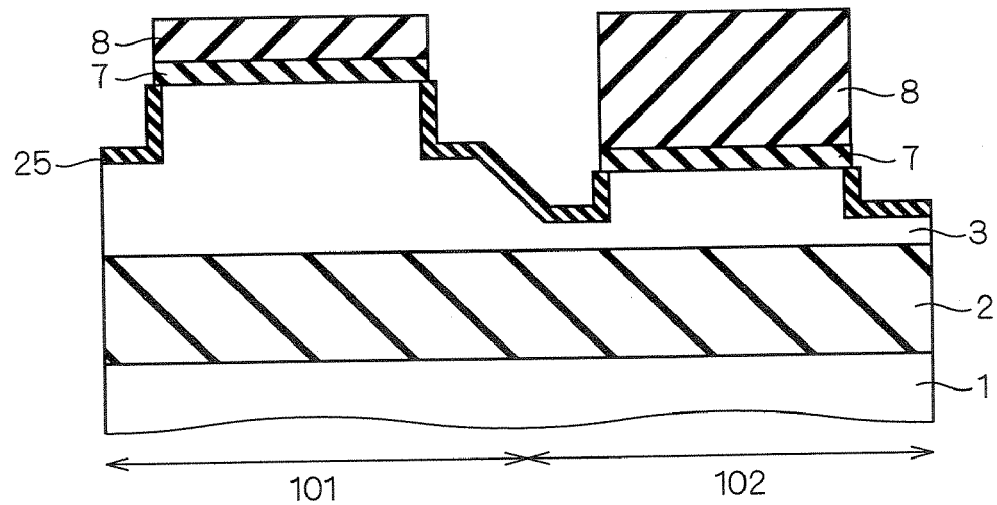

After that, as shown in FIG. 52, the silicon nitride film 8 is etched using the resist pattern 9 is a mask to pattern the silicon nitride film 8, and then, the resist pattern 9 is removed. Furthermore, the silicon oxide film 7 and the silicon layer 3 are etched using the silicon nitride film 8 as a mask to form trenches. This etching process is performed in such a manner that the silicon layer 3 partially remains. Furthermore, the inner walls of the trenches in the silicon layer 3 are oxidized to form inner wall oxide films 25 having a film thickness of 5 nm to 50 nm on the exposed surface of the silicon layer 3. Here, the process for forming the inner wall oxide films 25 may be omitted.

Subsequently, as shown in FIG. 53, a resist film is applied on the entire surface and a resist pattern 50 for forming trenches is formed through photolithography, and then, the inner wall oxide films 25 and the silicon layer 3 are etched using this resist pattern 50 and the silicon nitride film 8 as a mask to form trenches. At this time, the entirety of the silicon layer 3 is removed to obtain openings 41 from which the surface of the buried oxide film 2 is exposed.

Then, as shown in FIG. 54, after a silicon oxide film 10 having a film thickness of 15 nm to 1000 nm is formed, an annealing process at 500° C. to 1300° C. is performed. Here, this annealing process may be omitted. After that, a CMP process is performed using the silicon nitride film 8 as a stopper to the silicon oxide film 10 is flattened.

Figure 55:
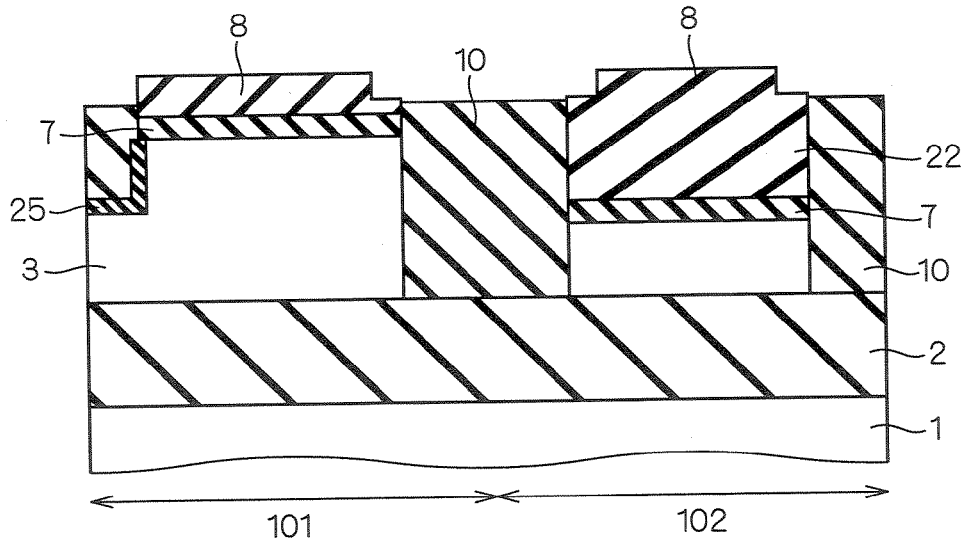

Subsequently, as shown in FIG. 55, the silicon oxide film 10 is etched to the silicon oxide film 10 in the thick film SOI region 101 to a predetermined film thickness.

Figure 56:
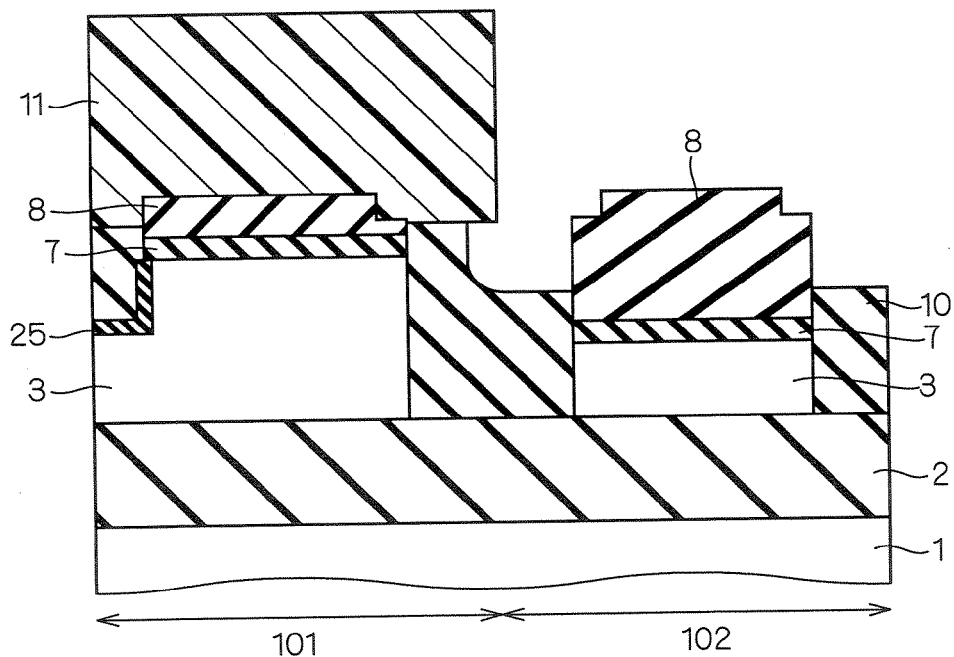

After that, as shown in FIG. 56, a resist film is applied on the entire surface, and a resist pattern 11 for forming trenches is obtained through photolithography. Then, the isolation oxide film of the silicon oxide film 10 in the thin film SOI region 102 is etched using the resist pattern 11 as a mask to have a desired film thickness.

Figure 57:
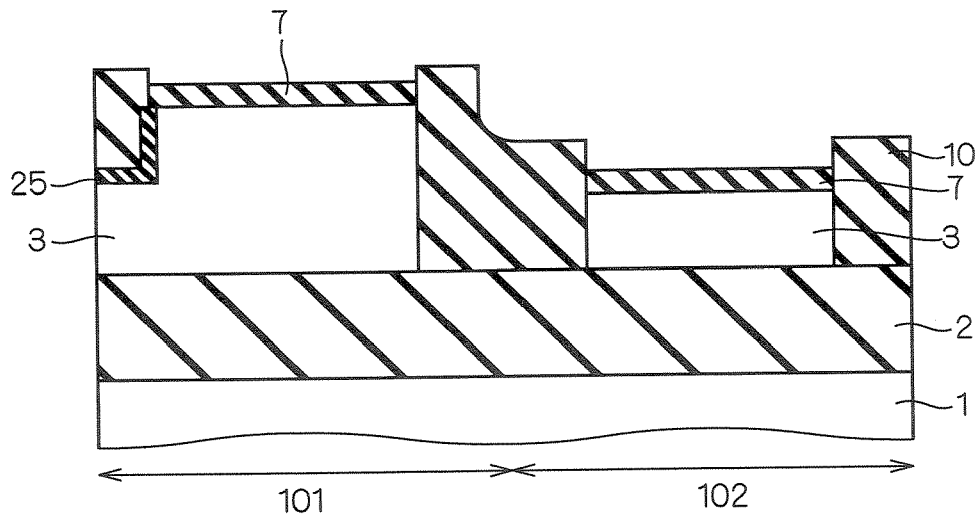
Figure 58:
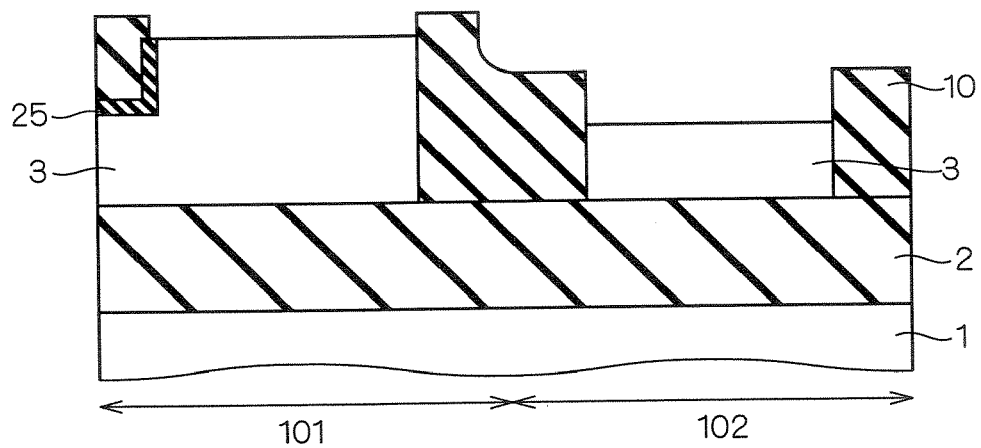

Then, as shown in FIG. 57, after the resist pattern 11 is removed and the silicon nitride film 8 is removed, as shown in FIG. 58, the silicon oxide film 7 is removed.

Figure 59:
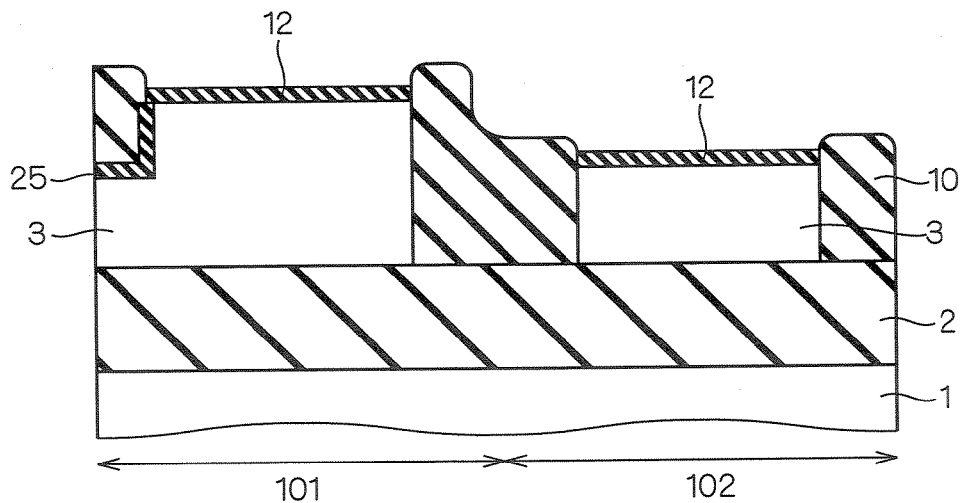

Next, as shown in FIG. 59, silicon oxide films 12 are formed on the exposed surface of the silicon layer 3 between the silicon oxide films 10 and 10.

Figure 60:
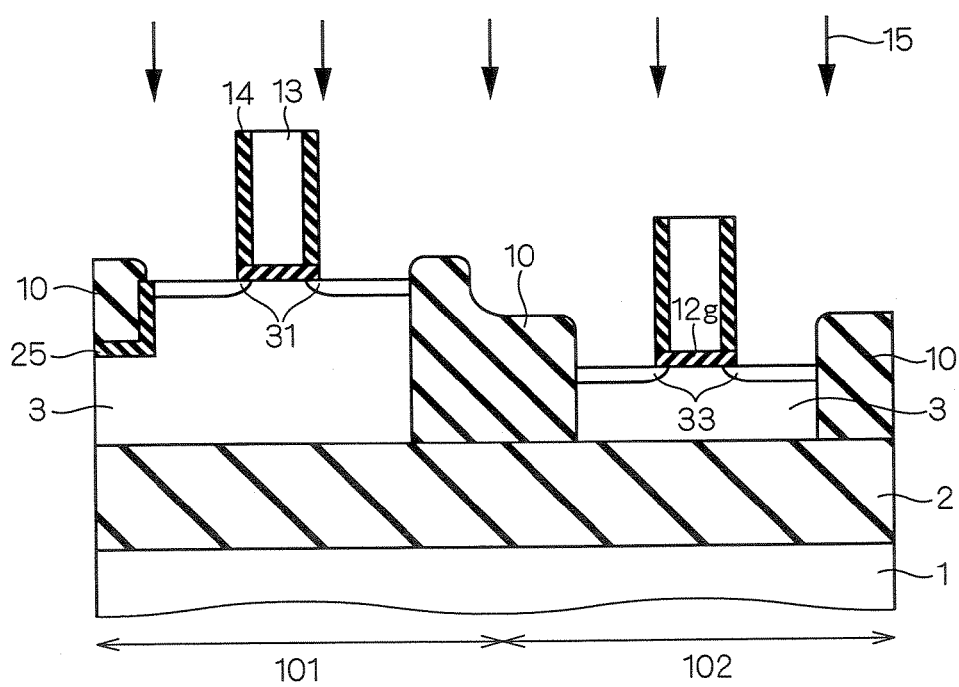

After that, as shown in FIG. 60, a polysilicon film is formed and patterned through photolithography, and thereby, gate electrodes are formed, and silicon oxide film spacers 14 are formed on the sides of the gate electrodes 13, and after that, impurity ions 15 are injected into the silicon layer 3 using the gate electrodes 13 and the silicon oxide film spacers 14 as a mask to form diffusion regions 31 and 33 which later become extension & pocket regions in the thick film SOI region 101 and the thin film SOI region 102.

Figure 61:
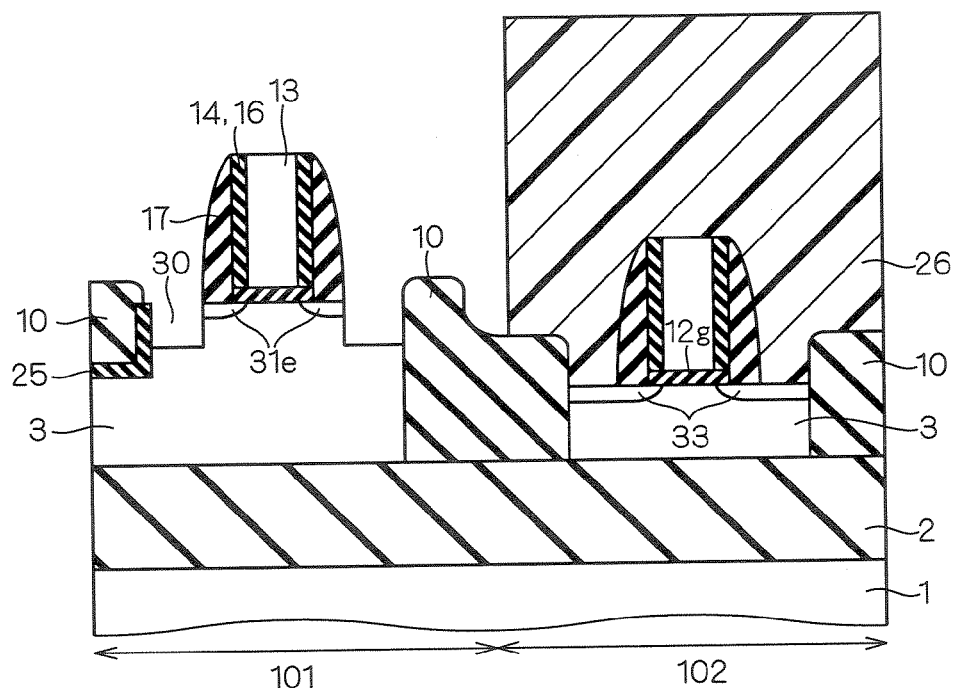

Then, as shown in FIG. 61, after silicon oxide film side walls 16 and silicon nitride film side walls 17 are formed in sequence on the sides of the silicon oxide film spacers 14, a resist film is applied on the entire surface and a resist pattern 26 for etching which covers the thin film SOI region 102 is obtained through photolithography. The silicon layer 3 in the thick film SOI region 101 is etched using this resist pattern 26, as well as the gate electrodes 13, the silicon oxide film spacers 14, the silicon oxide film side walls 16 and the silicon nitride film side walls 17 in the thick film SOI region 101 as a mask, and to form recesses 30 in upper layer parts of the silicon layer 3 in the thick film SOI region 101.

Figure 62:
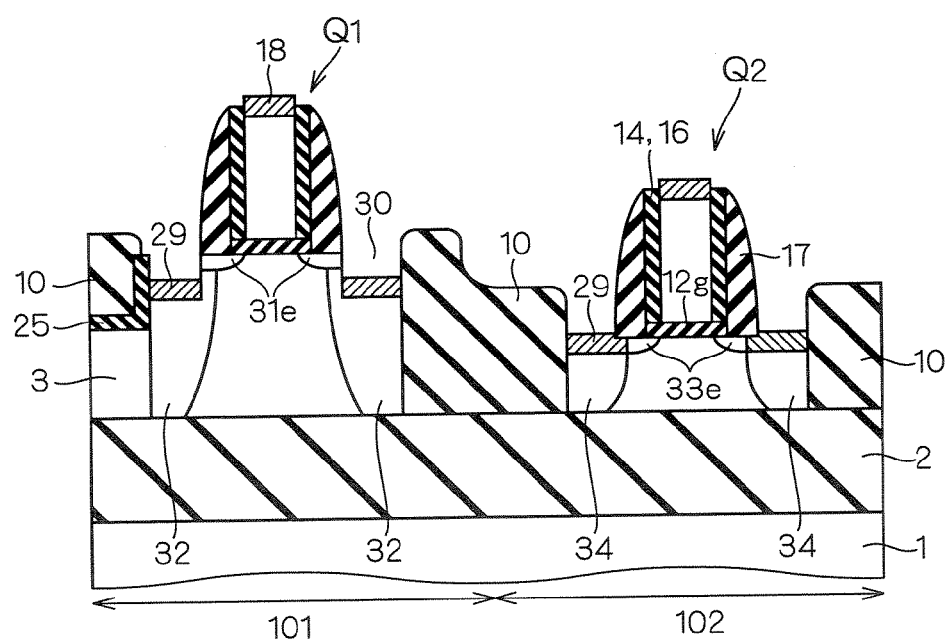

Subsequently, as shown in FIG. 62, after the removal of the resist pattern 26, impurity ions are injected using the gate electrodes 13, the silicon oxide film spacers 14, the silicon oxide film side walls 16 and the silicon nitride film side walls 17 in both the thick film SOI region 101 and the thin film SOI region 102 as a mask form to source/drain regions 32 and 34 in the thick film SOI region 101 and the thin film SOI region

102. After that, metal silicide regions 18 and 29, for example of Co silicide, are formed on the gate electrodes 13 and the source/drain regions 38, respectively.

At this time, the source/drain regions 32 and 34 both penetrate through the silicon layer 3 to reach the surface of the buried oxide film 2 in the thick film SOI region 101 and the thin film SOI region 102. Furthermore, the diffusion regions 31 and 33 mainly beneath the silicon nitride film side walls 17 become extension/pocket regions 31e and 33e.

As a result, in the same manner as in the first and second aspects, a body thick film transistor Q1 having a structure where the SOI film in the source/drain region 32 is thin is formed in the thick film SOI region 101, and a body thin film transistor Q2 having a structure where the entire SOI film is thin is obtained in the thin film SOI region 102.

Finally, as shown in FIG. 63, after a silicon nitride film 42 is formed on the entire surface and an interlayer insulating film 19 is formed on the silicon nitride film 42, a CMP process is performed to flatten the interlayer insulating film 19. In addition, a resist pattern for etching (not shown) is formed through photolithography, and contact holes are formed using this resist pattern as a mask, and the contact holes are filled in with a metal so that metal plugs 20 are formed. Furthermore, the metal plugs 20 are electrically connected to the interlayer insulating film 19 to form metal wires 21. Al, Cu and the like are considered as materials of the metal wires 21.

MOS transistors according to the first embodiment are formed on an SOI substrate in accordance with the manufacturing method according to the third aspect.

(Effects of Third Aspect)

In accordance with the manufacturing method according to the third aspect, as shown in FIGS. 50 to 52, a patterning process is performed on the silicon nitride film 8 after directly flattening the silicon nitride film 8, and therefore, the precision of patterning of the silicon nitride film 8 can increase, and the number of processing steps required can be kept to the minimum.

Furthermore, after a pre-etching opening 23 is provided in an upper layer part of the silicon nitride film 8 in the step shown in FIG. 50, a CMP process is performed in the step shown in FIG. 51, and thus, the silicon nitride film 8 can be flattened with high precision.

<<Second Embodiment>>
<First Aspect>
(Manufacturing Method)

FIGS. 64 to 67 are cross sectional views showing a portion of the first aspect of a manufacturing method for a semiconductor device according to the second embodiment of the present invention. In the following, the manufacturing method according to the second embodiment is described with reference to these figures.

As shown in FIG. 64, after the steps shown in FIGS. 1 to 16 in the first aspect of the first embodiment, the steps shown in FIGS. 21 to 40 in the second aspect and the steps shown in FIGS. 45 to 59 in the third aspect have been undertaken, in the same manner as in the first to third aspects of the first embodiment, gate electrodes 13 are formed, and silicon oxide film spacers 14 are formed on the sides of the gate electrodes 13.

Then, impurity ions 24 are injected into the silicon layer 3 using the gate electrodes 13 and the silicon oxide film spacers 14 as a mask so that low concentration regions 27 and 28 are formed in the thick film SOI region 101 and the thin film SOI region 102 in the vicinity of the interface between the buried oxide film 2 and the silicon layer 3.

The impurity ions 24 are impurity ions of the same conductivity type as the source/drain regions, and injected into regions where PN junctions between the source/drain regions and the body region are to be formed with an injection energy (depending on the SOI film thickness) at an angle of injection (0° to 15°), making the impurity concentration peak in the vicinity of the interface between the buried oxide film 2 and the silicon layer 3. Here, as the impurities of the impurity ions 24, phosphorous or the like is possible for NMOS transistors and boron or the like is possible for PMOS transistors.

After that, in the same manner as in the first to third aspects of the first embodiment, impurity ions 15 are injected into the silicon layer 3 using the gate electrodes 13 and the silicon oxide film spacers 14 as a mask, and diffusion regions 31 and 33, which later become extension & pocket regions, are formed in the thick film SOI region 101 and the thin film SOI region 102.

Figure 65:
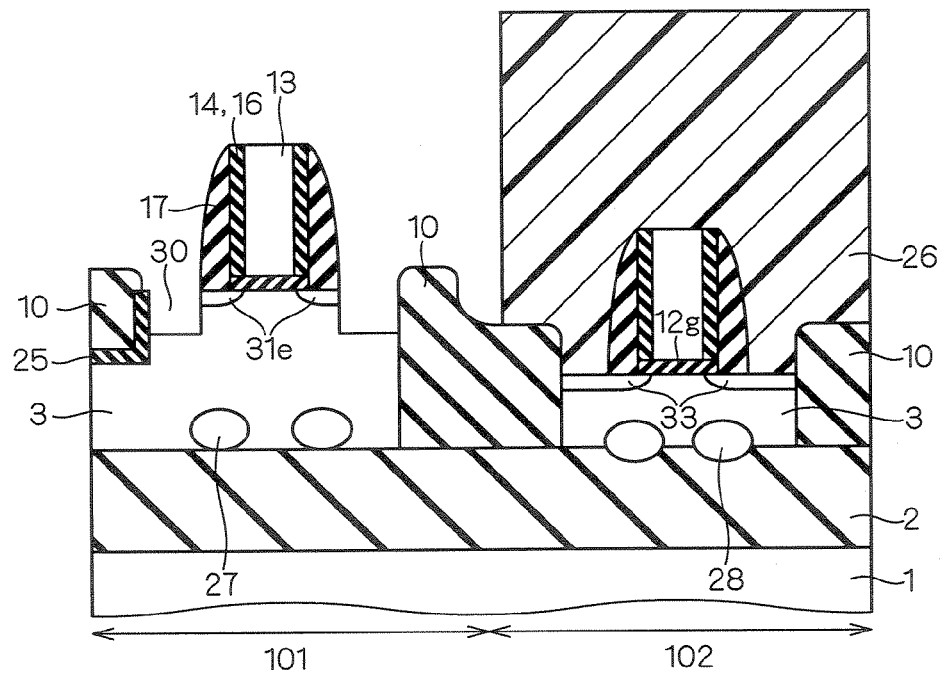

Then, as shown in FIG. 65, after silicon oxide film side walls 16 and silicon nitride film side walls 17 are formed in sequence on the sides of the silicon oxide film spacers 14, a resist film is applied on the entire surface, and a resist pattern 26 for etching, which covers the thin film SOI region 102, is obtained through photolithography. The silicon layer 3 in the thick film SOI region 101 is etched using this resist pattern 26 as well as the gate electrodes 13, the silicon oxide film spacers 14, the silicon oxide film side walls 16 and the silicon nitride film side walls 17 in the thick film SOI region 101 as a mask to form recesses 30 in upper layer parts of the silicon layer 3 in the thick film SOI region 101.

Figure 66:
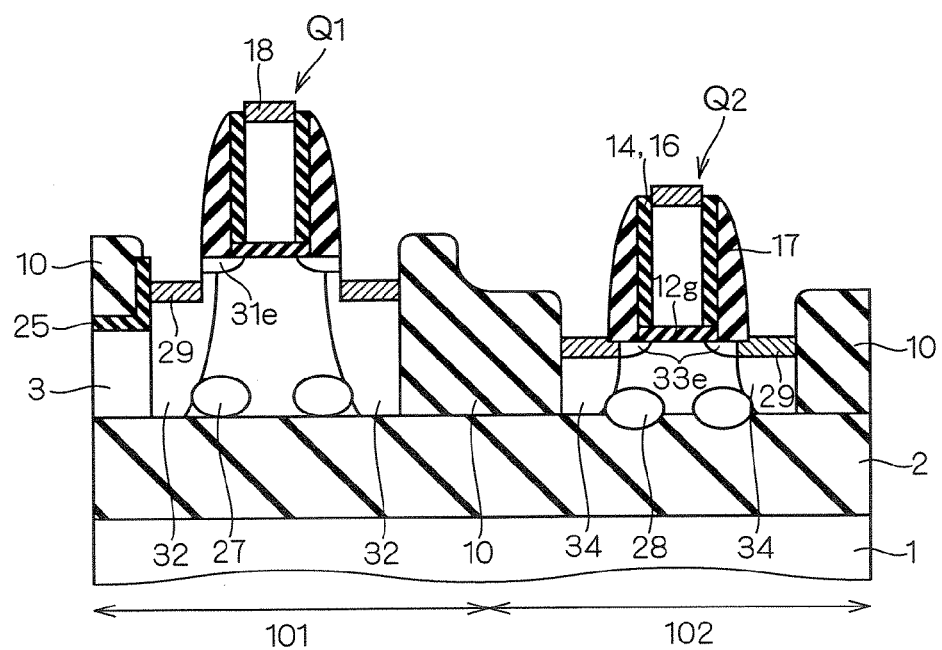

Subsequently, as shown in FIG. 66, after the removal of the resist pattern 26, impurity ions are injected using the gate electrodes 13, the silicon oxide film spacers 14, the silicon oxide film side walls 16 and the silicon nitride film side walls 17 as a mask to form source/drain regions 32 and 34 in the thick film SOI region 101 and the thin film SOI region 102. After that, metal silicide regions 18 and 29, for example of Co silicide, are formed on the gate electrodes 13 and the source/drain regions 38, respectively.

At this time, the source/drain regions 32 and 34 both penetrate through the silicon layer 3 to reach the surface of the buried oxide film 2 in the thick film SOI region 101 and the thin film SOI region 102. Furthermore, diffusion regions 31 and 33, mainly beneath the silicon nitride film side walls 17, become extension/pocket regions 31e and 33e.

In addition, in the structure according to the second embodiment, the source/drain regions 32 and 34 and low concentration regions 27 and 28 partially overlap on the interface between the buried oxide film 2 and the silicon layer 3.

As a result, in the same manner as in the first embodiment, a body thick film transistor Q1 is formed in the thick film SOI region 101, and a body thin film transistor Q2 is obtained in the thin film SOI region 102.

Figure 67:
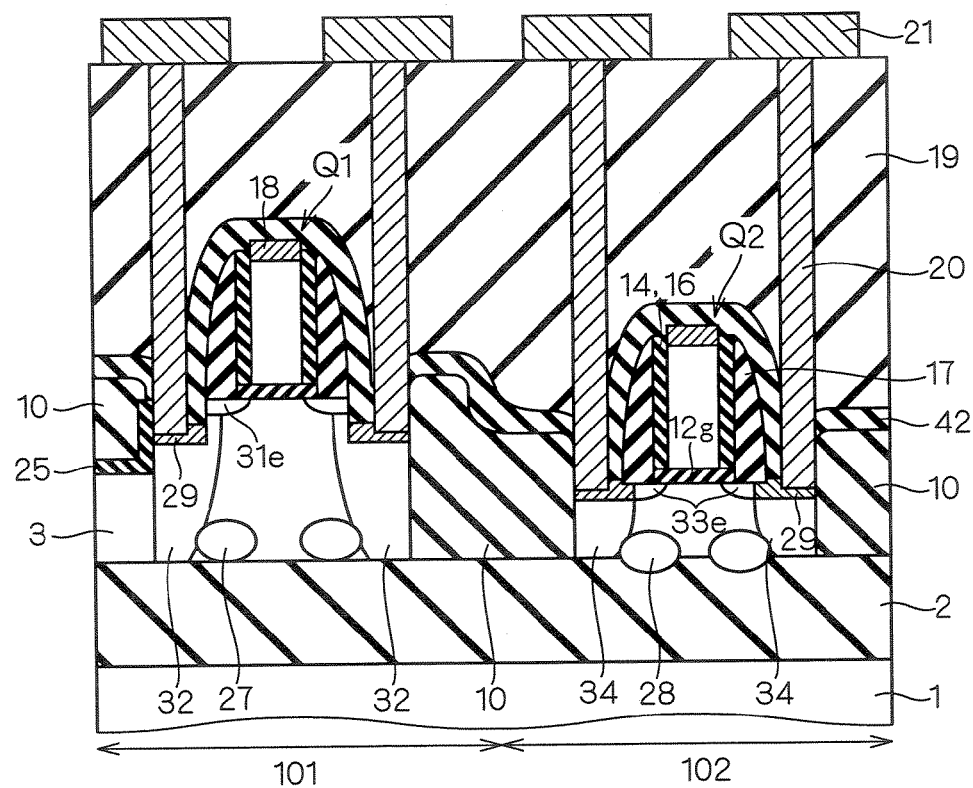

Finally, as shown in FIG. 67, a silicon nitride film 42 is formed on the entire surface, and an interlayer insulating film 19 is formed on the silicon nitride film 42, and after that, a CMP process is performed so that the interlayer insulating film 19 is flattened. In addition, a resist pattern for etching (not shown) is formed through photolithography, contact holes are formed using this resist pattern as a mask so that, the contact holes are filled in with a metal so that metal plugs 20 are formed. Furthermore, the metal plugs 20 are electrically connected to the interlayer insulating film 19 to form metal wires 21. Al, Cu and the like are considered as materials of the metal wires 21.

In accordance with the manufacturing method according to the first aspect of the second embodiment, MOS transistors are formed on a SOI substrate (Effects of Second Embodiment)

In the semiconductor device according to the second embodiment, a body thick film transistor Q1 and a body thin film transistor Q2 having a different body film thickness are formed on the same SOI substrate in the same manner as in the first embodiment. As a result, the same effects as in the first embodiment can be obtained.

Furthermore, in the semiconductor device according to the second embodiment, low concentration regions 27 and 28 of the conductivity type opposite to the conductivity type of the channel are provided in the vicinity of the interface between the source/drain regions 32 and 34 and the buried oxide film 2 so that the CD (channel dose) concentration becomes low, and thereby, a depletion layer can be extended in the low concentration regions 27 and 28, and thus, the parasitic capacitance can be further reduced as compared to the first embodiment.

(Effects of the First Aspect)

In addition, in accordance with the manufacturing method according to the first aspect, the impurity ions 24 are injected immediately after the formation of the silicon oxide film spacers 14 and before the formation of the silicon oxide film side walls 16 and the silicon nitride film side walls 17 so that the low concentration regions 27 and 28 are formed in the step shown in FIG. 64, and therefore, the low concentration regions 27 and 28 can be formed with high precision in terms of the locations by implanting the impurity ions 24 at an angle for implantation of, for example, 0°.

<Second Aspect>

Though in the first aspect the impurity ions 24 are injected immediately after the formation of the silicon oxide film spacers 14 in the step shown in FIG. 64, the impurity ions 24 may also be injected with an injection energy at an angle for injection (0° to 60°), making the formation of the low concentration regions 27 and 28 having the same impurity profiles as in the first aspect possible immediately after the formation of the silicon oxide film side walls 16, the silicon nitride film side walls 17 and the recesses 30 as shown in FIGS. 65 and 66.

(Effects of Second Aspect)

In addition, in accordance with the manufacturing method according to the second aspect, the impurity ions 24 are injected in the state shown in FIGS. 65 and 66, that is to say, after the formation of the silicon oxide film side walls 16, the silicon nitride film side walls 17 and the recesses 30, and therefore, effects of keeping the injection energy low due to the formation of the recesses 30 can be obtained.

<<Third Embodiment>>

Figure 68:
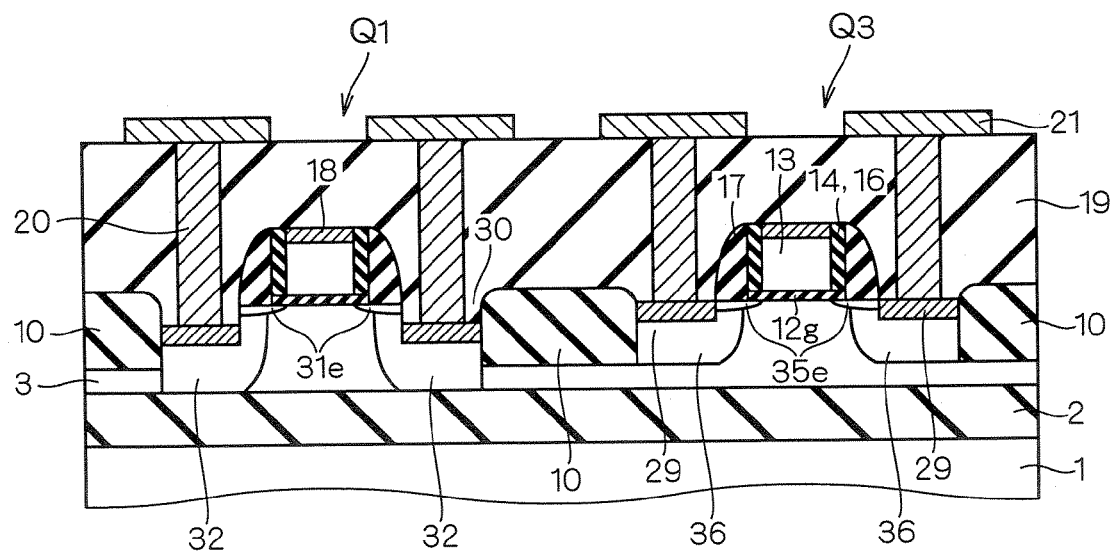
FIG. 68 is a cross sectional view showing the structure of a semiconductor device according to a third embodiment of the present invention.

FIG. 68 is a cross sectional view showing the structure of a semiconductor device according to the third embodiment of the present invention. As shown in this figure, body thick film transistors Q1 and Q3 are formed on an SOI substrate composed of a silicon support substrate 1, a buried oxide film 2 and a silicon layer 3.

In the body thick film transistor Q1 (first transistor), recesses 30 are provided to source/drain regions 32 as shown in the first and second embodiments, and the source/drain regions 32 penetrate through the silicon layer 3 to reach the buried oxide film 2.

On the other hand, the source/drain regions 36 of the body thick film transistor Q3 (second transistor) are formed in upper layer parts of the silicon layer 3 without having recesses 30 and without penetrating through the silicon layer 3. Here, in the same manner as in the body thick film transistor Q1, extension/pocket regions 33e are formed in the surface of the silicon layer 3 beneath silicon oxide film spacers 14.

In addition, element isolation, including the portion between the body thick film transistors Q1 and Q3, is provided to a partial isolation region composed of a silicon oxide film 10 and a silicon layer 3 (partial semiconductor region) which remains beneath the silicon oxide film 10. A complete isolation region, such as that between the body thick film transistor Q1 and the body thin film transistor Q2 according to the first embodiment, may be used instead of this partial isolation region. Here, the other parts of the configuration are the same as in the semiconductor device according to the first embodiment, and therefore, the same reference symbols as those for the semiconductor device according to the first embodiment are attached, and the descriptions thereof are appropriately omitted.

(Effects of Third Embodiment)

As described above, in the semiconductor device according to the third embodiment, a body thick film transistor Q1, where recesses 30 are provided in a silicon layer 3 and source/drain regions 32 are formed to penetrate through the silicon layer 3, and a body thick film transistor Q3, where no recesses 30 are provided and source/drain regions 34 are formed in the silicon layer 3 having the same SOI film thickness without penetrating through the silicon layer 3, are formed together in an SOI structure.

As described in the first embodiment, the SOI film is formed to be relatively thick in the body thick film transistors Q1 and Q3, and therefore, the body resistance and increase in the stability of the body potential can be reduced.

Furthermore, the body thick film transistor Q1 has a recess structure, and thereby, the SOI film of the source/drain regions 32 can be formed to have a thickness which is approximately as thin as the SOI film in the body thin film transistor Q2, achieving reduction in the parasitic capacitance, and thus, high speed processing becomes possible.

On the other hand, though the body thick film transistor Q3 is inferior to the body thick film transistor Q1 in its parasitic capacitance, the silicon layer 3 remains beneath the source/drain regions 36, and thus, effects of increasing stability in the body potential and increasing the withstand voltage for the operation can be obtained. In the following, the high withstand voltage of the body thick film transistor Q3 is described.

In general, MOS transistors formed on an SOI substrate, where the body potential is in a floating state or the body potential is fixed, have a high resistance, and therefore, the withstand voltage for the operation is low as, for example, 2 V. Even in the case where the SOI film of the body region is made relatively thick as in the body thick film transistor Q1 so that the body resistance is lowered, there is a limit to the increase in the withstand voltage.

In contrast to this, in the body thick film transistor Q3, even when holes are generated in the body region as a result of ionization through impact caused by the electrical field in the drain, the holes can be effectively extracted due to the existence of the region of the same conductivity type as the body region beneath the source/drain regions 36. In this manner, the body thick film transistor Q3 has a high withstand voltage.

Accordingly, circuits which operate at a low voltage are formed using the body thick film transistor Q1, and circuits which operate at a high voltage are formed using the body thick film transistor Q3, and thereby, a semiconductor integrated circuit, where circuits which operate at a high voltage and circuits which operate at a low voltage are mixed, can be provided with excellent operation characteristics.

It is necessary to mix various circuits in a system LSI. A high voltage analog circuit and a high withstand voltage I/O circuit for 3.3 V or the like can be cited as examples. In addition, it is also essential to mix a non-volatile memory, such as a flash memory, and thus, MOS transistors which withstand a voltage for operation of no lower than 5 V are required.

Accordingly, two types of body thick film transistors Q1 and Q3 are formed on the same SOI substrate as in the semiconductor device according to the third embodiment, and thereby, the requirements for various devices characteristics used in a variety of circuits can be met.

(Manufacturing Method)

Figure 69:
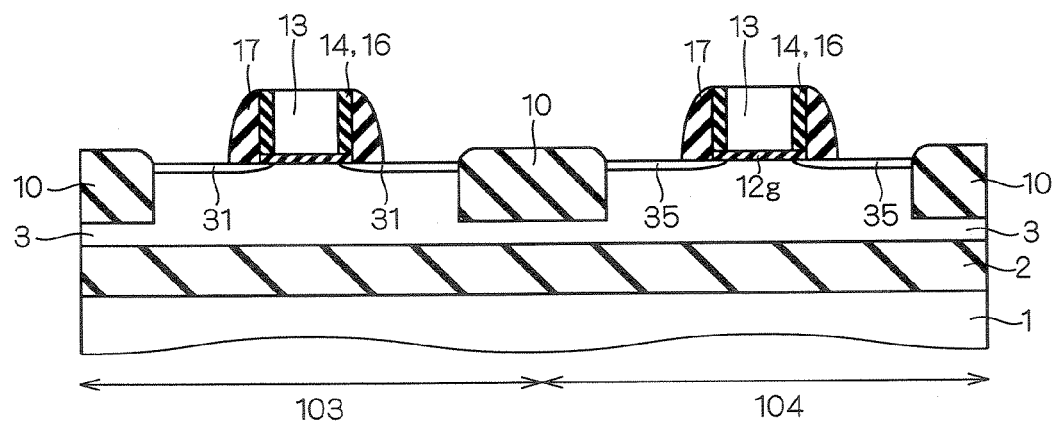
Figure 70:
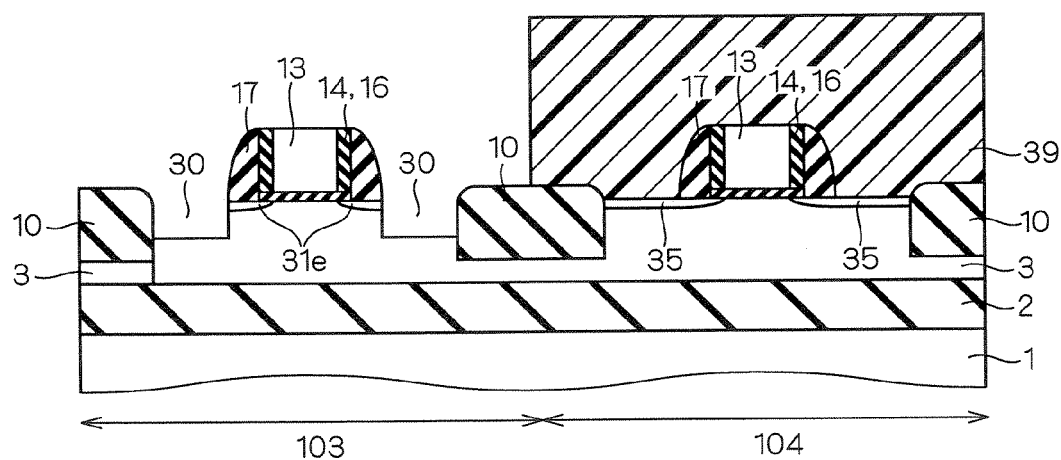

FIGS. 69 to 71 are cross sectional views showing a portion of a manufacturing method for a semiconductor device according to the third embodiment. In the following, the manufacturing method for a semiconductor device according to the third embodiment is described with reference to these figures.

First, as shown in FIG. 69, a Transistor (Tr) formation region with recesses 103 and a Tr formation region without recesses 104 which are separated by a partial isolation region (silicon oxide film 10+silicon layer 3 beneath silicon oxide film 10) in a silicon layer 3 are provided on an SOI substrate composed of a silicon support substrate 1, a buried oxide film 2 and the silicon layer 3, and in each of these regions, a gate oxide film 12g and a gate electrode 13 are formed on the silicon layer 3, and silicon oxide film spacers 14 are formed on the sides of the gate electrode 13, and after that, impurity ions are injected using the gate electrode 13 and the silicon oxide film spacers 14 as a mask, and a diffusion process is performed, and thereby, diffusion regions 31 and 35 are formed in the Tr formation region with recesses 103 and the Tr formation region without recesses 104. After that, the silicon oxide film side walls 16 and the silicon nitride film side walls 17 are formed in sequence on the sides of the silicon oxide film spacers 14.

Then, as shown in FIG. 70, after a resist pattern 39 is formed to cover the Tr formation region without recesses 104, an etching process is performed in accordance with a plasma dry etching method using the resist pattern 39 as well as the gate electrode 13, the silicon oxide film spacers 14, the silicon oxide film side walls 16 and the silicon nitride film side walls 17 in the Tr formation region with recesses 103 as a mask, so that upper layer parts of the silicon layer 3, including the diffusion regions 31, are removed to form recesses 30 in the Tr formation region with recesses 103. In the case where the film thickness of the silicon layer 3 is 100 nm, for example, 30 nm is removed in accordance with the etching process so that the thickness of the SOI thin film is reduced to 70 nm.

After that, as shown in FIG. 71, after, in both the Tr formation region with recesses 103 and the Tr formation region without recesses 104, the resist pattern is removed, impurity ions are implanted using the gate electrodes 13, the silicon oxide film spacers 14, the silicon oxide film side walls 16 and the silicon nitride film side walls 17 as a mask, and a diffusion process is performed, to form source/drain regions 32 which penetrate through the silicon layer 3 in the Tr formation region with recesses 103, and at the same time, source/drain regions 36 which do not penetrate through the silicon layer 3 are formed in the Tr formation region without recesses 104.

In the following, metal silicide regions 18 and 39 are formed, an interlayer insulating film 19 is formed, and metal plugs 20 and metal wires 21 are formed in the same manner as in the semiconductor device according to the first embodiment, and thereby, the structure shown in FIG. 68 can be obtained.

<<Fourth Embodiment>>

(First Aspect)

FIG. 72 is a cross sectional view showing the structure of the first aspect of a semiconductor device according to the fourth embodiment of the present invention. As shown in this figure, a body thick film transistor Q1 is formed on a SOI substrate composed of a silicon support substrate 1, a buried oxide film 2 and a silicon layer 3.

Here, the entire surface including the body thick film transistor Q1 is not covered with an interlayer insulating film 19, unlike the first embodiment shown in FIG. 20, and a silicon oxide film 51, which is a thin film (1 nm to 200 nm), is formed on the entire surface including recesses 30, and a silicon nitride film 52, which is a thin film (1 nm to 100 nm), is formed on the silicon oxide film 51. Here, in FIG. 72, element isolation is provided in a partial isolation region composed of a silicon oxide film 10 and the silicon layer 3 which remains beneath the silicon oxide film 10. A complete isolation region as that between the body thick film transistor Q1 and the body thin film transistor Q2 according to the first embodiment may be used instead of this partial isolation region.

In the semiconductor device according to the fourth embodiment having the structure, the source/drain regions have a recess structure in the same manner as the body thick film transistor Q1 according to the first embodiment, and therefore, are formed with a film thinner than the SOI film in the body region, and therefore, the operation characteristics can be improved together with reduction in the resistance of the parasitic capacitance.

In addition, in the semiconductor device according to the fourth embodiment, the silicon nitride film 52 formed in the recesses 30 is located at approximately the same level as the surface of the channel, which is the surface of the silicon layer 3 (body region) formed directly beneath the gate oxide film 12g of the body thick film transistor Q1, and therefore, stress can be applied directly on the surface of the channel from the sides, due to the silicon nitride film 52, and therefore, effects increase in carrier mobility can be produced. In the following, this point is described in detail.

The silicon nitride film 52 has internal stress, and in the case where a silicon nitride film is formed on a MOS transistor having a conventional structure where recesses 30 are not formed, the silicon nitride film 52 is formed in a location higher than the surface of the channel, and therefore, stress which can be provided to the surface of the channel through the silicon nitride film 52 is slight. However, as in the fourth embodiment, the silicon nitride film 52 is formed in the recesses 30, of which the level is lower than the surface of the silicon support substrate 1, and thereby, can be formed at approximately the same level as the surface of the channel, and thus, stress can be applied effectively to the surface of the channel through the silicon nitride film 52 in comparison with the conventional structure.

Here, in the example shown in FIG. 72, the silicon oxide film 51 is formed beneath the silicon nitride film 52, and thereby, damage to the silicon layer 3 due to stress through the silicon nitride film 52 can be reduced, and a leak current can be suppressed.

In addition, effects can be obtained through the formation of the silicon oxide film 51, such that reduction in the reliability against hot carriers due to diffusion of hydrogen or the like included in the silicon nitride film 52 to the body thick film transistor Q1 can be prevented.

On the other hand, the silicon nitride film 52 can be formed directly on the surface without the formation of the silicon oxide film 51 in the structure. In this case, effects are obtained, such that greater stress can be provided to the surface of the channel than in the case where the silicon oxide film 51 is provided.

Here, there are compression type and expansion type silicon nitride films, and an expansion type silicon nitride film is used in NMOS transistors and a compression type silicon nitride film is used in PMOS transistors, and thereby, effects are obtained, such that the carrier mobility increases, and the current for driving increases, respectively. Here, stress through the silicon nitride film varies depending on the conditions for forming the nitride film where the hydrogen content, the pressure of a SiH$_4$ gas and the like are parameters. Here, stress through a silicon nitride film and effects of stress on the transistor characteristics are disclosed in, for example, the document "Shinya Ito et al., IEDM Tech. Dig., pp. 247-250 (2000), 'Mechanical Stress Effect of Etch-Stop Nitride and its Impact on Deep Submicron Transistor Design'."

As described above, in the first aspect of the fourth embodiment, a silicon nitride film 52 is formed in recesses 30 on an SOI substrate, and thereby, the operation characteristics of the body thick film transistor Q1 can be improved.

(Second Aspect)

Figure 73:
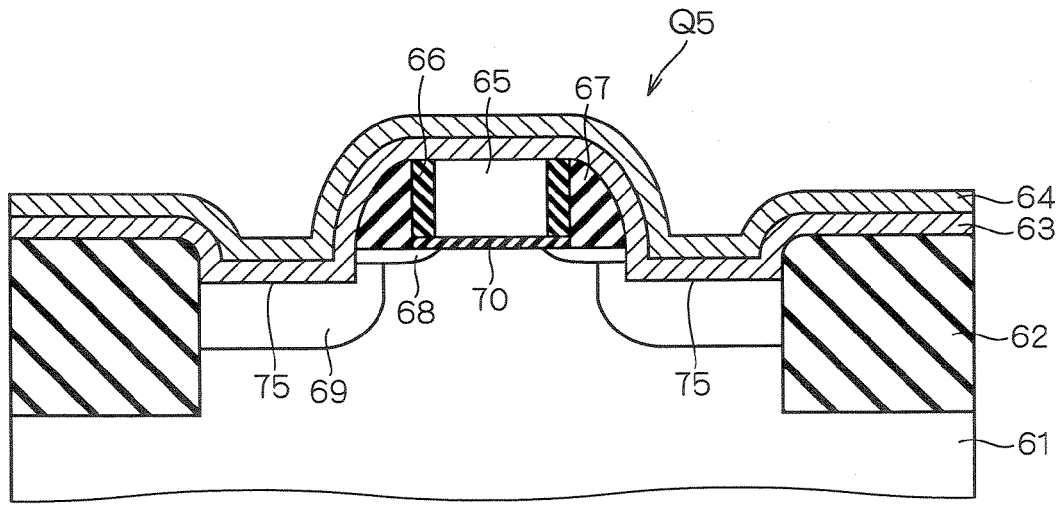
FIG. 73 is a cross sectional view showing the structure of the second aspect of a semiconductor device according to the fourth embodiment.

FIG. 73 is a cross sectional view showing the structure of a second aspect of the semiconductor device according to the fourth embodiment of the present invention. As shown in this figure, a recess type transistor Q5 is provided in an element formation region, which is isolated by an isolation insulating film 62 from the rest of a semiconductor substrate 61, having a single structure, which is a bulk Si substrate.

A gate electrode 65 is provided on the surface of the semiconductor substrate 61 with a gate oxide film 70 intervening, spacers 66 are provided on the sides of the gate electrode 65, side walls 67 are provided on the sides of the spacers 66, recesses 78 are provided in upper portions of the semiconductor substrate 61 between the side walls 67 and the silicon oxide film 10, extension/pocket regions 68 are provided in the surface of the semiconductor substrate 61 beneath the spacers 66 and the side walls 67, and source/drain regions 69 are provided in portions beneath the recesses 78 and portions of the extension/pocket regions 68.

The recess type transistor Q5 is different from the body thick film transistor Q1 according to the first aspect in that the recess type transistor Q5 is formed on a bulk substrate instead of an SOI substrate. In this recess type transistor Q5 according to the second aspect, the operation characteristics of the recess type transistor Q5 can be improved for the same reason as in the first aspect.

(Third Aspect)

Figure 74:
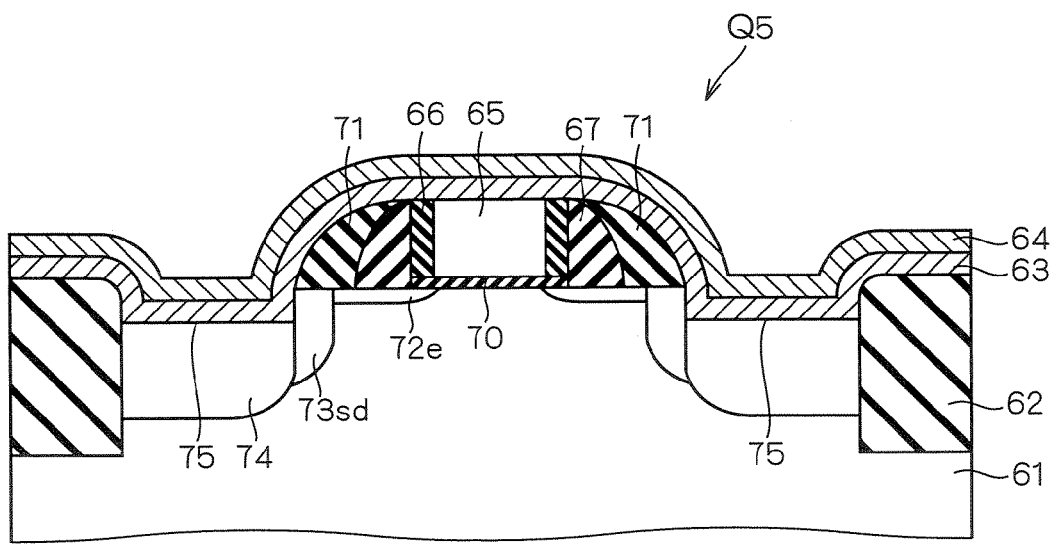
FIG. 74 is a cross sectional view showing the structure of the third aspect of a semiconductor device according to the fourth embodiment.

FIG. 74 is a cross sectional view showing the structure of a third aspect of the semiconductor device according to the fourth embodiment of the present invention. As shown in this figure, this differs greatly from the second aspect in that second spacers 71 are further provided on the sides of the side walls 67.

In this manner, the second side wall portions made of the second spacers 71 are further provided in addition to the first side wall portions made of the spacers 66 and the side walls 67 in the third aspect. Furthermore, the source/drain regions 74 are characterized by having recesses 75 in regions outside the portions beneath the second spacers 71 relative to the body region beneath the gate electrode 65.

(Manufacturing Method)

FIGS. 75 to 80 are cross sectional views showing the manufacturing method for a semiconductor device according to the third aspect of the fourth embodiment. In the following, the manufacturing method for the structure of the third aspect is described with reference to these figures.

First, as shown in FIG. 75, after isolation insulating films 62 are selectively formed in upper layer parts of a semiconductor substrate 61 to provide element formation regions, a gate oxide film 70 is formed on the surface of the semiconductor substrate 61 between the isolation insulating films 62 and 62, and then, a gate electrode 65 is formed on the gate oxide film 70, spacers 66 are formed on the sides of the gate electrode 65 and impurity ions are injected using the gate electrode 65 and the spacers 66 as a mask and diffuse, and thereby, after the formation of diffusion regions 72 in the surface of the semiconductor substrate 61, side walls 67 are formed on the sides of the spacers 66.

Then, as shown in FIG. 76, impurity ions 15 are injected using the gate electrode 65, the spacers 66 and the side walls 67 as a mask and diffuse, and thereby, diffusion regions 73 are formed. At this time, diffusion regions 72 mainly beneath the spacers 66 and the side walls 67 become extension/pocket regions 72*e*.

Figure 77:
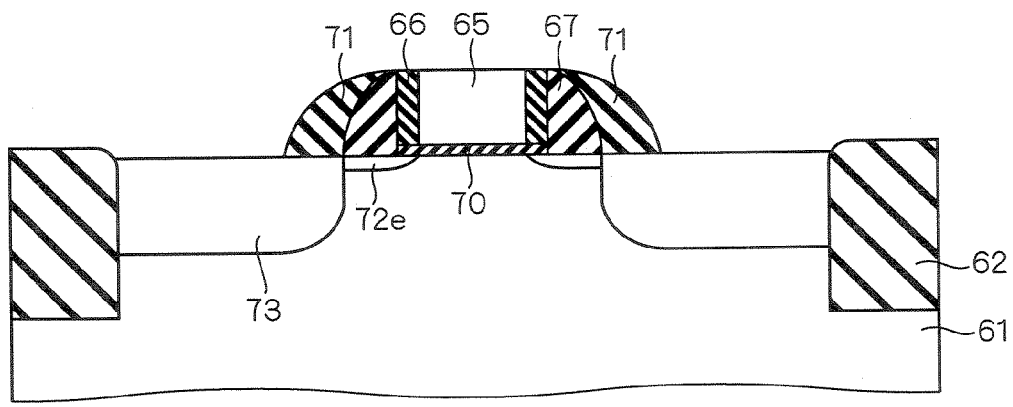

After that, as shown in FIG. 77, second spacers 71 are additionally formed on the sides of the side walls 67. The second spacers 71 can be formed in the following manner, for example. After a silicon oxide film having a film thickness of 20 nm is deposited on the entire surface in accordance with an LPCVD method, the silicon oxide film is etched back in accordance with a dry etching method, and thus, second spacers 71 are formed. Here, the second spacers 71 may be made of a silicon nitride film or a composite film of a silicon oxide film and a silicon nitride film instead of a silicon oxide film.

Figure 78:
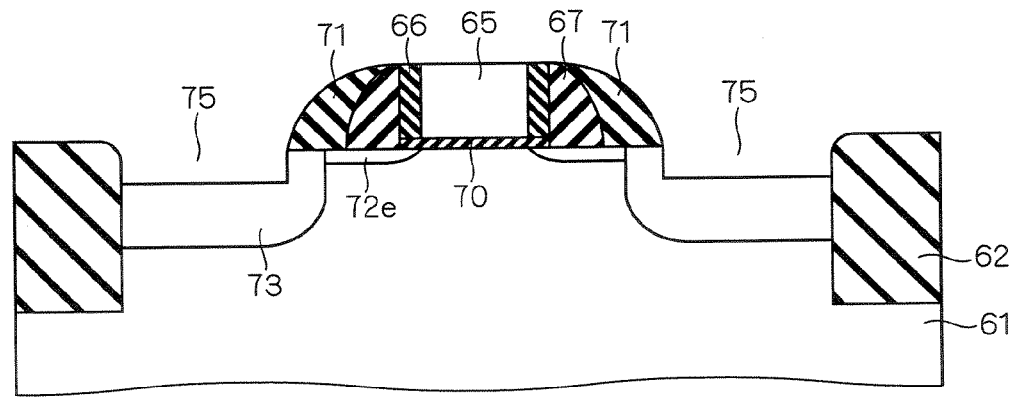

Subsequently, as shown in FIG. 78, the diffusion regions 73 are etched from the surface using the gate electrode 65, the spacers 66, the side walls 67 and the second spacers 71 as a mask and to form recesses 75 in upper portions of the diffusion regions 73.

Figure 79:
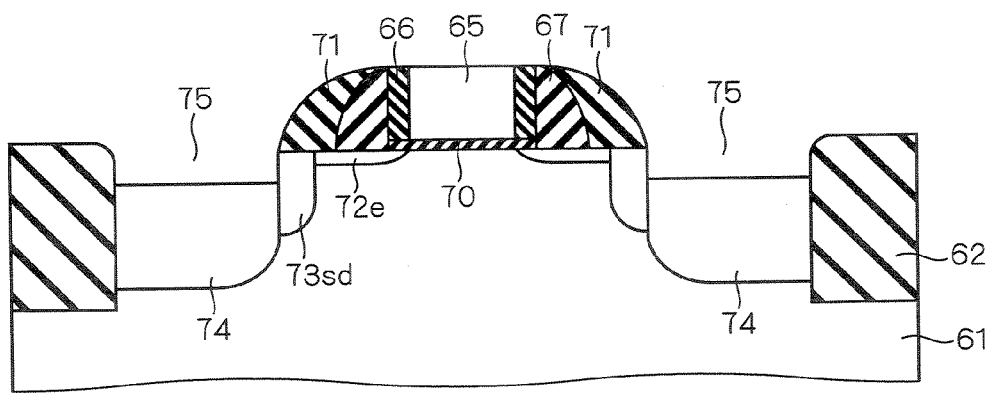

Furthermore, as shown in FIG. 79, impurity ions are injected using the gate electrode 65, the spacers 66, the side walls 67 and the second spacers 71 as a mask and diffuse, and thereby, source/drain regions 74 are formed beneath the recesses 75. At this time, the diffusion regions 73 mainly beneath the second spacers 71 become partial source/drain regions 73*sd*. Here, the amount of dosage of the injected impurity ions at the time of formation of the source/drain regions 74 is greater than at the time of formation of the diffusion regions 73, and the depth of the peak in the impurity concentration is deeper.

Figure 80:
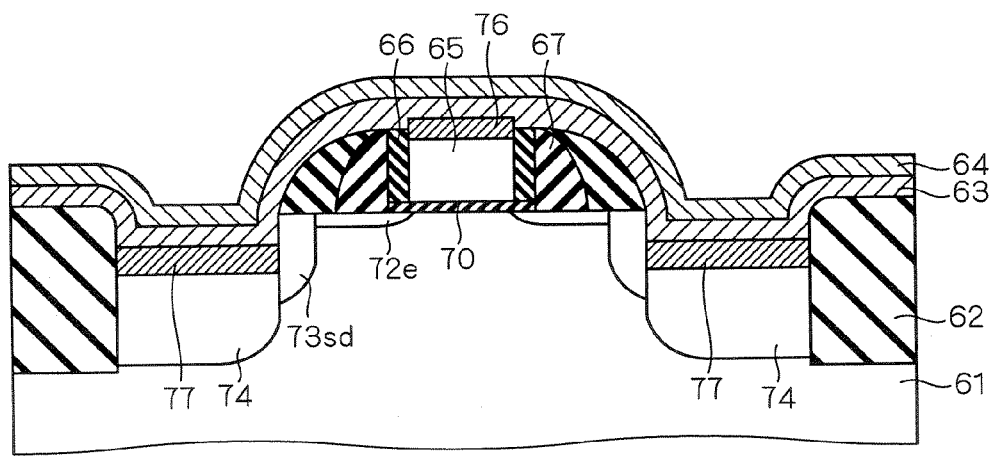

Finally, as shown in FIG. 80, a silicide region 76 is formed on the surface of the gate electrode 65 and silicide regions 77 are formed on the surface of the source/drain regions 74, a silicon oxide film 63 is formed on the entire surface and a silicon nitride film 64 is formed on the silicon oxide film 63, and thereby, a semiconductor device of the third aspect is completed.

Thus, the distance between the source/drain regions 74 and 74 formed deep beneath the recesses 75 becomes long due to the provision of the second spacers 71 in the semiconductor device of the third aspect, which therefore has effects such that reduction in the threshold voltage due to short channel effects resulting from the formation of the source/drain regions 74 extending to a portion beneath the gate electrode 65 can be effectively prevented.

Here, the structure of the third aspect, where second spacers 71 are provided, can be used in the first aspect shown in FIG. 72 (Forth Aspect). Furthermore, this structure can be used in the first to third embodiments, and also in the in the below described fifth embodiment. Here, the body thin film transistor Q2 and the body thick film transistor Q3, which do not have recesses, do not require second spacers, and therefore, it is not necessary to forme second spacers. Here, it is possible to provide second spacers to the body thin film transistor Q2 or the body thick film transistor Q3, as long there is no problem of a driving current being generated and the manufacturing process does not become complicated.

<<Fifth Embodiment>>
(Manufacturing Method)

FIGS. 81 to 94 are cross sectional views showing a portion of a manufacturing method for a semiconductor device according to the fifth embodiment of the present invention. In the following, the manufacturing method for a semiconductor device according to the fifth embodiment is described with reference to these figures.

Figure 81:
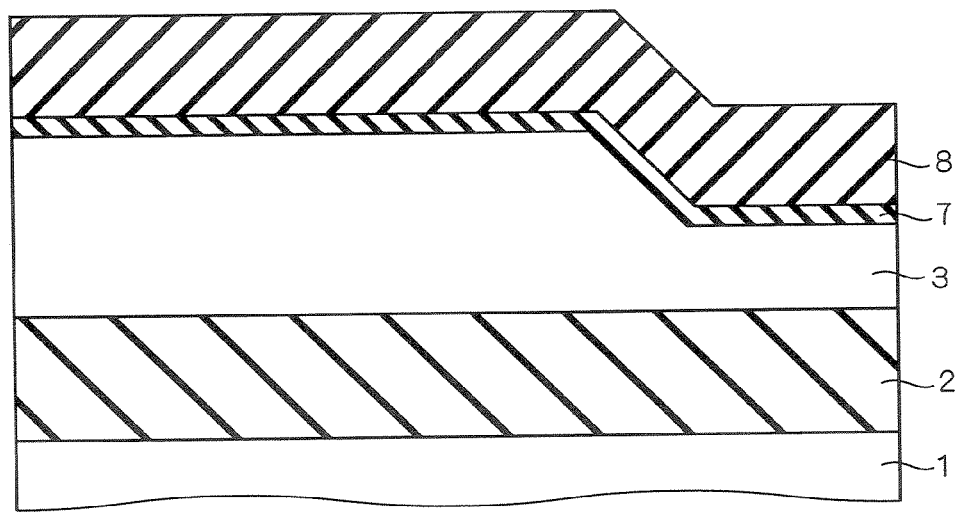
FIGS. 81 to 94 are cross sectional views showing a manufacturing method for a semiconductor device according to a fifth embodiment.

First, the structure shown in FIG. 81 is obtained in the same manner as that in the first aspect of the manufacturing method according to the first embodiment shown in FIGS. 1 to 6.

Figure 82:
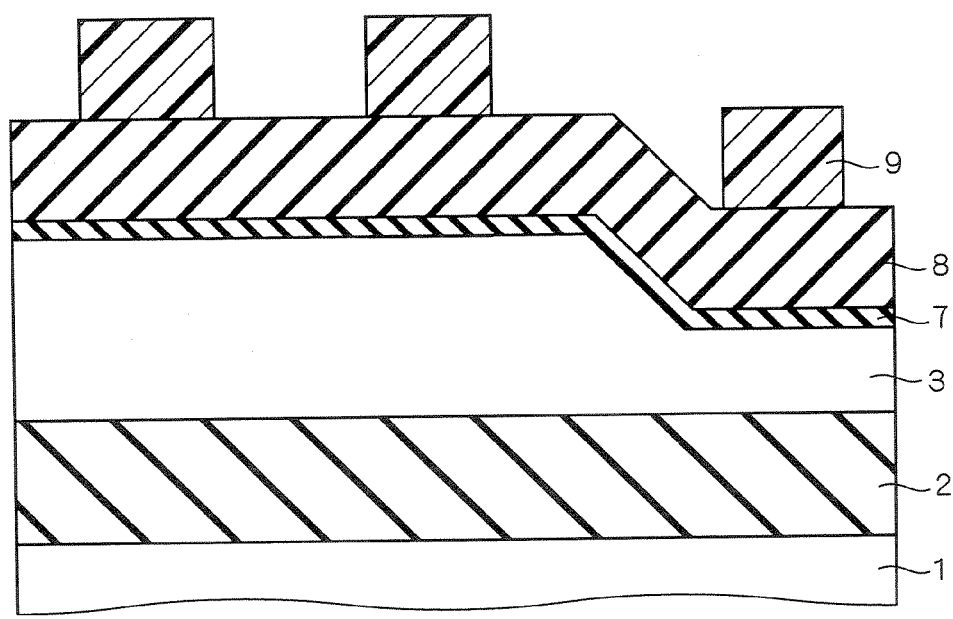

Next, as shown in FIG. 82, a resist film is applied on the entire surface and a resist pattern 9 for the formation of trenches (pattern for element isolation) is formed through photolithography.

Figure 83:
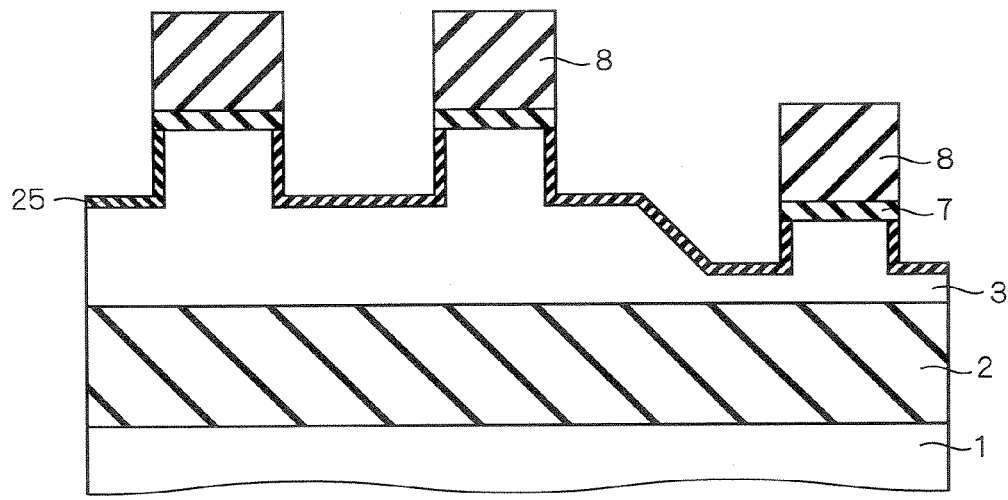

After that, as shown in FIG. 83, after a silicon nitride film 8, a silicon oxide film 7 and a silicon layer 3 are etched using the resist pattern 9 as a mask and to form trenches, the resist pattern 9 is removed. This etching process is performed in such a manner that the silicon layer 3 partially remains. Furthermore, the inner walls of the trenches in the silicon layer 3 are oxidized to form inner wall oxide films 25 having a film thickness of 5 nm to 50 nm on the exposed surface of the silicon layer 3. Here, the process for forming inner wall oxide films 25 may be omitted.

Figure 84:
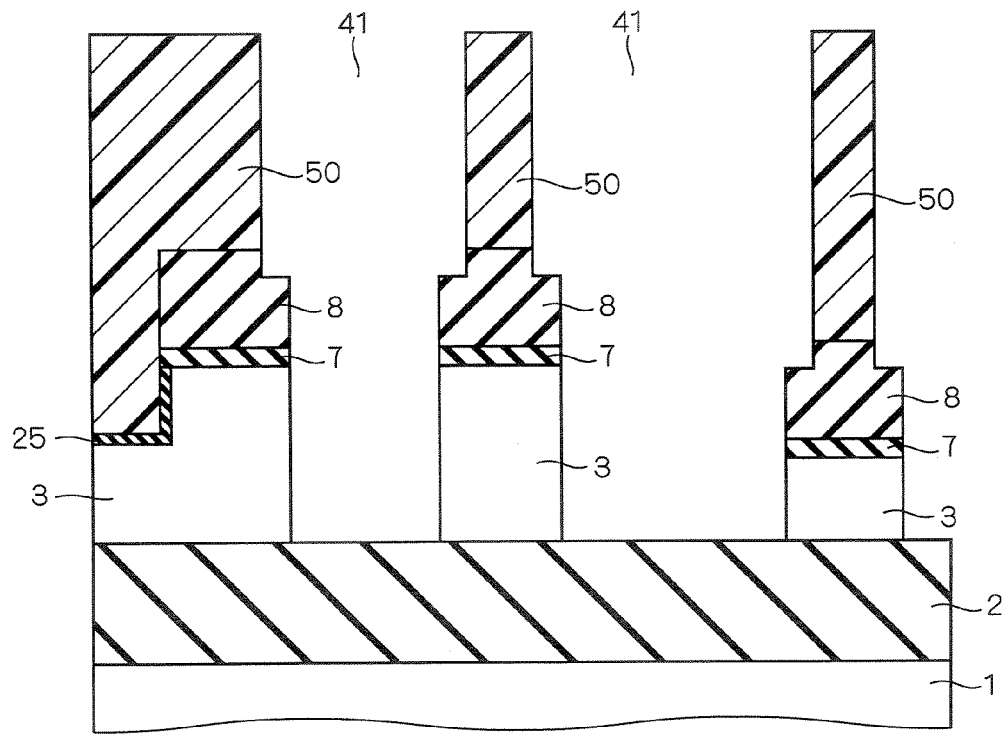

Subsequently, as shown in FIG. 84, a resist film is applied on the entire surface and a resist pattern 50 for forming trenches is formed through photolithography, and then, the inner wall oxide films 25 and the silicon layer 3 are etched using this resist pattern 50 and the silicon nitride film 8 as a mask to form trenches. At this time, the entirety of the silicon layer 3 is removed, and openings 41 from which the surface of a buried oxide film 2 is exposed are obtained.

Figure 85:
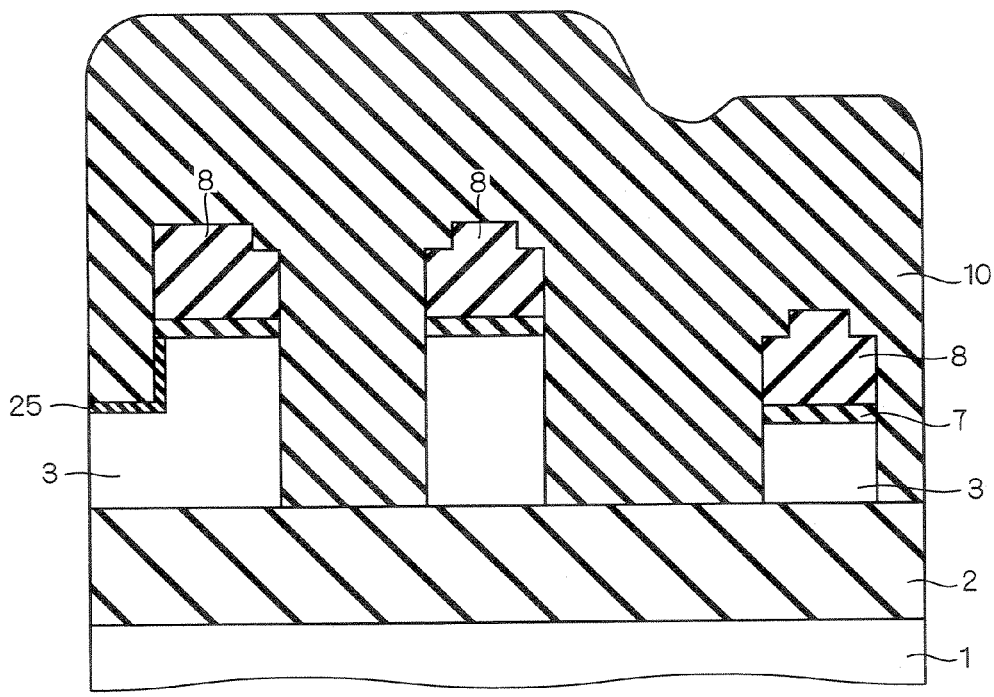

Then, as shown in FIG. 85, the resist pattern 50 is removed, and after that, a silicon oxide film 10 having a film thickness of 15 nm to 1000 nm is formed, and then, an annealing process at 500° C. to 1300° C. is performed. Here, this annealing process may be omitted.

Figure 86:
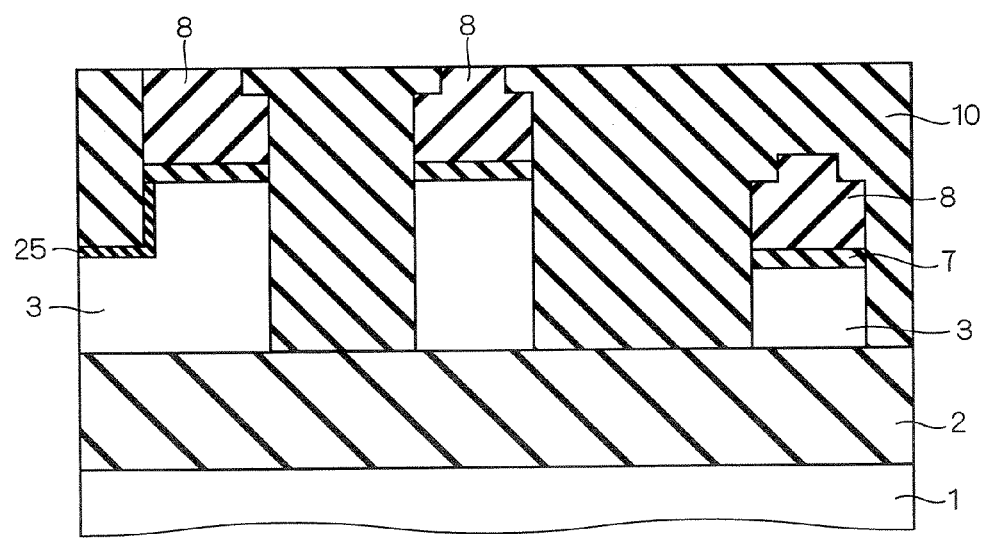

Next, as shown in FIG. 86, a CMP process is performed using the silicon nitride film 8 as a stopper to flatten the silicon oxide film 10. Accordingly, the silicon oxide film 10 is flattened to the level of the top of the silicon nitride film 8 in a thick film SOI region 101 or to such a level that the silicon nitride film 8 is slightly polished from the top.

Figure 87:
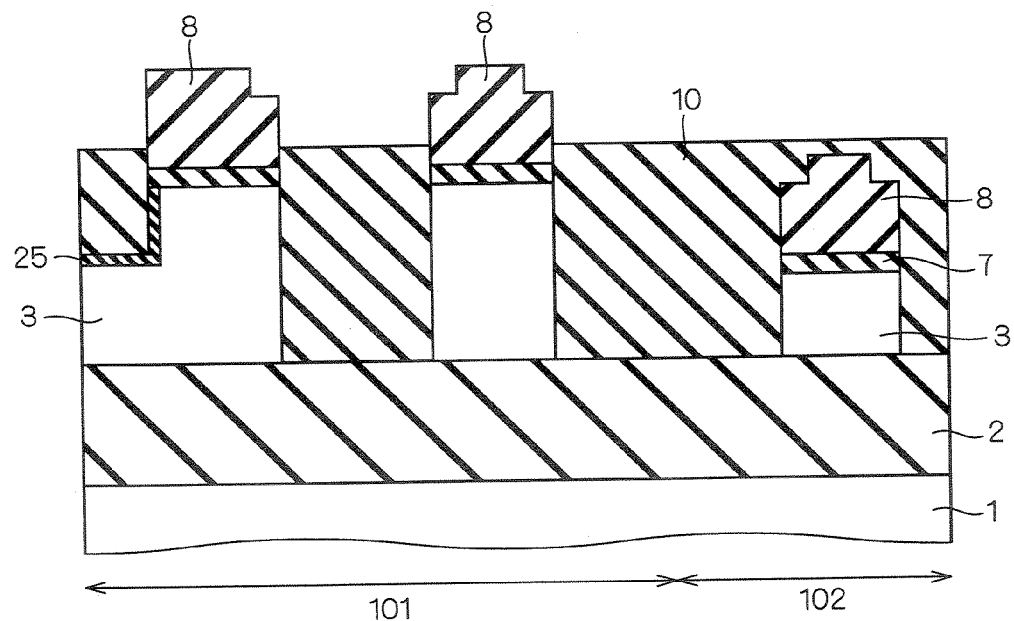

Subsequently, as shown in FIG. 87, the silicon oxide film 10 is etched to set the silicon oxide film 10 in the thick film SOI region 101 to a predetermined film thickness.

Figure 88:
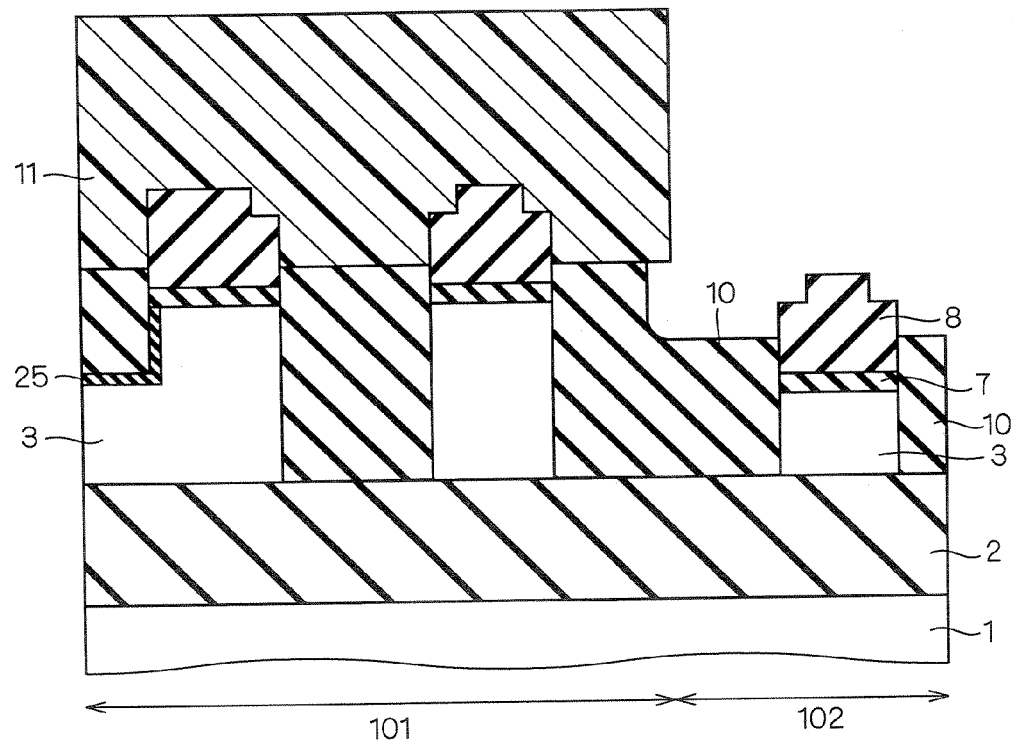

After that, as shown in FIG. 88, a resist film is applied on the entire surface and a resist pattern 11 for the formation of trenches which covers the thick film SOI region 101 is obtained through photolithography, and after that, the resist pattern 11 is used as a mask and etching is performed to set the isolation oxide film of the silicon oxide film 10 in the thin film SOI region 102 to a desired film thickness.

Figure 89:
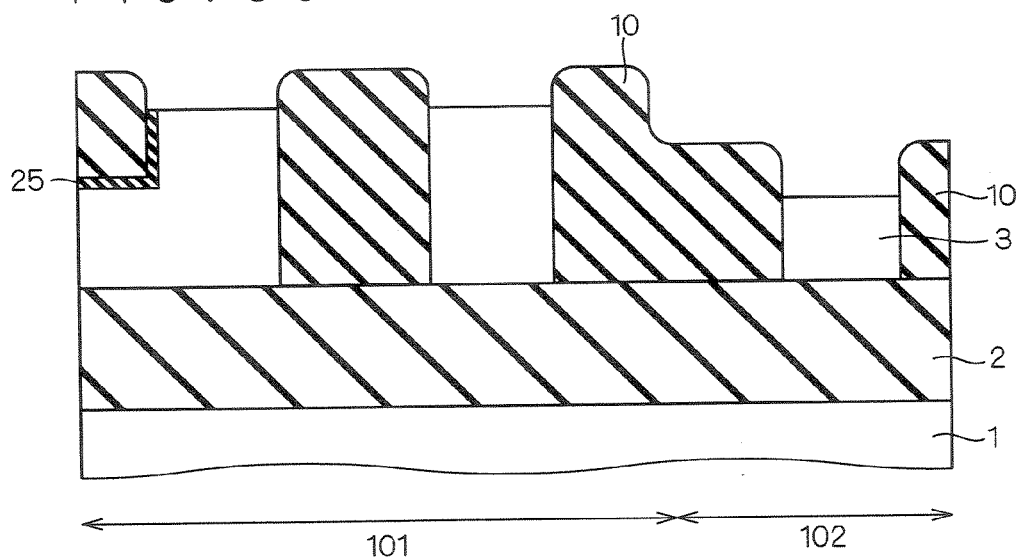

After that, as shown in FIG. 89, the resist pattern 11 is removed, and furthermore, the silicon nitride film 8 and the silicon oxide film 7 are removed.

Figure 90:
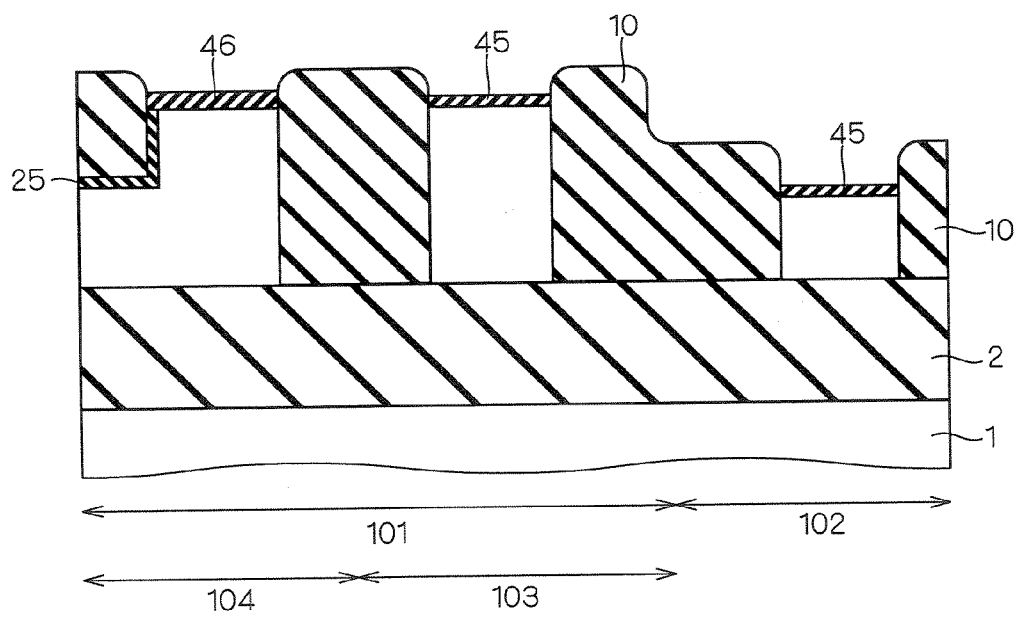

Next, as shown in FIG. 90, silicon oxide films 45 which are relatively thin films are formed on the exposed surface of the silicon layer 3 between the silicon oxide films 10 and 10 in the thin film SOI region 102 and a Tr formation region with recesses 103 in the thick film SOI region 101, and a silicon oxide film 46 which is a relatively thick film is formed on the exposed surface of the silicon layer 3 between the silicon oxide films 10 and 10 in a Tr formation region without recesses 104 in the thick film SOI region 101.

Figure 91:
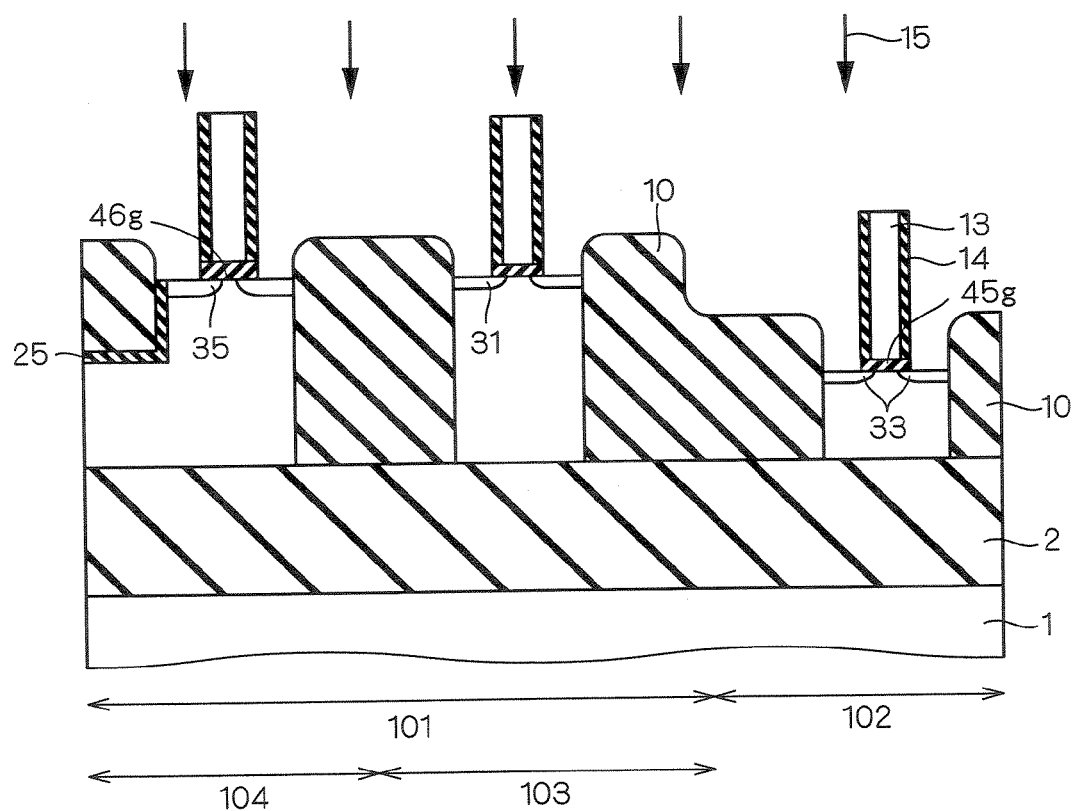

After that, as shown in FIG. 91, a polysilicon film is formed and patterned through photolithography, and thereby, gate electrodes 13 are respectively formed in the thin film SOI region 102, the Tr formation region with recesses 103 and the Tr formation region without recesses 104. At this time, the remaining silicon oxide films 45 and 46 become a thin film gate oxide film 45g and a thick film gate oxide film 46g. Then, silicon oxide film spacers 14 are formed on the sides of the respective gate electrodes 13, and after that, impurity ions 15 are injected into the silicon layer 3 using the gate electrodes 13 and the silicon oxide film spacers 14 as a mask to form diffusion regions 31, 33 and 35 which later become extension & pocket regions in the Tr formation region with recesses 103, the thin film SOI region 102 and the Tr formation region without recesses 104.

Figure 92:
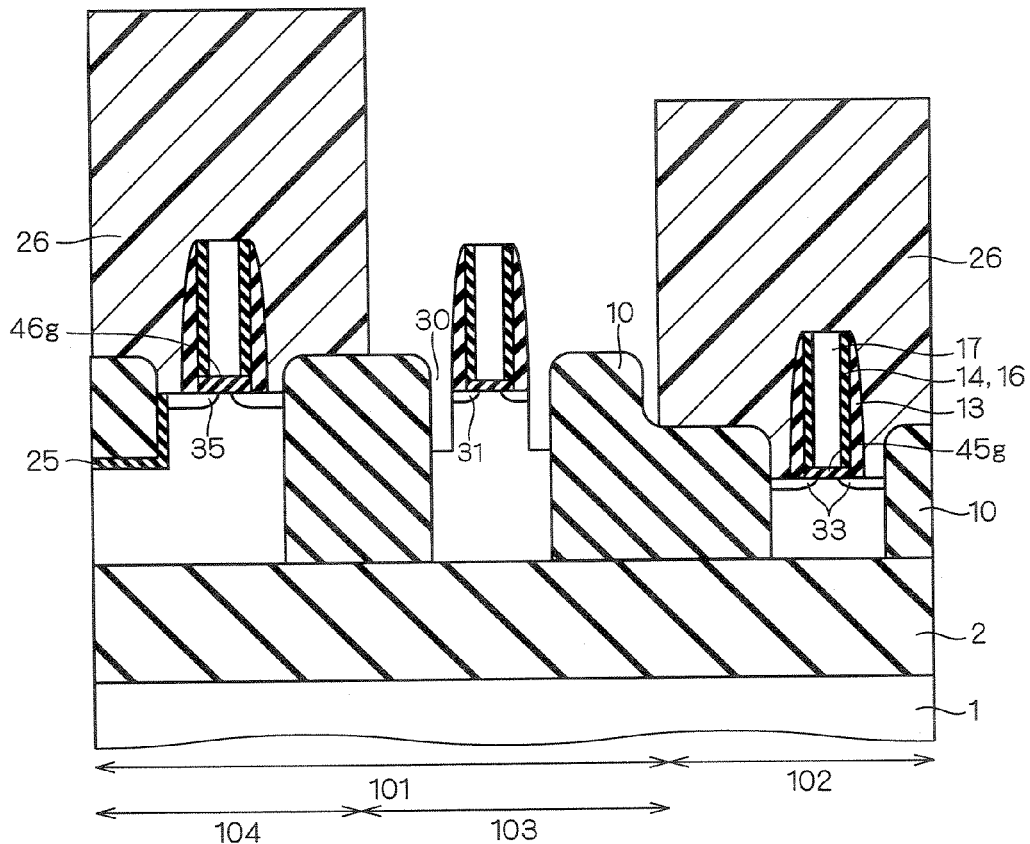

Then, as shown in FIG. 92, silicon oxide film side walls 16 and silicon nitride film side walls 17 are formed in sequence on the sides of the silicon oxide film spacers 14, and after that, a resist film is applied on the entire surface to obtain a resist pattern 26 for etching which covers the thin film SOI region 102 and the Tr formation region without recesses 104 through photolithography. The silicon layer 3 in the Tr formation region with recesses 103 is etched using this resist pattern 26, as well as the gate electrode 13 in the Tr formation region without recesses 103, the silicon oxide film spacers 14, the silicon oxide film side walls 16 and the silicon nitride film side walls 17 as a mask to form recesses 30 in upper layer parts of the silicon layer 3 in the Tr formation region with recesses 103. Here, in FIG. 92, a structure where a silicon oxide film spacer 14 and a silicon oxide film side wall 16 are put together is shown as a single region for the sake of convenience.

Figure 93:
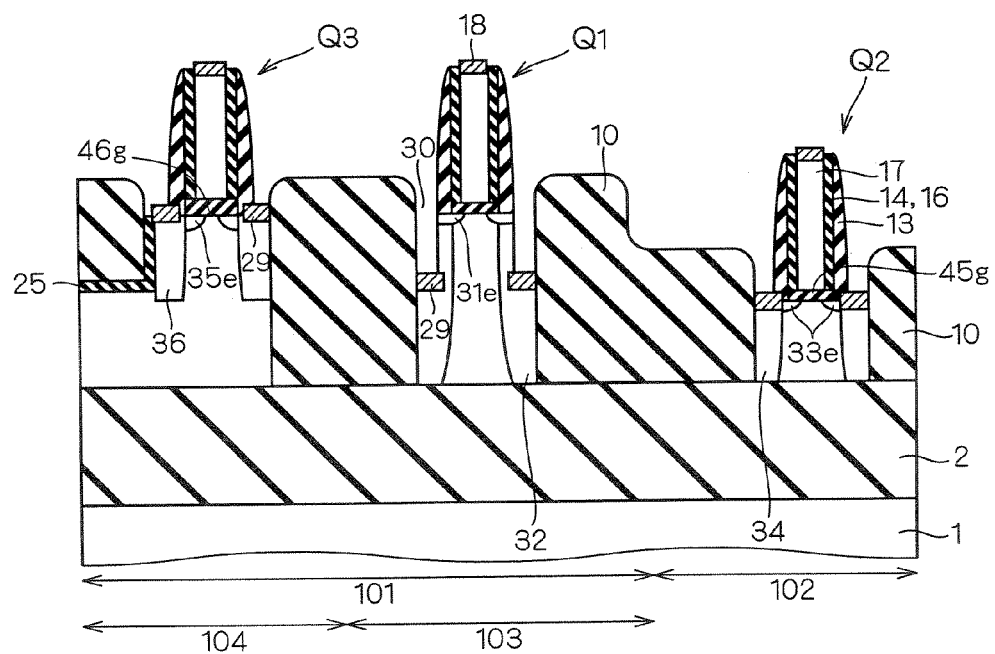

Subsequently, as shown in FIG. 93, after the removal of the resist pattern 26, impurity ions are injected into respective regions: the thin film SOI region 102, the Tr formation region with recesses 103 and the Tr formation region without recesses 104 using the gate electrodes 13, the silicon oxide film spacers 14, the silicon oxide film side walls 16 and the silicon nitride film side walls 17 as a mask and diffuse, and thereby, source/drain regions 32, 34 and 36 are formed. After that, metal silicide regions 18 and 29, for example of Co silicide, are formed on the gate electrodes 13 and the source/drain regions 38, respectively.

At this time, the source/drain regions 32 and 34 both penetrate through the silicon layer 3 and reach the surface of the buried oxide film 2, while the source/drain regions 36 are formed in upper layer parts of the silicon layer 3 without penetrating through the silicon layer 3. Here, the source/drain regions 32, 34 and 36 are formed by injecting impurity ions with the same injection energy. In terms of the injection energy, an injection energy with which the source/drain regions 32 and 34 penetrate through the silicon layer 3 to reach the buried oxide film 2 and the source/drain regions 36 do not penetrate through the silicon layer is used.

Furthermore, diffusion regions 31 and 33 mainly beneath the silicon nitride film side walls 17 become extension/pocket regions 31e and 33e, and diffusion regions 35 mainly beneath the silicon nitride film side walls 17 become extensions 35e.

As a result of this, a body thick film transistor Q1 (first transistor) having a structure where the SOI film thickness (film thickness of silicon layer 3) is great and the SOI film thickness in the source/drain regions 32 is small is formed in the Tr formation region with recesses 103 in the thick film SOI region 101, a body thin film transistor Q2 (second transistor) having a structure where the SOI film thickness is small throughout the entirety is formed in the thin film SOI region 102, and a body thick film transistor Q3 (third transistor) having a structure where the SOI film thickness is great throughout the entirety and the source/drain regions 36 do not penetrate through the silicon layer 3 is formed in the Tr formation region without recesses 104 in the thick film SOI region 101.

Figure 94:
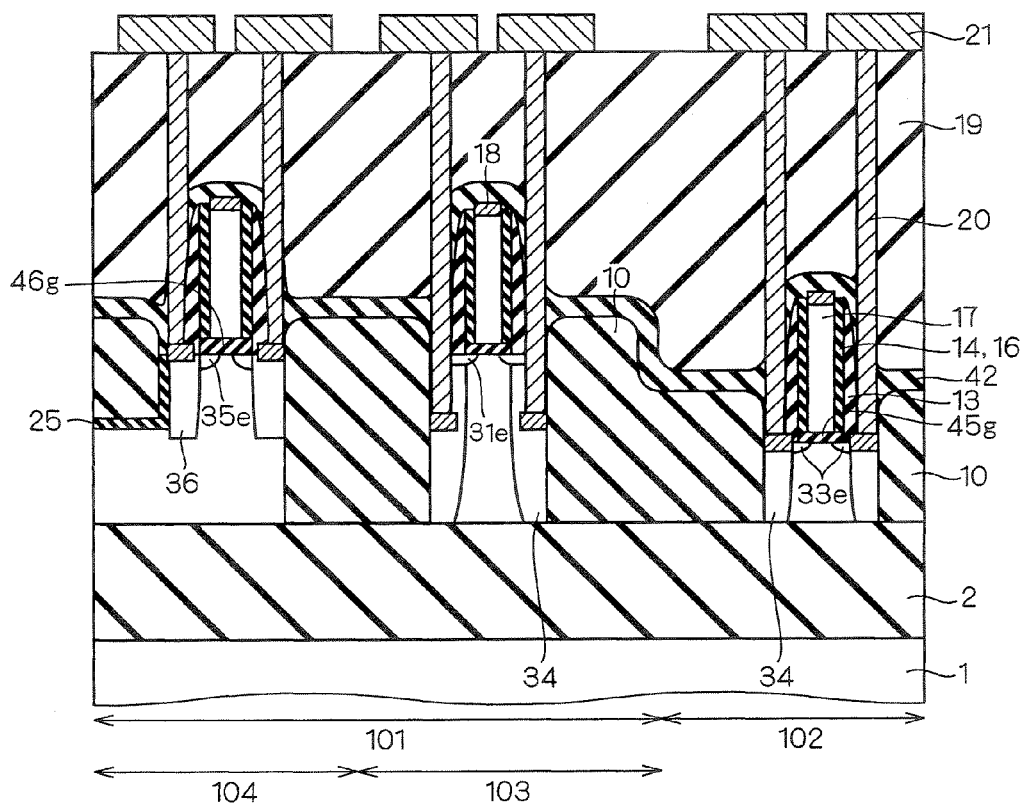

Finally, as shown in FIG. 94, a silicon nitride film 42 is formed on the entire surface and an interlayer insulating film 19 is formed on the silicon nitride film 42, and after that, a CMP process is performed to the interlayer insulating film 19 is flattened. In addition, a resist pattern for etching (not shown) is formed through photolithography, so that contact holes are formed using this resist pattern as a mask to form the contact holes are filled in with a metal so that metal plugs 20. Furthermore, the metal plugs 20 are electrically connected to the interlayer insulating film 19 to form metal wires 21. Al, Cu and the like are considered as materials of metal wires 21.

The SOI film thickness ta1 in the body region of the body thick film transistors Q1 and Q3 which are formed in the thick film SOI region 101 is set within a range of 100 nm to 200 nm, the SOI film thickness ta2 in the source/drain regions 32 of the body thick film transistor Q1 is set within a range of 40 nm to 100 nm, and the SOI film thickness tb of the body thin film transistor Q2 which is formed in the thin film SOI region 102 is set within a range of 40 nm to 100 nm with a relationship: ta1>ta2, tb. Here, the size relationship between the SOI film thickness ta2 and the SOI film thickness tb is not very important, as long as the two are approximately the same. In addition, the film thickness of the silicon layer 3 which remains beneath the silicon oxide film 10 is set to 10 nm to 50 nm.

(Structure in Plan View)

Figure 95:
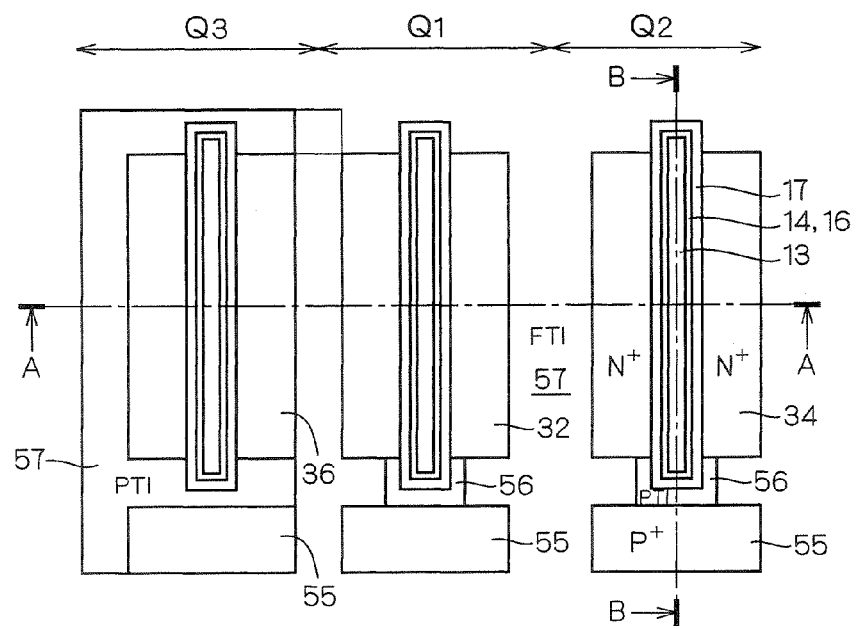
FIG. 95 is a plan view showing the structure of a semiconductor device according to the fifth embodiment.

FIG. 95 is a plan view showing the structure of a semiconductor device according to the fifth embodiment. The cross section along A-A in this figure is shown in FIG. 93. Here, FIG. 95 shows the configuration in the case where the transistors Q1 to Q3 are NMOS transistors. In addition, FIG. 95 does not show metal silicide regions 18 and 29, for the sake of convenience.

As shown in this figure, element isolation is provided between the body thick film transistor Q1 and the body thin film transistor Q2 and between the body thick film transistor Q1 and the body thick film transistor Q3, in most of the periphery of the body thick film transistor Q1 and in most of the periphery of the body thin film transistor Q2 by means of a complete isolation region 57 (element isolation region of silicon oxide film 10 which reaches buried oxide film 2: FTI).

Accordingly, effects are obtained, such that element isolation between the body thick film transistor Q1 and the body thin film transistor Q and between the body thick film transistor Q1 and the body thick film transistor Q3 can be provided with high isolation precision.

On the other hand, element isolation is provided in the body contact portion between the body thick film transistor Q1 and the body thin film transistor Q2 and in the periphery portion of the body thick film transistor Q3 by means of a partial isolation region 56 (element isolation region made of silicon oxide film 10 and silicon layer 3 which remains beneath silicon oxide film 10: PTI).

The respective body regions of the body thick film transistors Q1 and Q3, as well as the body thin film transistor Q2, are electrically connected to corresponding body contact regions 55 via the silicon layer 3 beneath the partial isolation region 56, and thus, the body potential can be fixed.

Figure 96:
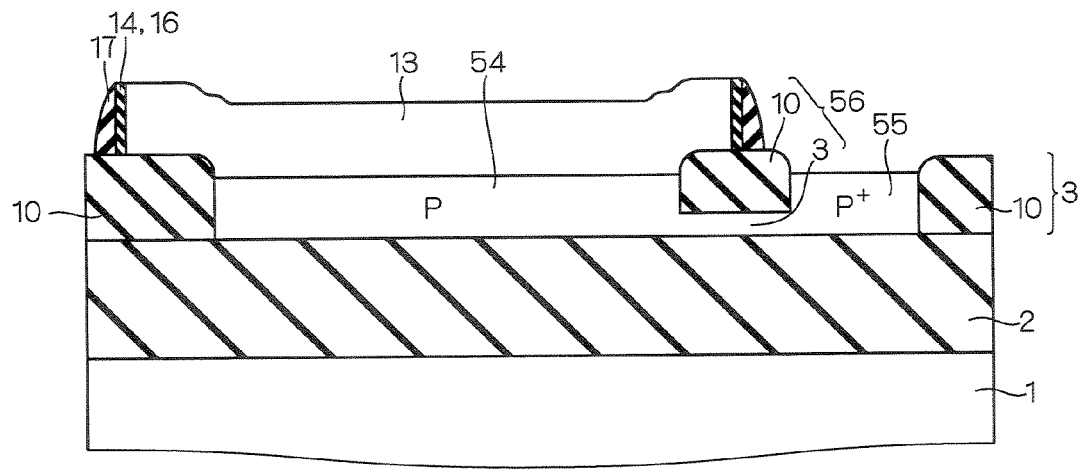
FIG. 96 is a cross sectional view showing the cross section along B-B of FIG. 95.

FIG. 96 is a cross sectional view showing the cross section along B-B in FIG. 95. In the following, the fixing of the body potential of the body thin film transistor Q2 is described with reference to this figure. Here, in FIG. 96, the gate oxide film 12g is omitted, for the sake of convenience.

As shown in this figure, the body region 54 directly beneath the gate electrode 13 is electrically connected to the body contact region 55 via the silicon layer 3 beneath the silicon oxide film 10. Accordingly, a predetermined body potential is provided in the body contact region 55, and thus, the body potential of the body thin film transistor Q2 can be set.

Here, the body potential of the body thick film transistor Q1 is set in exactly the same manner as in the body thin film transistor Q2. In addition, though the body potential of the body thick film transistor Q3 is set in approximately the same manner as in the body thin film transistor Q2, the body potential can be set with higher stability, because the partial isolation region 56 is formed in a region that is larger than the body thick film transistor Q1 and the body thin film transistor Q2.

In this manner, the potential in the body regions of the body thick film transistor Q1, the body thin film transistor Q2 and the body thick film transistor Q3 in the semiconductor device according to the fifth embodiment is fixed through a partial semiconductor region (silicon layer 3 which remains beneath silicon oxide film 10) in the partial isolation region 56 from the body contact region 55, and thereby, the potential of the body regions can be set without negatively affecting the respective element isolation characteristics of the transistors Q1 to Q3.

(Effects of Fifth Embodiment)

In the semiconductor device according to the fifth embodiment, body thick film transistors Q1 and Q3, as well as body thin film transistor Q2 having a different body film thickness, are formed on the same SOI substrate (silicon support substrate 1, buried oxide film 2 and silicon layer 3), and furthermore, the source/drain regions 32 and 36 of the body thick film transistors Q1 and Q3 have different structures. That is to say, the source/drain regions 32 have a recess structure and penetrate through the silicon layer 3, while the source/drain regions 36 do not have a recess structure and do not penetrate through the silicon layer 3.

In the body thick film transistors Q1 and Q3, the body film is formed relatively thick, and thus, the body resistance can be reduced and the stability of the body potential can increase. On the other hand, in the body thin film transistor Q2, the body film is formed so that the thickness is relatively small throughout the entirety, and therefore, high speed processing can be achieved, together with reduction in the parasitic capacitance.

Furthermore, in the body thick film transistor Q1, the source/drain regions 32 have a recess structure, and therefore, the SOI film in the source/drain regions 32 are formed to be thin; that is, have approximately the same thickness as the SOI thin film in the body thin film transistor Q2, and thus, the parasitic capacitance can be reduced, and a high speed process becomes possible, as compared to the case where there is no recess structure.

Furthermore, when, in the body thick film transistor Q1, source/drain regions 32 having a recess structure are formed, since the depth of the source/drain regions 32 becomes approximately the same as the depth of the source/drain regions 34 in the body thin film transistor Q2, the injection energy for impurity ions for the formation of the source/drain regions is low in comparison with the case where source/drain regions which penetrate through the silicon layer 3 without having a recess structure are formed. As a result, diffusion in the lateral direction can be prevented at the time of formation of the source/drain regions 32, and therefore, short channel effects can be effectively prevented.

On the other hand, though the body thick film transistor Q3 is inferior to the body thick film transistor Q1 in terms of the parasitic capacitance, the stability in the body potential is high due to the silicon layer 3 remaining beneath the source/drain regions 36, there are effects that enhance the withstand voltage for operation.

In this manner, in the semiconductor device according to the fifth embodiment, a body thick film transistor Q3 is formed on the same SOI substrate, in addition to the body thick film transistor Q1 and the body thin film transistor Q2.

As described above, these three transistors Q1 to Q3 have different transistor characteristics, and therefore, the semiconductor device according to the fifth embodiment has effects that satisfy requirements for various device (transistor) characteristics by using the body thick film transistor Q1, the body thin film transistor Q2 and the body thick film transistor Q3 in a different manner.

(Examples of Applications)

Figure 97:
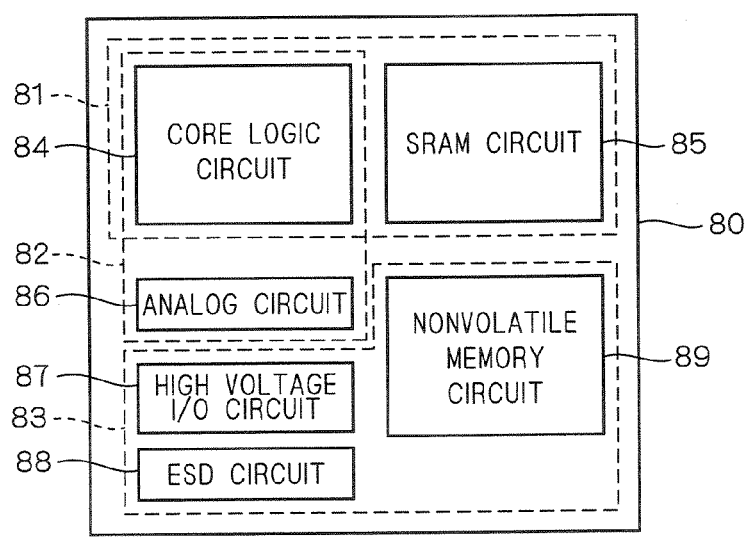
FIG. 97 is an illustration diagram showing an example of the configuration of a semiconductor integrated circuit which is formed using the semiconductor device according to the fifth embodiment.

FIG. 97 is a view showing an example of the configuration of a semiconductor integrated circuit formed using the semiconductor device according to the fifth embodiment.

As shown in this figure, a thin film transistor formation region 81, a thick film transistor formation region with recesses 82 and a thick film high withstand voltage transistor formation region 83 are provided in a semiconductor chip 80, and the circuits formed in these regions 81, 82 and 83 are formed using body thin film transistors Q2, body thick film transistors Q1 and body thick film transistors Q3.

A core logic circuit 84 and an SRAM circuit 85 are formed in the thin film transistor formation region 81, a core logic circuit 84 and an analog circuit 86 are formed in the thick film transistor formation region with recesses 82, and a high voltage I/O circuit 87, an ESD (electrostatic discharge) circuit 88 and a nonvolatile memory circuit 89 are formed in a thick film high withstand voltage transistor formation region 83. Here, the core logic circuit 84 may be formed in the thin film transistor formation region 81 or the thick film transistor formation with recesses 82, depending on the purpose.

Figure 98:
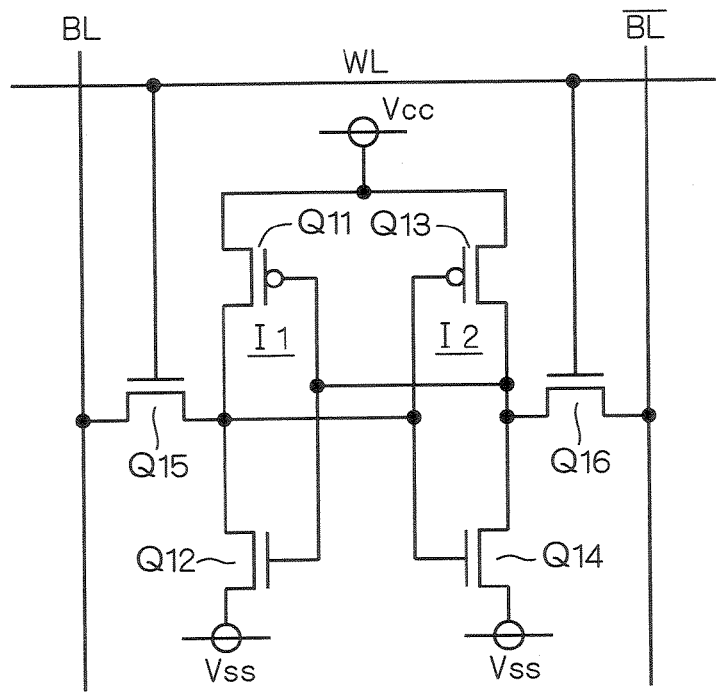
FIG. 98 is a circuit view showing part of the internal configuration of an SRAM circuit.

FIG. 98 is a circuit view showing a portion of the internal configuration of an SRAM circuit 85. As shown in this figure, a memory cell is formed by cross-connecting an inverter I1 made of a PMOS transistor Q11 and an NMOS transistor Q12 with an inverter I2 made of a PMOS transistor Q13 and an NMOS transistor Q14, where the output portion of the inverter I1 (input portion of inverter I2) is connected to a bit line BL via an NMOS transistor Q15, and the output portion of the inverter I2 (input portion of inverter I1) is connected to an inverted bit line bar BL via an NMOS transistor Q16. The gates of the NMOS transistors Q15 and Q16 are both connected to the same word line WL.

High speed is required for the SRAM circuit 85, and therefore, the MOS transistors Q11 to Q16 are formed of body thin film transistors Q2 according to the fifth embodiment.

Figure 99:
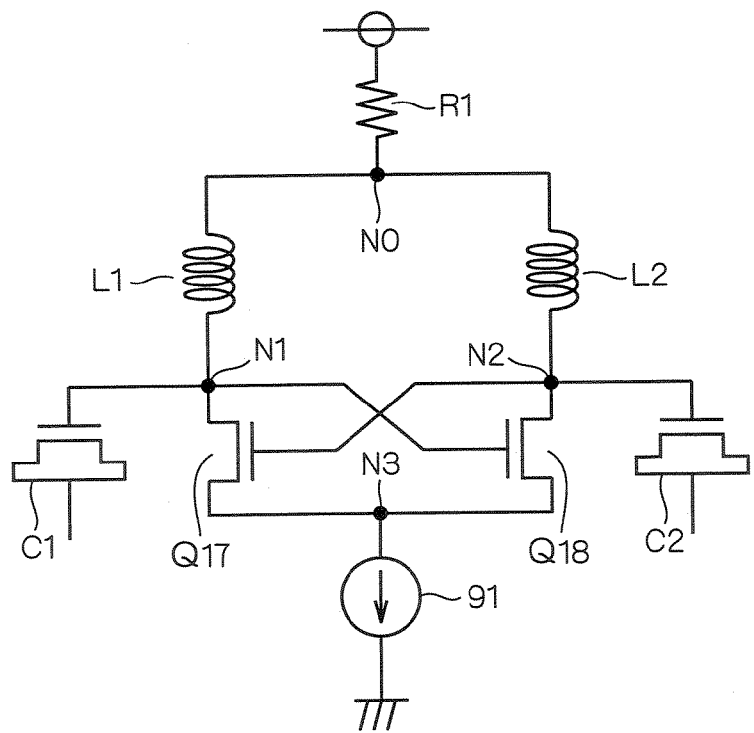
FIG. 99 is a circuit view showing the internal configuration of a voltage controlled oscillation circuit.

FIG. 99 is a circuit view showing the internal configuration of a voltage control oscillation circuit, which is an example of the analog circuit 86. As shown in this view, a resistance R1 is provided between the power supply Vcc and a node N0. An inductor L1 is provided between the node N0 and a node N1, an inductor L2 is provided between the node N0 and a node N2, an NMOS transistor Q17 is provided between the node N1 and a node N3, and an NMOS transistor Q18 is provided between the node N2 and the node N3. In addition, one electrode of a varactor C1, which is a variable capacitor, is connected to the node N1, one electrode of a varactor Q2 is connected to the node N2, and the current source 91 is provided between the node N3 and the ground level (Vss).

Relatively high withstand voltage and a relatively high processing speed are required for the voltage control oscillator having this configuration, and therefore, the NMOS transistors Q17 and Q18 are formed of body thick film transistors Q1 according to the fifth embodiment, in order to satisfy these two requirements.

Figure 100:
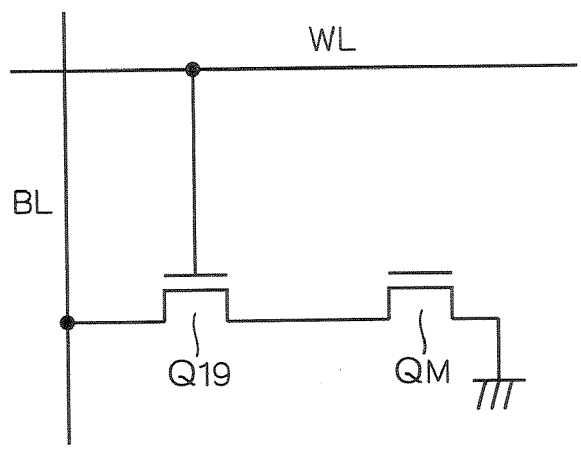
FIG. 100 is a circuit view showing part of the internal configuration of a nonvolatile memory circuit.

FIG. 100 is a circuit view showing a portion of the internal configuration of a nonvolatile memory circuit 89. As shown in this figure, one electrode of an MONOS type memory transistor QM, where nonvolatile storage is possible, is connected to a bit line BL via an NMOS transistor Q19, and the gate of the NMOS transistor Q19 is connected to a word line WL.

High withstand voltage is absolutely required for the nonvolatile memory having this configuration, and therefore, the NMOS transistor Q19, which is used to select the memory transistor QM, is formed of the body thick film transistors Q3 according to the fifth embodiment.

Figure 101:
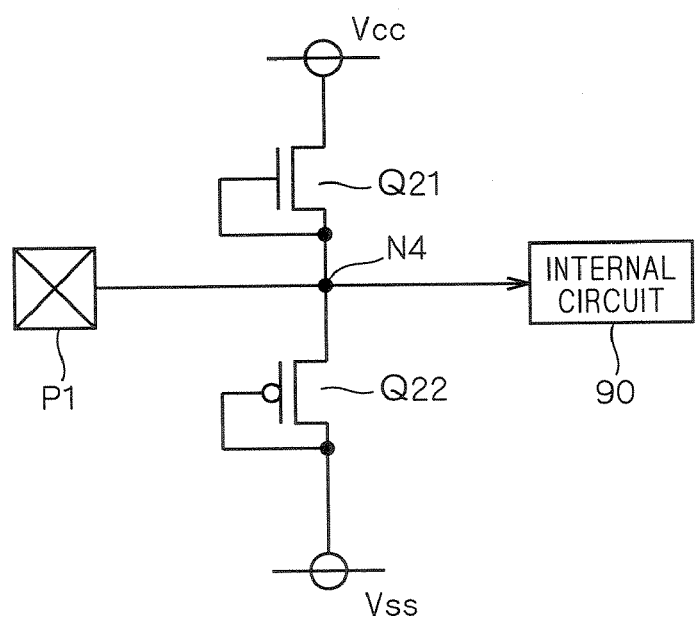
FIG. 101 is an illustration diagram schematically showing the internal configuration of an ESD circuit.
Figure 102:
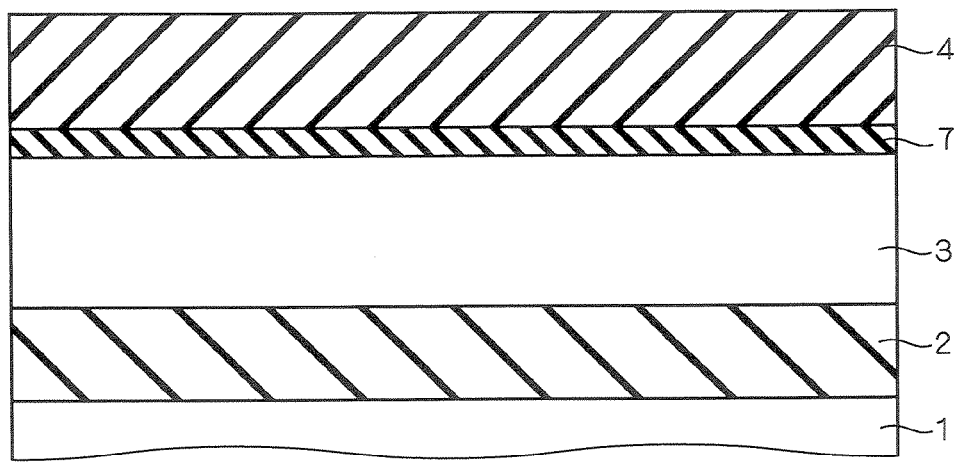
Figure 103:
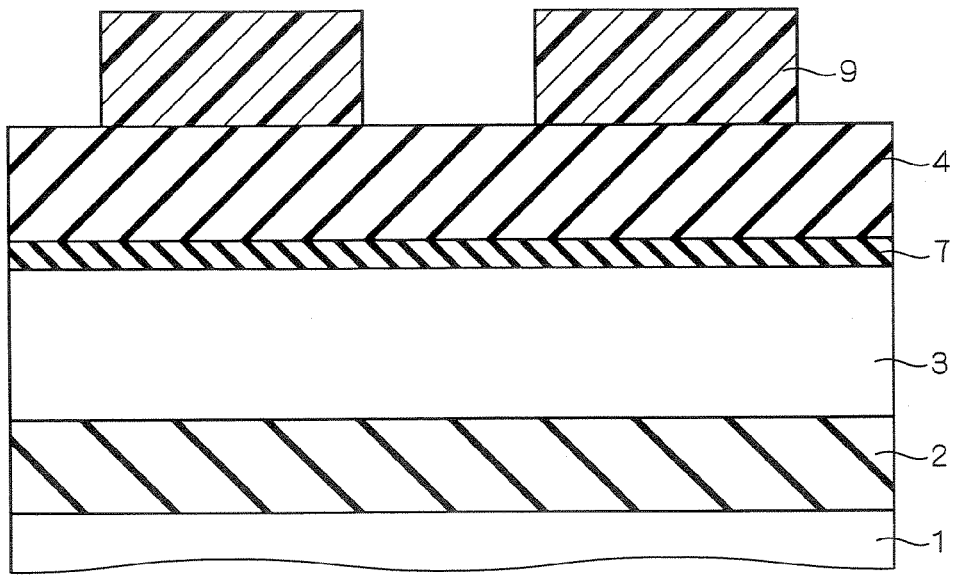
Figure 104:
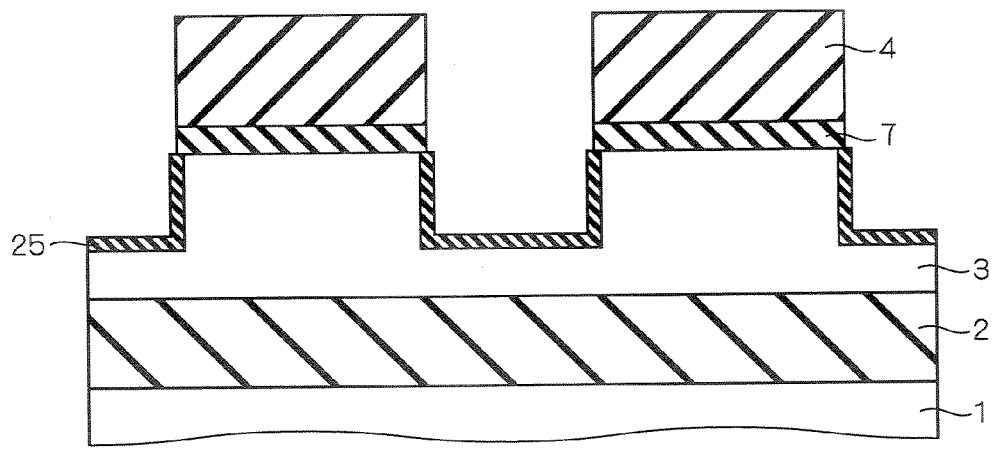
Figure 105:
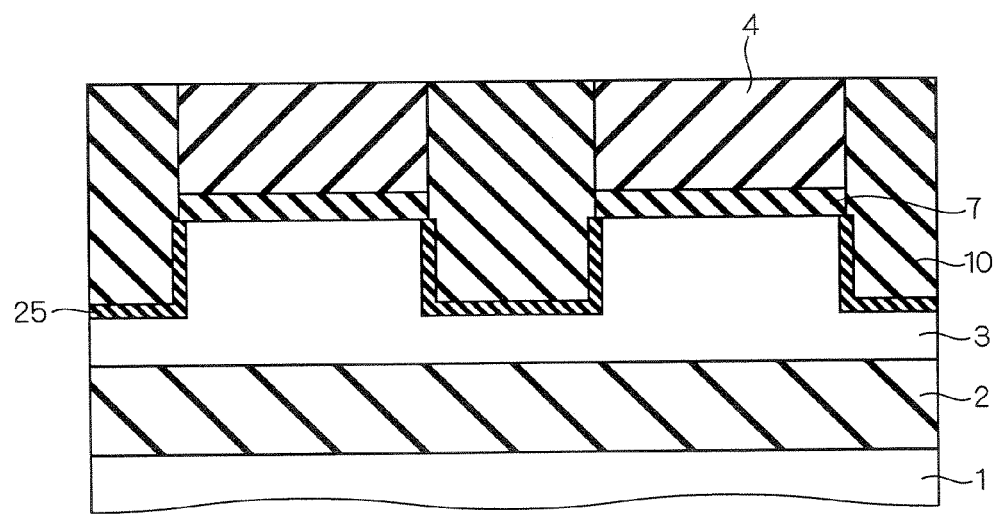
Figure 106:
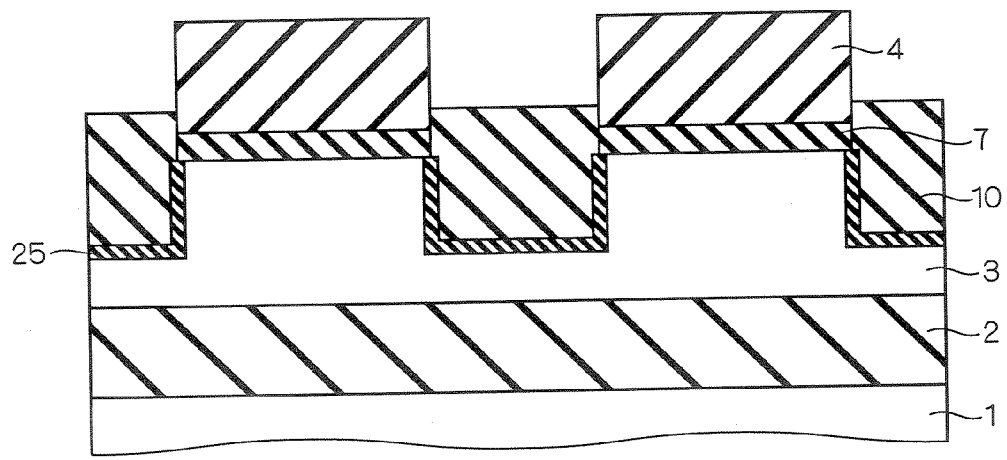
Figure 107:
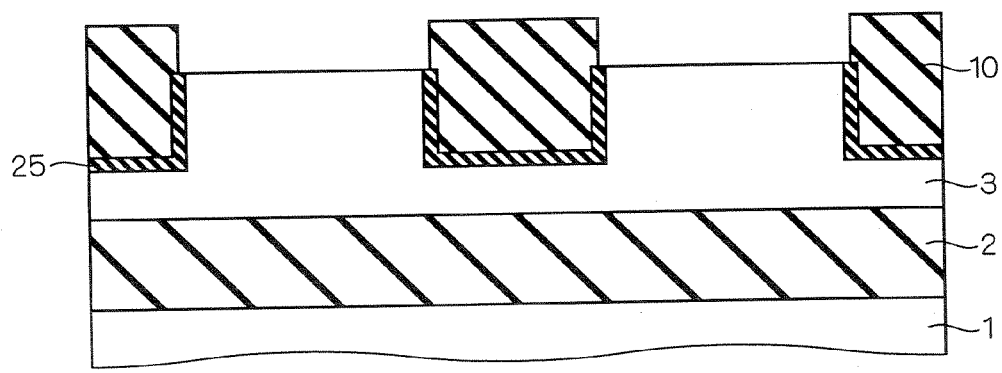
Figure 108:
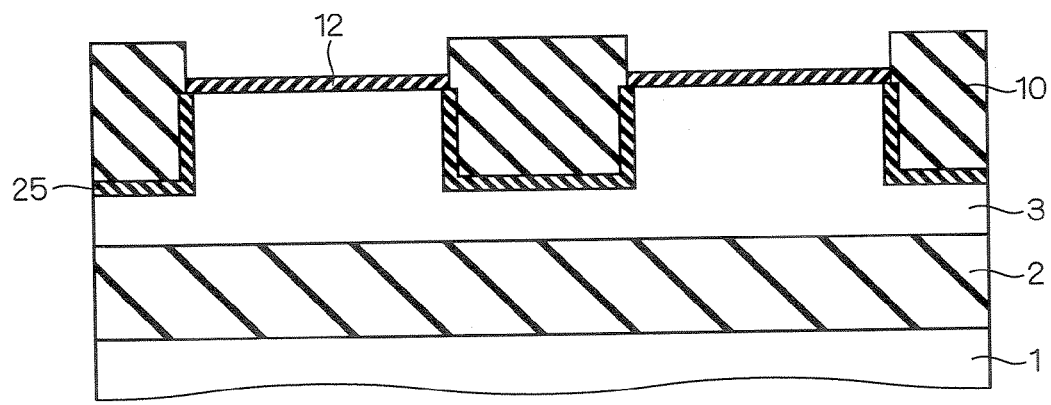
Figure 109:
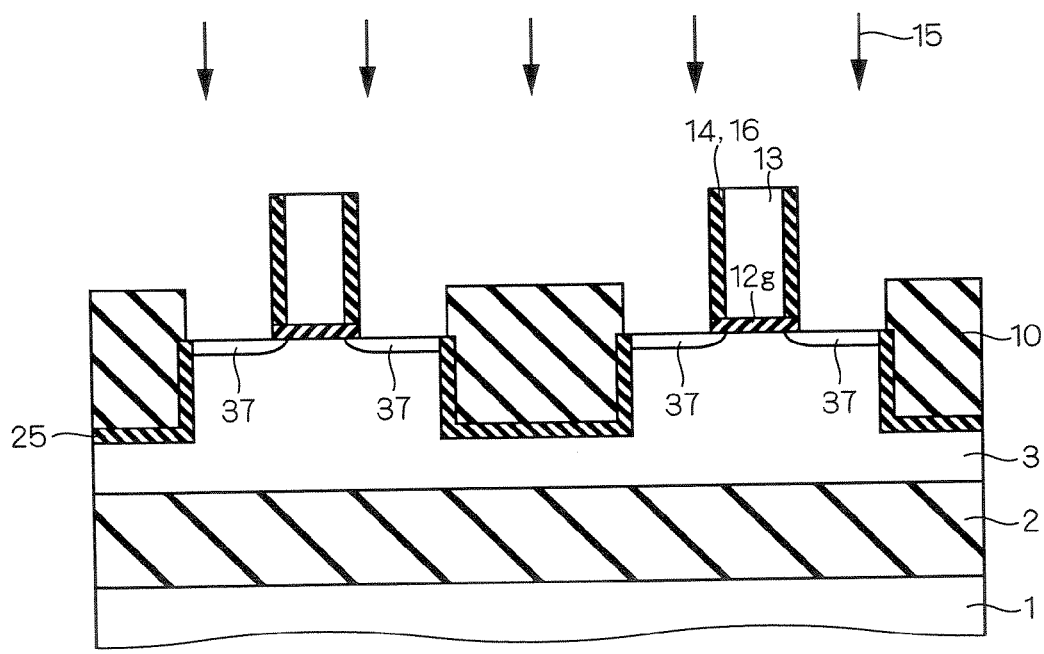

FIG. 101 is a view schematically showing the internal configuration of an ESD circuit 88. As shown in this figure, in the case where an external signal is provided to an internal circuit 90 through an input terminal P1, the sources of an NMOS transistor Q21 and a PMOS transistor Q22 are connected to a node N4 on a signal path from the input terminal P1 to the internal circuit 90.

The drain of the NMOS transistor Q21 is connected to the power supply Vcc, and the gate and the source are both connected to the same node N4, while the drain of the PMOS transistor Q22 is connected to the ground, and the gate and the source are both connected to the same node N4.

A high withstand voltage is absolutely required for the ESD circuit having this configuration, and therefore, the NMOS transistor Q21 and the PMOS transistor Q22 are formed of body thick film transistors Q3 according to the fifth embodiment.

As is clear from the examples of applications shown in FIGS. 97 to 101, the semiconductor device according to the fifth embodiment has effects such that a body thick film transistor Q1, a body thin film transistor Q2 and a body thick film transistor Q3 having different characteristics are provided on the same SOI substrate, and therefore, requirements for various device characteristics can be satisfy.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   insulating gate type first and second transistors formed on an SOI substrate composed of a semiconductor support substrate, a buried insulating film and a semiconductor layer in the stated order, wherein
   said semiconductor layer includes first and second SOI regions having first and second film thicknesses, respectively, and said first film thickness is greater than said second film thickness,
   said first and second transistors are formed in the first and second SOI regions, and each comprises:
   a gate insulating film selectively formed on said semiconductor layer;
   a gate electrode formed on said gate insulating film;
   source/drain regions formed in said semiconductor layer to sandwich a body region, which is a region of said semiconductor layer beneath said gate electrode, and said source/drain regions reaching to said buried insulating film, wherein
   said source/drain regions in said first transistor have a recess structure where the level of the surface thereof is lower than the level of the surface of said body region, and said source/drain regions in said second transistor do not have said recess structure;

a third transistor formed in said first SOI region, wherein said third transistor comprises, a gate insulating film selectively formed on said semiconductor layer, a gate electrode formed on said gate insulating film, and source/drain regions formed in said semiconductor layer to sandwich the body region which is a region of said semiconductor layer beneath said gate electrode and not to have said recess structure and to leave a portion of said semiconductor layer beneath without penetrating thorough said semiconductor layer;

each of said first to third transistors comprises, a body contact region in which a body potential is provided, and a partial isolation region composed of an insulator formed in an upper layer part of said semiconductor layer and a partial semiconductor region in the semiconductor layer which is a layer beneath the insulator, wherein said body contact region is electrically connected to said body region via said partial semiconductor region in said partial isolation region.

2. The semiconductor device according to claim 1, wherein each of said first and second transistors further comprises:

a low concentration region of the same conductivity type as said source/drain regions in the interface between said body region and said source/drain regions in a region in the vicinity of said buried insulating film.

3. The semiconductor device according to claim 1, further comprising:

a complete isolation region having an insulating film which penetrates through said semiconductor layer between said first and second SOI regions.

4. The semiconductor device according to claim 1, further comprising the complete isolation region comprising the insulating film which penetrates through said first SOI region between the regions where said first and third transistors are formed.

* * * * *